US012772499B2

(12) United States Patent
Bao et al.

(10) Patent No.: US 12,772,499 B2
(45) Date of Patent: Oct. 20, 2026

(54) GATE ALL AROUND DUAL CHANNEL TRANSISTORS

(71) Applicant: International Business Machines Corporation, Armonk, NY (US)

(72) Inventors: Ruqiang Bao, Niskayuna, NY (US); Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 312 days.

(21) Appl. No.: 18/072,858

(22) Filed: Dec. 1, 2022

(65) Prior Publication Data

US 2024/0186393 A1 Jun. 6, 2024

(51) Int. Cl.
*H10D 30/67* (2025.01)
*H10D 62/13* (2025.01)
(Continued)

(52) U.S. Cl.
CPC ..... *H10D 30/6735* (2025.01); *H10D 30/6757* (2025.01); *H10D 62/151* (2025.01);
(Continued)

(58) Field of Classification Search
CPC ........... H10D 30/6735; H10D 30/6757; H10D 62/151; H10D 84/0167; H10D 84/017;
(Continued)

(56) References Cited

U.S. PATENT DOCUMENTS 9,287,357 B2 3/2016 Rodder et al.
9,711,414 B2 7/2017 Hatcher et al.
(Continued)

FOREIGN PATENT DOCUMENTS

TW 201901761 A 1/2019
TW 202013722 A 4/2020
(Continued)

OTHER PUBLICATIONS

Mochizuki, Shogo, et al. "Stacked gate-all-around nanosheet pFET with highly compressive strained Si 1-x Ge x channel." 2020 IEEE International Electron Devices Meeting (IEDM). IEEE, 2020. (Year: 2020).*
(Continued)

*Primary Examiner* — Jacob Y Choi
*Assistant Examiner* — Aaron Michael Wegner
(74) *Attorney, Agent, or Firm* — Samuel A. Waldbaum

(57) ABSTRACT

Semiconductor devices having gate all around transistors with dual channels, one channel type for p-channel field-effect transistors (pFETs) and another channel type for n-channel field-effect transistors (nFETs) are provided. In one aspect, a semiconductor device includes: a wafer; and at least a first transistor and a second transistor on the wafer, where the first and second transistors each includes multiple channels, and where the multiple channels of the first transistor include first portions and second portions with the first portions having (e.g., Si) cores and a (e.g., SiGe) cladding layer fully surrounding the cores. Alternatively, an anneal can be performed to convert the cores/cladding layer into uniform (e.g., SiGe). A method of fabricating the present semiconductor devices is also provided.

19 Claims, 29 Drawing Sheets

(51) Int. Cl.
*H10D 84/01* (2026.01)
*H10D 84/03* (2025.01)

(52) U.S. Cl.
CPC ....... *H10D 84/0167* (2025.01); *H10D 84/017* (2025.01); *H10D 84/038* (2025.01)

(58) Field of Classification Search
CPC . H10D 84/038; H10D 62/121; H10D 84/0177
See application file for complete search history.

(56) References Cited

U.S. PATENT DOCUMENTS

| | | | |
|---|---|---|---|
| 9,871,140 B1 | 1/2018 | Balakrishnan et al. | |
| 9,997,519 B1 * | 6/2018 | Bao | H10D 30/014 |
| 10,276,452 B1 | 4/2019 | Seshadri et al. | |
| 10,332,809 B1 | 6/2019 | Ando et al. | |
| 10,381,272 B1 | 8/2019 | Sung | |
| 10,388,577 B1 | 8/2019 | Cheng et al. | |
| 10,410,933 B2 | 9/2019 | Xie et al. | |
| 10,490,559 B1 * | 11/2019 | Ando | H10B 10/12 |
| 10,510,620 B1 | 12/2019 | Chanemougame et al. | |
| 10,629,495 B2 | 4/2020 | Seshadri et al. | |
| 10,692,778 B2 | 6/2020 | Bao et al. | |
| 10,755,985 B2 | 8/2020 | Mochizuki et al. | |
| 10,903,124 B2 | 1/2021 | Lallement et al. | |
| 10,930,762 B2 | 2/2021 | Ando et al. | |
| 10,957,798 B2 | 3/2021 | Miao et al. | |
| 10,978,356 B2 | 4/2021 | Lee et al. | |
| 11,049,949 B2 | 6/2021 | Xiao | |
| 11,158,544 B2 | 10/2021 | Cheng et al. | |
| 11,367,662 B2 | 6/2022 | Dentoni Litta et al. | |
| 2018/0342427 A1 | 11/2018 | Xie et al. | |
| 2020/0006479 A1 | 1/2020 | Reznicek et al. | |
| 2020/0185384 A1 | 6/2020 | Li et al. | |
| 2020/0235133 A1 | 7/2020 | Xiao | |
| 2020/0251593 A1 | 8/2020 | Miao et al. | |
| 2020/0286900 A1 | 9/2020 | Mann et al. | |
| 2020/0294998 A1 | 9/2020 | Lilak et al. | |
| 2020/0357703 A1 | 11/2020 | Lee et al. | |
| 2021/0005604 A1 | 1/2021 | Ge et al. | |
| 2021/0083054 A1 * | 3/2021 | Liaw | H10D 84/0128 |
| 2021/0118883 A1 | 4/2021 | Lim et al. | |
| 2021/0242092 A1 * | 8/2021 | Chen | H10D 30/6211 |
| 2021/0408259 A1 | 12/2021 | Cheng | |
| 2022/0084830 A1 | 3/2022 | Hsu et al. | |
| 2022/0173097 A1 | 6/2022 | Yang et al. | |
| 2022/0199772 A1 | 6/2022 | Xie et al. | |
| 2022/0320293 A1 | 10/2022 | Liao et al. | |

FOREIGN PATENT DOCUMENTS

| | | |
|---|---|---|
| TW | 202040791 A | 11/2020 |
| TW | 202131414 A | 8/2021 |
| TW | 202201551 A | 1/2022 |
| TW | 202245258 A | 11/2022 |

OTHER PUBLICATIONS

Disclosed Anonymously, “Replacement Metal Gate n/p boundary protection by filled undercut,” IPCOM000255864D, Oct. 17, 2018 (7 pages).
List of IBM Patents or Applications Treated as Related, Dec. 1, 2022 (2 pages).
Jin Cai “Device Technology for 3nm and beyond,” IEDM short course 2019 (60 pages).
S. Mochizuki et al., “Stacked Gate-All-Around Nanosheet pFET with Highly Compressive Strained Si1-xGex Channel,” 2020 IEEE International Electron Devices Meeting (IEDM) (Dec. 2020) (4 pages).
A. Agrawal et al., “Gate-All-Around Strained Si0.4Ge0.6 Nanosheet PMOS on Strain Relaxed Buffer for High Performance Low Power Logic Application,” 2020 IEEE International Electron Devices Meeting (IEDM) (Dec. 2020) (4 pages).
Jingyun Zhang et al., “High-k Metal Gate Fundamental Learning and Multi-Vt Options for Stacked Nanosheet Gate-All-Around Transistor,” 2017 IEEE International Electron Devices Meeting (IEDM) (Dec. 2017) (4 pages).
R. Bao et al., “Multiple-Vt Solutions in Nanosheet Technology for High Performance and Low Power Applications,” 2019 IEEE International Electron Devices Meeting (IEDM) (Dec. 2019) (4 pages).

* cited by examiner

Y-cut nFET pFET nFET pFET

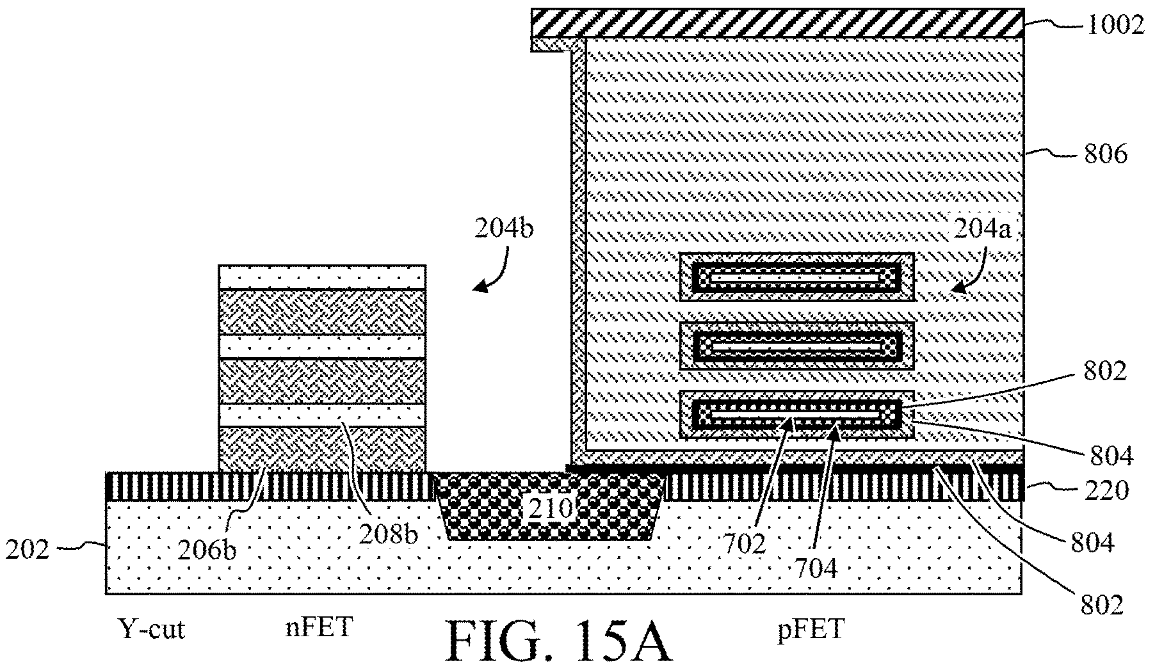
FIG. 15A
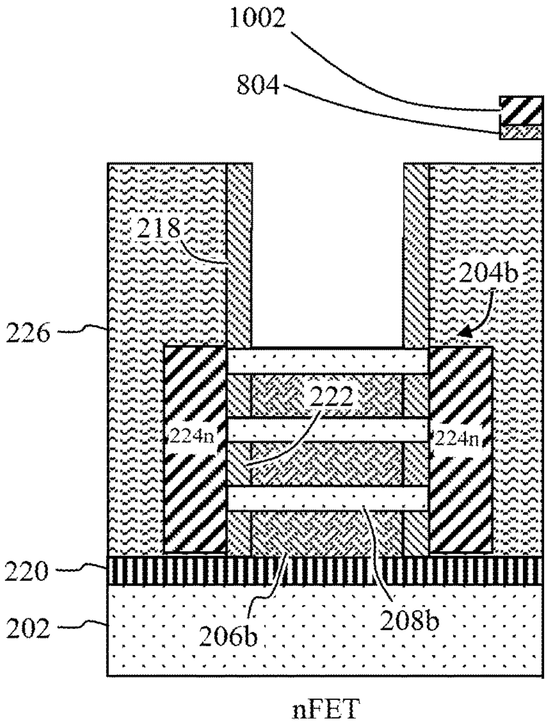
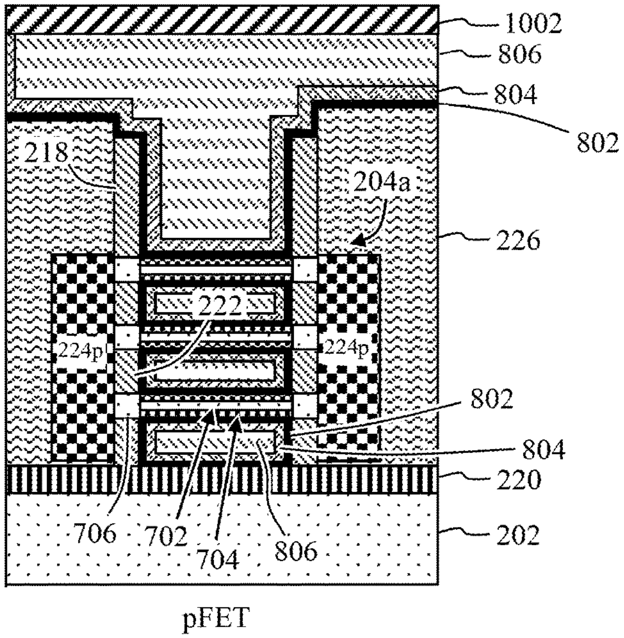
FIG. 15B FIG. 15C

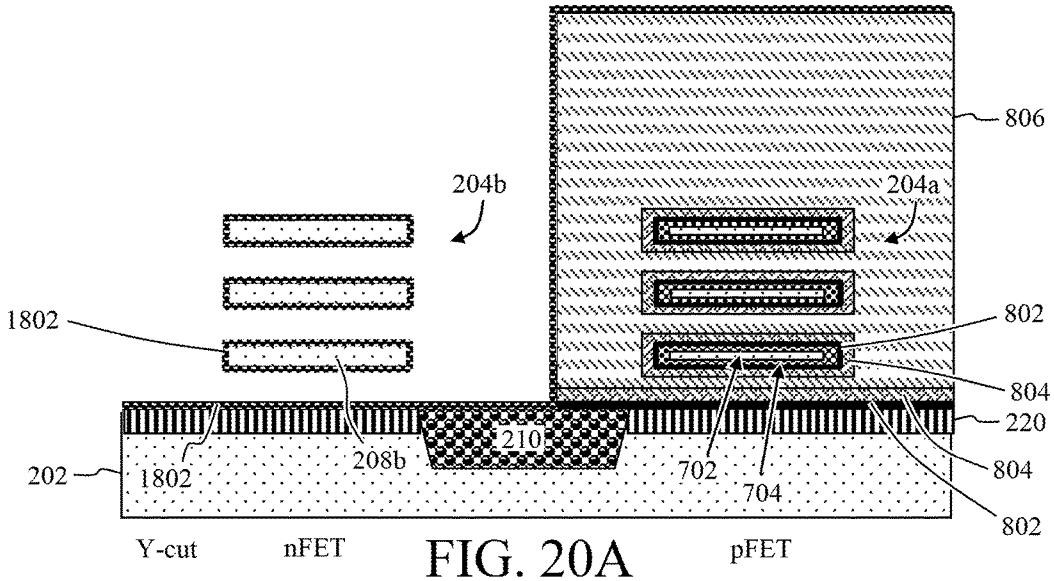
FIG. 20A
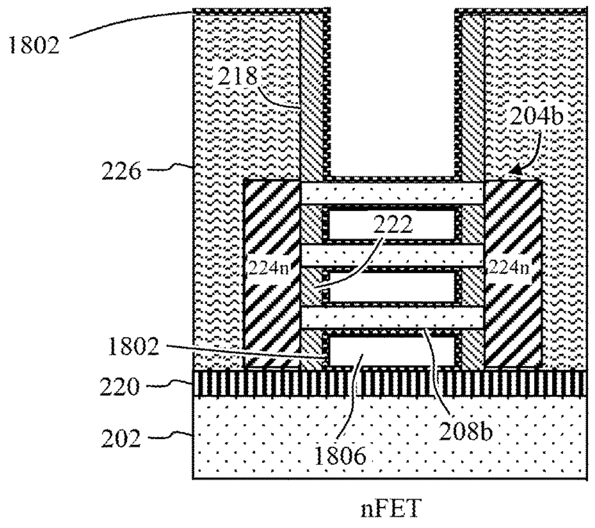
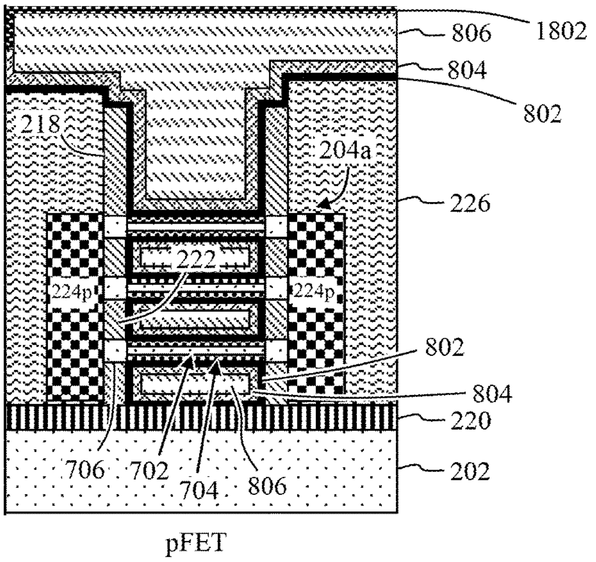
FIG. 20B FIG. 20C (follows from FIG. 17A)
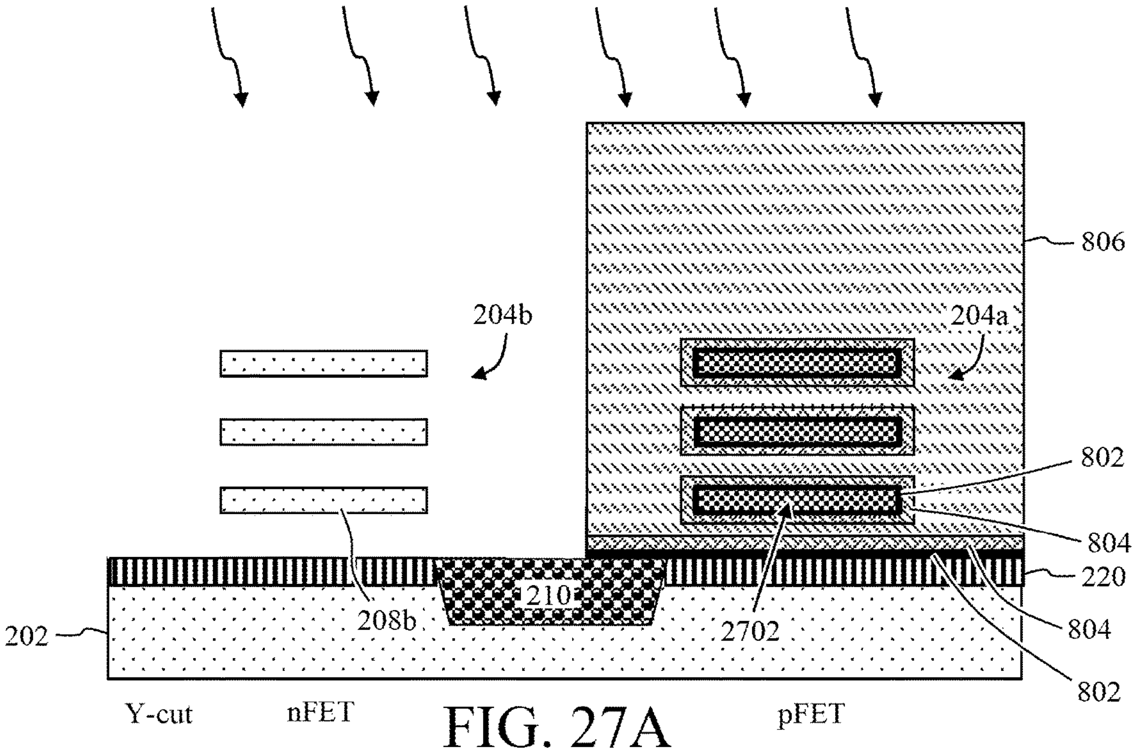
FIG. 27A
(follows from FIG. 17B)
(follows from FIG. 17C)
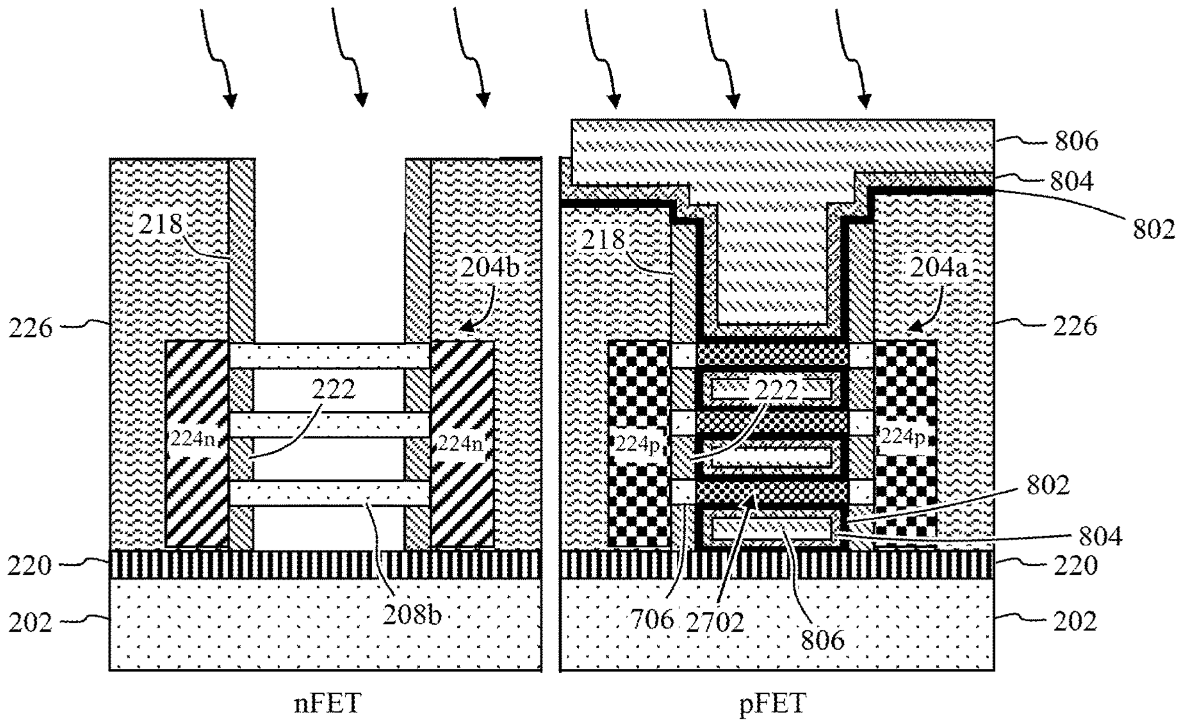
FIG. 27B
FIG. 27C

GATE ALL AROUND DUAL CHANNEL TRANSISTORS

FIELD OF THE INVENTION

The present invention relates to gate all around semiconductor devices, and more particularly, to semiconductor devices having gate all around transistors with dual channels, one channel type for p-channel field-effect transistors (pFETs) and another channel type for n-channel field-effect transistors (nFETs), and independently configurable replacement metal gates.

BACKGROUND OF THE INVENTION

Non-planar device architectures advantageously enable beneficial design features such as gate all around field-effect transistor technology. A gate all around design provides enhanced performance even at scaled dimensions. For instance, by wrapping the gate around the channels, a significant reduction in leakage current is achieved.

Gate all around architectures often involve the integration of transistors of opposite polarity into the same device, such as p-channel field-effect transistors (pFETs) and n-channel field-effect transistors (nFETs). However, conventional integration schemes often overlook some of the specific features needed for optimal performance of one device type over the other.

For instance, it is often the case that a common channel material such as silicon is used in both pFET and nFET gate all around transistors. Recent studies suggest, however, that the implementation of a silicon germanium channel with compressive strain can vastly improve channel mobility in pFET transistors. Further, differences in the thicknesses of the gate materials as well as the inter-channel spacing can both lead to non-uniformity in the threshold voltage (Vt) amongst the devices. Vt non-uniformity undesirably degrades device performance.

SUMMARY OF THE INVENTION

The present invention provides semiconductor devices having gate all around transistors with dual channels, one channel type for p-channel field-effect transistors (pFETs) and another channel type for n-channel field-effect transistors (nFEIs). In one aspect of the invention, a semiconductor device is provided. The semiconductor device includes: a wafer: and at least a first transistor of a first polarity and a second transistor of a second polarity on the wafer, where the first transistor and the second transistor each includes multiple channels, and where the multiple channels of the first transistor include first portions and second portions with the first portions having cores and a cladding layer fully surrounding the cores. For instance, the first transistor can be a p-channel field-effect transistor and the second transistor can be an n-channel field-effect transistor, and the cores can include silicon (Si), while the cladding layer can include silicon germanium (SiGe). Advantageously, including SiGe in the pFET channel can vastly improve channel mobility.

Further, a first gate can be present surrounding the first portions of the multiple channels of the first transistor, and a second gate can be present surrounding the multiple channels of the second transistor. Advantageously, these first and second gates are independently configurable. Namely, the first gate can include at least one first workfunction-setting metal and the second gate can include at least one second workfunction-setting metal, where the at least one first workfunction-setting metal is different from the at least one second workfunction-setting metal.

Also, a first interfacial layer can be disposed on the first portions of the multiple channels of the first transistor; a first gate dielectric can be disposed on the first interfacial layer; a second interfacial layer can be disposed on the multiple channels of the second transistor; and a second gate dielectric can be disposed on the first interfacial layer. Advantageously, the first interfacial layer can have at least one of a different composition and a different thickness from the second interfacial layer. Likewise, the first gate dielectric can have at least one of a different composition and a different thickness from the second gate dielectric. Additionally, the first interfacial layer can include at least one different dipole dopant from the second interfacial layer and/or the first gate dielectric can include at least one different dipole dopant from the second gate dielectric.

In another aspect of the invention, another semiconductor device is provided. The semiconductor device includes: a wafer; and at least a first transistor of a first polarity and a second transistor of a second polarity on the wafer, where the first transistor and the second transistor each includes multiple channels, and where the multiple channels of the first transistor include first portions and second portions with the first portions having uniform SiGe. For instance, the first transistor can be a p-channel field-effect transistor and the second transistor can be an n-channel field-effect transistor. Advantageously, including SiGe in the pFET channel can vastly improve channel mobility.

In yet another aspect of the invention, a method of fabricating a semiconductor device is provided. The method includes: forming at least a first transistor of a first polarity and a second transistor of a second polarity on a wafer, where the first transistor and the second transistor each includes multiple channels, and where the multiple channels of the first transistor include first portions and second portions with the first portions having SiGe.

For instance, the method can further include: forming at least a first device stack of the first transistor and a second device stack of the second transistor on the wafer, where the first device stack and the second device stack each includes multiple active layers, and where the multiple active layers include Si; forming first source/drain regions on opposite sides of the first device stack; forming second source/drain regions on opposite sides of the second device stack; selectively thinning the multiple active layers of the first device stack in a channel region of the first transistor to form Si cores; growing a SiGe cladding layer on the Si cores to form the first portions of the multiple channels of the first transistor which are connected to the first source/drain regions by the second portions; forming a first gate surrounding the first portions of the multiple channels of the first transistor; and forming a second gate surrounding the multiple channels of the second transistor. Optionally, an anneal can be performed to convert the SiGe cladding layer on the Si cores to uniform SiGe in the first portions of the multiple channels of the first transistor.

A more complete understanding of the present invention, as well as further features and advantages of the present invention, will be obtained by reference to the following detailed description and drawings.

BRIEF DESCRIPTION OF THE DRAWINGS

FIG. 15A is a Y cross-sectional view, FIG. 15B is an X1 cross-sectional view, and FIG. 15C is an X2 cross-sectional view illustrating exposed portions of the first gate dielectric in the nFET region of the wafer having been removed according to an embodiment of the present invention;

FIG. 20A is a Y cross-sectional view, FIG. 20B is an X1 cross-sectional view, and FIG. 20C is an X2 cross-sectional view illustrating the second sacrificial placeholder and the second gate dielectric cap having been selectively removed from the nFET region of the wafer according to an embodiment of the present invention;

FIG. 27A is a Y cross-sectional view, FIG. 27B is an X1 cross-sectional view, and FIG. 27C is an X2 cross-sectional view, which follow from FIG. 17A. FIG. 17B and FIG. 17C, respectively, illustrating according to an alternative embodiment an anneal having been performed to make the composition of the first core/cladding portions of the pFET channels uniform (SiGe) according to an embodiment of the present invention;

DETAILED DESCRIPTION OF PREFERRED EMBODIMENTS

Provided herein are semiconductor devices having gate all around transistors with dual channels, namely one channel type for transistors of a first polarity and another channel type for transistors of a second polarity. For instance, in one exemplary embodiment provided below, arbitrarily the transistors of the first polarity are p-channel field-effect transistors (pFETs) and the transistors of the second polarity are n-channel field-effect transistors (nFETs). In that case, silicon (Si) channels will be implemented for the transistors of the second polarity (nFETs), while silicon germanium (SiGe) cladding/Si core channels will be implemented for the transistors of the first polarity (pFETs). Doing so improves the channel mobility of the pFET transistors. Alternatively, in another exemplary embodiment provided below, an anneal is performed to convert the SiGe cladding/Si core to uniform SiGe channels.

Further, based on the present process, the pFET and nFET gates are formed without any overlap in their materials, e.g., gate dielectrics, workfunction-setting metals, etc. Thus, each of the pFET and nFET gates is independently configurable in terms of the materials used, thicknesses, etc.

Figure 1:
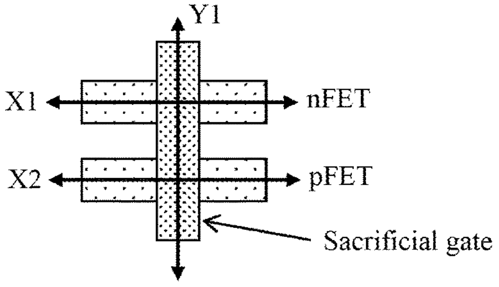
FIG. 1 is a top-down diagram illustrating the overall layout of the present semiconductor device and the orientations of the Y, X1 and X2 cross-sectional views shown in the figures according to an embodiment of the present invention.

Given the above overview, an exemplary methodology for fabricating a semiconductor device in accordance with the present techniques having gate all around transistors with dual channels is now described by way of reference to FIGS. 1-26. FIG. 1 is a top-down diagram illustrating an overall layout of the present semiconductor device design. As shown in FIG. 1, the present techniques employ a device architecture having at least one pFET and at least one nFET. As highlighted above, pFET(s) and nFET(s) are arbitrarily selected in the process flow as the transistors of the first polarity and second polarity, respectively. However, this selection is made merely as a non-limiting example in order to illustrate the present techniques. It is to be understood that the present processes are not limited to the fabrication of the pFET and nFET transistors in any particular order, and embodiments are contemplated herein where the nFET(s) and pFET(s) are the transistors of the first polarity and second polarity, respectively, which does not change the manner in which they are fabricated.

As will be described in detail below, the pFET and nFET active areas (labeled 'pFET' and 'nFET' in FIG. 1) will each include a stack of active layers. At least one sacrificial gate will be formed over the pFET and nFET active areas. As shown in FIG. 1, the sacrificial gate is oriented orthogonal to the pFET and nFET active areas. The term 'sacrificial.' as used herein, refers to a material or structure that is used in one part of the process, and then later removed, in whole or in part, during fabrication of the semiconductor device. Thus, as is apparent from FIG. 1, a gate-last approach will be employed in the present examples. With a gate-last approach, a sacrificial gate is used as a placeholder during formation of the source/drain regions. The sacrificial gate is removed later on in the process, and replaced with the final gates of the device (also referred to herein as 'replacement gates'). When the replacement gates are metal gates, they may also be referred to herein as 'replacement metal gates.' Advantageously, use of a gate-last process avoids exposing the replacement gate materials such as high-k dielectrics to potentially damaging conditions such as the high temperatures experienced during source/drain region formation. Thus, the orientation of the replacement metal gates vis-à-vis the pFET and nFET active areas will be the same as that of the sacrificial gate.

FIG. 1 further illustrates the orientations of the cross-sectional views that will be shown in the following figures. For instance, as shown in FIG. 1, the Y cross-sectional views that will be shown in the following figures depict cuts perpendicular to the pFET and nFET active areas through the sacrificial gate. The X1 cross-sectional views depict cuts through the nFET active area perpendicular to the sacrificial gate. The X2 cross-sectional views depict cuts through the pFET active area perpendicular to the sacrificial gate.

Figure 2A:
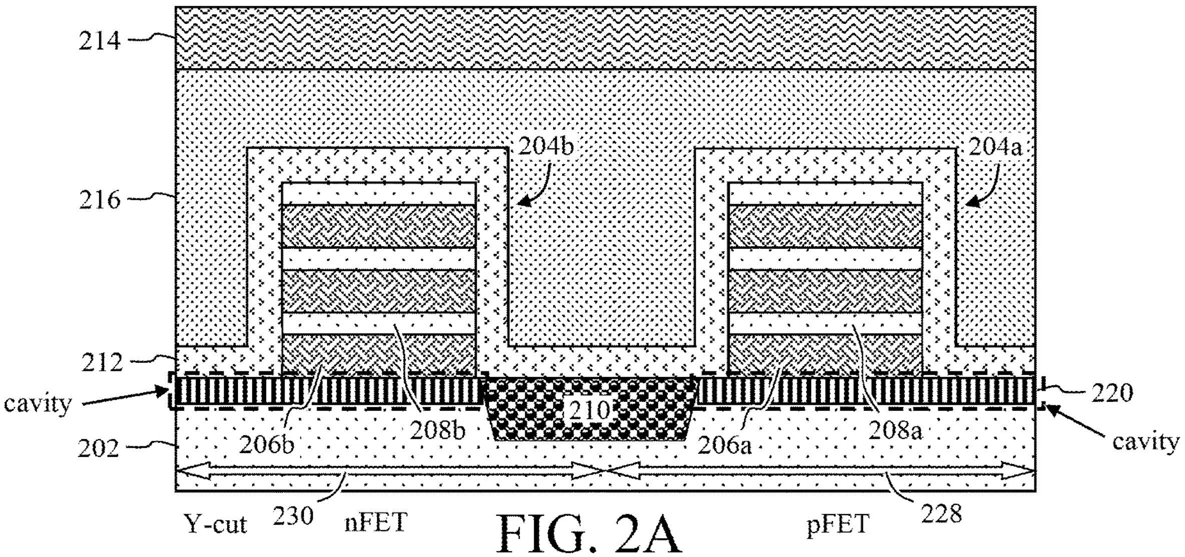
FIG. 2A is a Y cross-sectional view.
Figure 2B:
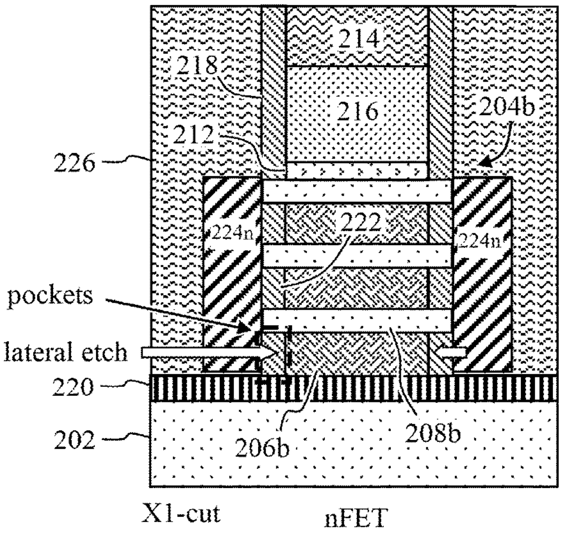
FIG. 2B is an X1 cross-sectional view.
Figure 2C:
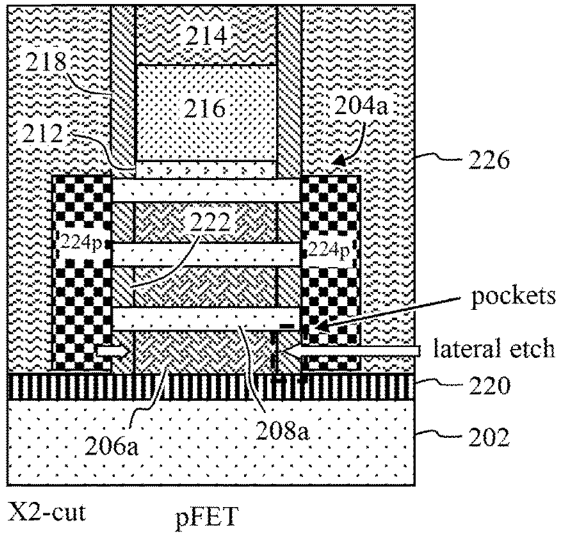
FIG. 2C is an X2 cross-sectional view illustrating at least a (first) device stack and a (second) device stack having been formed on a wafer (each first/second device stack having alternating sacrificial layers and active layers), a shallow trench isolation region having been formed in the wafer between the first/second device stacks, a sacrificial gate oxide having been formed on the first/second device stacks, a sacrificial gate having been formed on the first/second device stacks using a sacrificial gate hardmask, dielectric spacers having been formed alongside the sacrificial gate hardmask/sacrificial gate and a bottom dielectric isolation layer having been formed beneath the first/second device stacks, inner spacers having been formed alongside the sacrificial layers, nFET and pFET source/drain regions having been formed on opposite sides of the sacrificial gate alongside the sacrificial layers and active layers, and an interlayer dielectric having been deposited onto the semiconductor device structure according to an embodiment of the present invention.

As shown in FIG. 2A (a Y cross-sectional view), FIG. 2B (an X1 cross-sectional view), and FIG. 2C (an X2 cross-sectional view), the process begins with the formation of at least a (first) device stack 204*a* and a (second) device stack 204*b* on a wafer 202 (each device stack 204*a/b* having alternating sacrificial layers 206*a/b* and active layers 208*a/b*), a shallow trench isolation region 210 is formed in the wafer 202 between the device stacks 204*a* and 204*b*, a sacrificial gate oxide 212 is then formed on the device stacks 204*a* and 204*b*, a sacrificial gate 216 is formed on the device stacks 204*a* and 204*b* (over the sacrificial gate oxide 212) using a sacrificial gate hardmask 214, dielectric spacers 218 are formed alongside the sacrificial gate hardmask 214/sacrificial gate 216 and a bottom dielectric isolation layer 220 is formed beneath the device stacks 204*a* and 204*b*, inner spacers 222 are formed alongside the sacrificial layers 206*a/b*, pFET and nFET and source/drain regions 224*p* and 224*n* are formed on opposite sides of the sacrificial gate 216/device stacks 204*a* and 204*b* alongside the sacrificial layers 206*a/b* and active layers 208*a/b*, and an interlayer dielectric 226 is deposited onto the current semiconductor device structure.

According to an exemplary embodiment, wafer 202 is a bulk semiconductor wafer, such as a bulk silicon (Si), bulk germanium (Ge), bulk silicon germanium (SiGe) and/or bulk III-V semiconductor wafer. Alternatively, wafer 202 can be a semiconductor-on-insulator (SOI) wafer. An SOI wafer includes an SOI layer separated from an underlying substrate by a buried insulator. When the buried insulator is an oxide it is also referred to herein as a buried oxide or BOX. The SOI layer can include any suitable semiconductor material(s), such as Si, Ge, SiGe and/or a III-V semiconductor. Further, wafer 202 may already have pre-built structures (not shown) such as transistors, diodes, capacitors, resistors, interconnects, wiring, etc.

As highlighted above, each of the device stacks 204*a* and 204*b* includes alternating sacrificial layers 206*a/b* and active layers 208*a/b* oriented horizontally, one on top of another, on the wafer 202. In one exemplary embodiment, the sacrificial layers 206*a/b* and active layers 208*a/b* are nanosheets. The term 'nanosheet' as used herein, generally refers to a sheet or a layer having nanoscale dimensions. Further, the term 'nanosheet' is meant to encompass other nanoscale structures such as nanowires. For instance, the term 'nanosheet' can refer to a nanowire with a larger width, and/or the term 'nanowire' can refer to a nanosheet with a smaller width, and vice versa. In the non-limiting example depicted in the figures, the device stack 204*a* corresponds to a pFET transistor that will be formed on the wafer 202, and the device stack 204*b* corresponds to an nFET transistor that will be formed on the wafer 202. As highlighted above, this selection is arbitrary. Further, reference may also be made herein to the region of the wafer 202 on which the pFET transistor will be formed (i.e., the pFET region of wafer 202—see arrow 228) and the region of the wafer 202 on which the nFET transistor will be formed (i.e., nFET region of wafer 202—see arrow 230).

As will be described in detail below, the sacrificial layers 206*a/b* will be removed later on in the process to permit the formation of a gate all around transistor configuration for the semiconductor device. By contrast, the active layers 208*a/b* will remain in place and serve as channels of the pFET and nFET transistors, respectively. It is notable that the number of sacrificial layers 206*a/b* and active layers 208*a/b* shown in the figures is provided merely as an example to illustrate the present techniques. For instance, embodiments are contemplated herein where more or fewer sacrificial layers 206*a/b* and/or more or fewer active layers 208*a/b* are present than shown. According to an exemplary embodiment, each of the sacrificial layers 206*a/b* and each of the active layers 208*a/b* is deposited/formed on wafer 202 using an epitaxial growth process. According to an exemplary embodiment, each of the sacrificial layers 206*a/b* and each of the active layers 208*a/b* has a thickness of from about 3 nanometers (nm) to about 25 nm.

The materials employed for the sacrificial layers 206*a/b* and active layers 208*a/b* are such that the sacrificial layers 206*a/b* can be removed selective to the active layers 208*a/b* during fabrication. For instance, according to an exemplary embodiment, the sacrificial layers 206*a/b* are each formed from SiGe, while the active layers 208*a/b* are formed from Si. In that case, the active layers 208*a* will later be selectively modified in the channel region of the pFET transistor to include SiGe, i.e., either as a cladding around a (thinned) Si core, or as a uniform SiGe channel. When using SiGe and Si as the sacrificial layers 206*a/b* and active layers 208*a/b*, respectively, etchants such as wet hot SC1, vapor phase hydrogen chloride (HCl), vapor phase chlorine trifluoride ($ClF_3$) and other reactive clean processes (RCP) are selective for etching of SiGe versus Si.

Shallow trench isolation region 210 serves to isolate the device stacks 204*a* and 204*b*. To form the shallow trench isolation region 210, a trench is patterned in the wafer 202 in between the device stacks 204*a* and 204*b*. A dielectric such as an oxide (which may also be generally referred to herein as a 'shallow trench isolation oxide') is then deposited into, and filling, the trench, followed by planarization and recess. Although not explicitly shown in the figures, a liner (e.g., a thermal oxide or silicon nitride (SiN)) may be deposited prior to the shallow trench isolation oxide. Suitable shallow trench isolation oxides include, but are not limited to, oxide low-κ materials such as silicon oxide (SiOx) and/or oxide ultralow-κ interlayer dielectric (ULK-ILD) materials, e.g., having a dielectric constant κ of less than 2.7. Suitable ultralow-κ dielectric materials include, but are not limited to, porous organosilicate glass (pSiCOH). A process such as chemical vapor deposition (CVD), atomic layer deposition (ALD), or physical vapor deposition (PVD) can be employed to deposit the shallow trench isolation oxide, after which the shallow trench isolation oxide can be planarized using a process such as chemical mechanical polishing. The shallow trench isolation oxide is then recessed using a dry or wet etch process.

According to an exemplary embodiment, the sacrificial gate oxide 212 is formed on the device stacks 204*a* and 204*b* having a thickness of from about 1 nm to about 3 nm. Suitable materials for the sacrificial gate oxide 212 include, but are not limited to, SiOx. To form the sacrificial gate 216, a sacrificial gate material is first blanket deposited onto the device stacks 204*a* and 204*b* over the sacrificial gate oxide 212. Suitable sacrificial gate materials include, but are not limited to, poly-silicon and/or amorphous silicon. A process such as CVD, ALD or PVD can be employed to deposit the sacrificial gate material onto the device stacks 204*a* and 204*b*.

The sacrificial gate hardmask 214 is then formed on the sacrificial gate material. Suitable materials for sacrificial gate hardmask 214 include, but are not limited to, SiN, silicon dioxide ($SiO_2$), titanium nitride (TiN) and/or silicon oxynitride (SiON). Standard lithography and etching techniques can be employed to form the sacrificial gate hardmask 214. With standard lithography and etching techniques, a lithographic stack (not shown), e.g., photoresist/anti-reflective coating/organic planarizing layer, is used to pattern the sacrificial gate hardmask 214 with the footprint and location of the sacrificial gate 216. Alternatively, the sacrificial gate hardmask 214 can be formed by other suitable techniques, including but not limited to, sidewall image transfer (SIT), self-aligned double patterning (SADP), self-aligned quadruple patterning (SAQP), and other self-aligned multiple patterning (SAMP). An etch employing the sacrificial gate hardmask 214 is then used to pattern the sacrificial gate material into the sacrificial gate 216 shown in FIGS. 2A-C. Suitable etching processes include, but are not limited to, directional (i.e., anisotropic) etching processes such as reactive ion etching.

According to an exemplary embodiment, the dielectric spacers 218 and the bottom dielectric isolation layer 220 are formed concurrently from a common material(s). Advantageously, the bottom dielectric isolation layer 220 prevents source-to-drain leakage via the wafer 202. For instance, another sacrificial layer (not shown) of a higher germanium (Ge) content than the sacrificial layers 206*a/b* can be employed beneath the device stacks 204*a* and 204*b*, that is selectively removed (forming cavities beneath the device stacks 204*a* and 204*b*) and replaced with the bottom dielectric isolation layer 220 during deposition of the material(s) also used to form the dielectric spacers 218. Namely, high Ge content SiGe can be removed selective to low Ge content SiGe using an etchant such as dry HCl. For instance, in one exemplary embodiment, high Ge content SiGe is SiGe having from about 45% Ge to about 70% Ge, such as SiGe55 (which is SiGe having a Ge content of about 55%). In that case, sacrificial layers 206*a/b* are preferably formed from a low Ge content SiGe, i.e., SiGe having from about 15% Ge to about 35% Ge such as SiGe30 (which is SiGe having a Ge content of about 30%).

Suitable materials for the dielectric spacers 218 and the bottom dielectric isolation layer 220 include, but are not limited to, SiOx, silicon carbide (SiC), silicon oxycarbide (SiCO), SiN, silicoboron carbonitride (SiBCN) and/or silicon oxycarbonitride (SiOCN), which can be deposited into the cavities and over the device stacks 204*a* and 204*b* using a process such as CVD. ALD or PVD. A directional (anisotropic) etching process such as reactive ion etching can then be used to pattern that material deposited over the device stacks 204*a* and 204*b* into the dielectric spacers 218 alongside the sacrificial gate hardmask 214 and sacrificial gate 216.

To form the inner spacers 222, a selective lateral etch is first performed to recess the sacrificial layers 206*a/b*. As shown in FIGS. 2B and 2C, this recess etch forms pockets along the sidewalls of the device stacks 204*a* and 204*b*. These pockets are then filled with a dielectric spacer material to form the inner spacers 222 within the pockets. These inner spacers 222 will serve to offset the replacement metal gates (see below) from the pFET and nFET source/drain regions 224*p* and 224*n*. As provided above, the sacrificial layers 206*a/b* can be formed from SiGe and the active layers 208*a/b* can be formed from Si. In that case, a SiGe-selective non-directional (isotropic) etching process can be used for the selective recess etch of the sacrificial layers 206*a/b*. Suitable dielectric spacer materials for inner spacers 222 include, but are not limited to, SiN, SiOx, SiC and/or SiCO. A process such as CVD, ALD or PVD can be employed to deposit the dielectric spacer material into the pockets, after which excess spacer material can be removed using an isotropic etching process.

According to an exemplary embodiment, the pFET and nFET source/drain regions 224*p* and 224*n* are each formed from an in-situ doped (i.e., during growth) or ex-situ doped (e.g., via ion implantation) epitaxial material such as epitaxial Si, epitaxial SiGe, etc. Suitable p-type dopants for pFET source/drain regions 224*p* include, but are not limited to, boron (B). Suitable n-type dopants for nFET source/drain regions 224*n* include, but are not limited to, phosphorous (P) and/or arsenic (As). With inner spacers 222 in place along the sidewalls of the device stacks 204*a* and 204*b*, epitaxial growth of the pFET and nFET source/drain regions 224*p* and 224*n* is templated only from the ends of the active layers 208*a/b* along the sidewalls of the device stacks 204*a* and 204*b*.

Following formation of the pFET and nFET source/drain regions 224*p* and 224*n*, interlayer dielectric 226 is deposited onto the semiconductor device structure. Suitable interlayer dielectric 226 materials include, but are not limited to, SiN, SiOC and/or oxide low-K materials such as SiOx and/or oxide ULK-ILD materials such as pSICOH, which can be deposited onto the semiconductor device structure using a process such as CVD, ALD or PVD. Following deposition, the interlayer dielectric 226 can be planarized using a process such as chemical mechanical polishing.

Figure 3A:
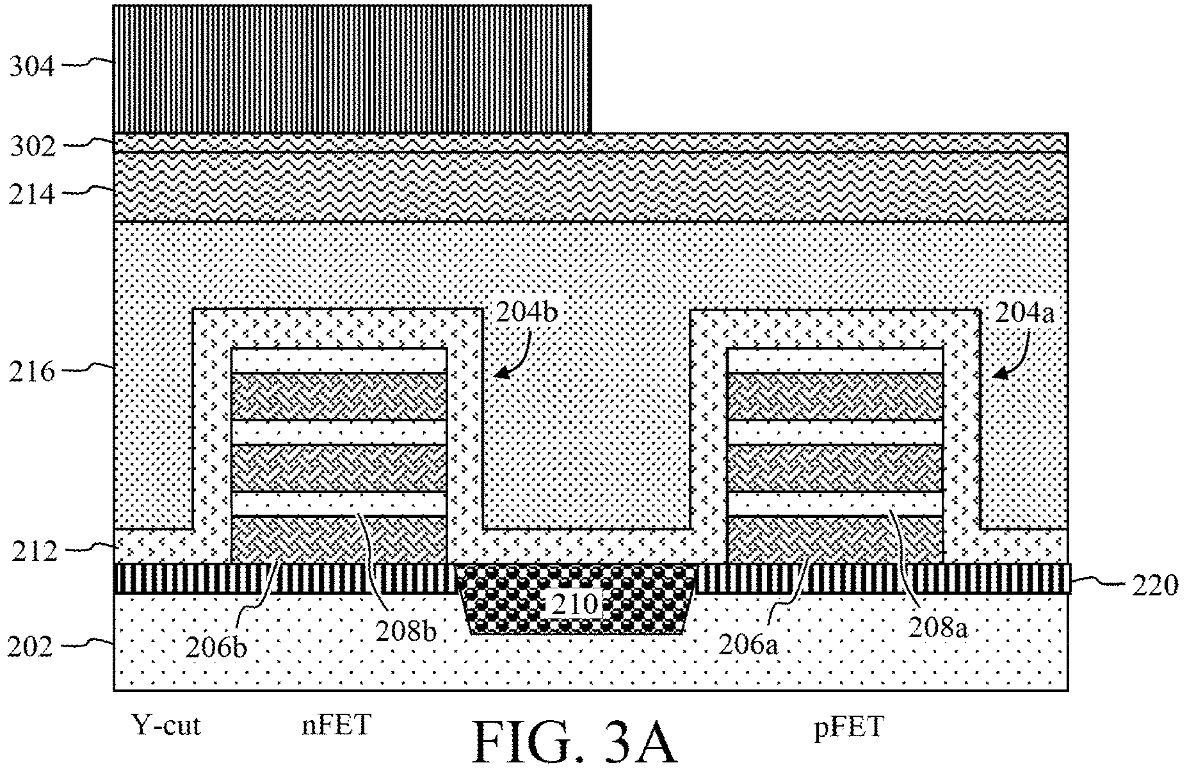
FIG. 3A is a Y cross-sectional view.
Figure 3B:
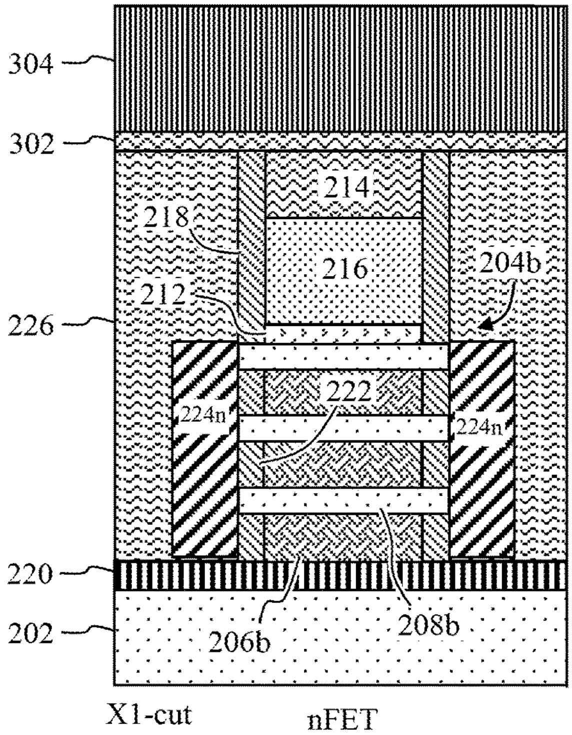
FIG. 3B is an X1 cross-sectional view.
Figure 3C:
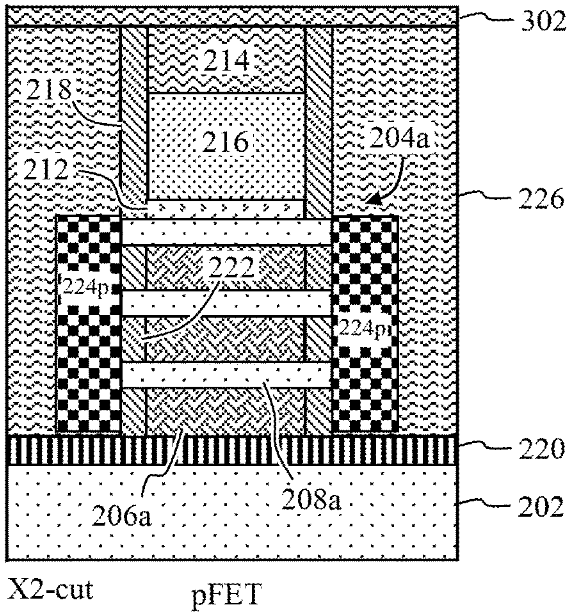
FIG. 3C is an X2 cross-sectional view illustrating a (first) hardmask having been formed over the sacrificial gate hardmask, the dielectric spacers, and the interlayer dielectric, and a lithographic stack having been formed on the first hardmask according to an embodiment of the present invention.

As will be described in detail below, the device stack 204*a* will be selectively opened enabling modification of the active layers 208*a* to form, in this exemplary embodiment. SiGe cladding/Si core channels in the pFET transistor. To do so, as shown in FIG. 3A (a Y cross-sectional view), FIG. 3B (an X1 cross-sectional view), and FIG. 3C (an X2 cross-sectional view), a hardmask 302 is formed over the sacrificial gate hardmask 214, the dielectric spacers 218, and the interlayer dielectric 226, and a lithographic stack 304 is formed on the hardmask 302. Suitable materials for the hardmask 302 include, but are not limited to, SiN, $SiO_2$, TiN and/or SiON. While not explicitly shown in the figures, as described above, the lithographic stack 304 can contain a combination of layers, e.g., photoresist/anti-reflective coating/organic planarizing layer.

Figure 4A:
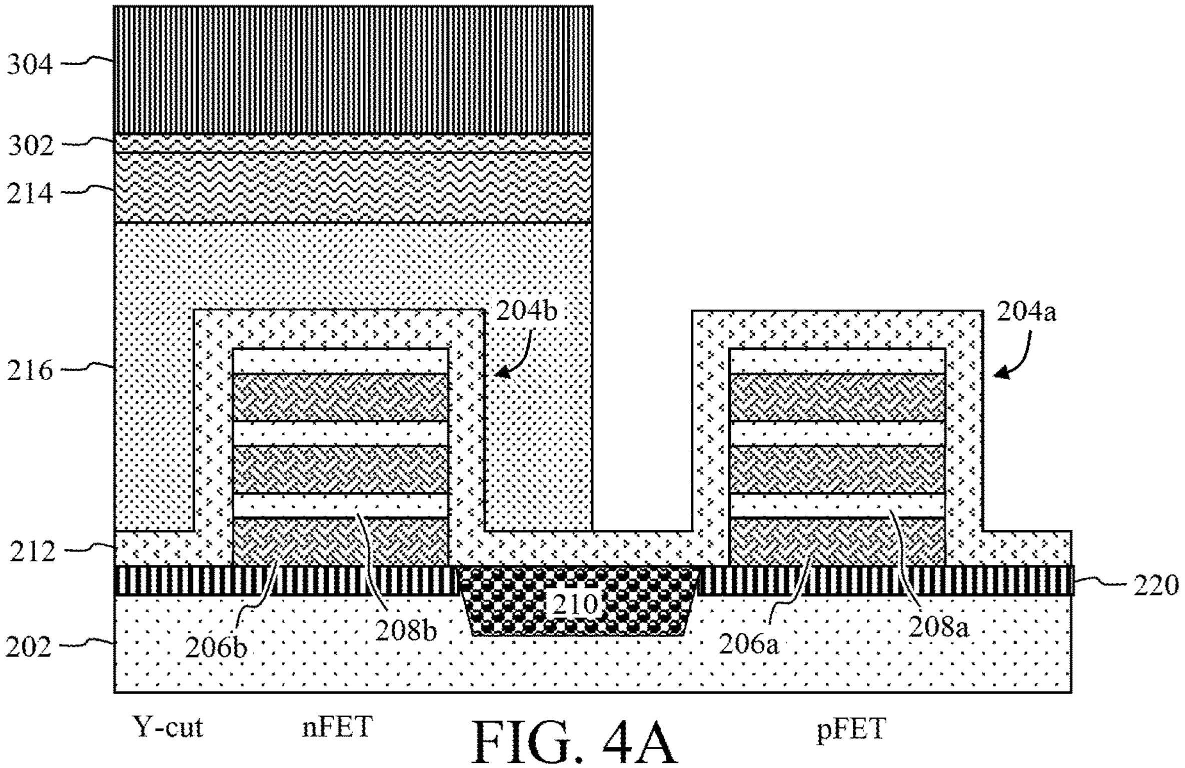
FIG. 4A is a Y cross-sectional view.
Figure 4B:
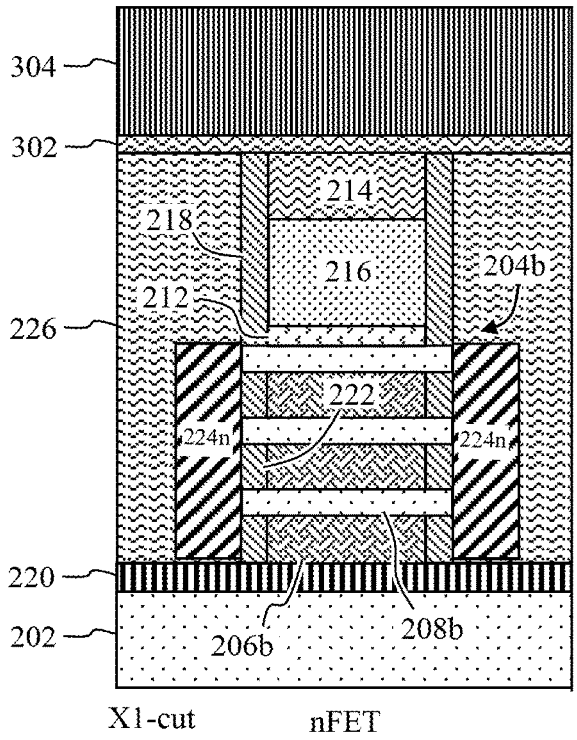
FIG. 4B is an X1 cross-sectional view.
Figure 4C:
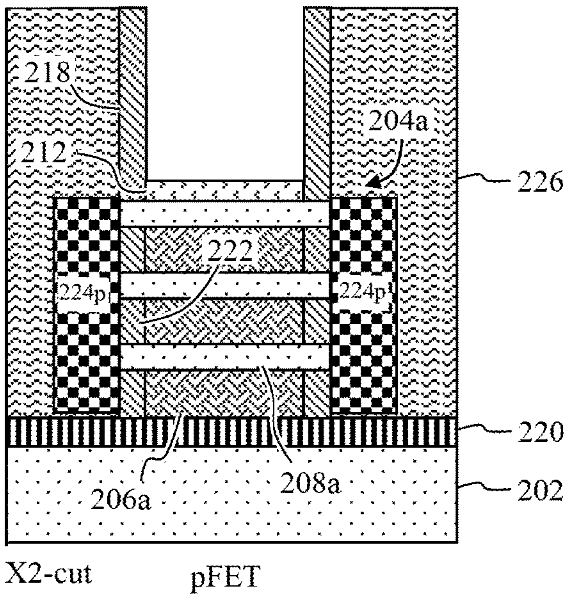
FIG. 4C is an X2 cross-sectional view illustrating the lithographic stack having been used to selectively open the first hardmask, the sacrificial gate hardmask and the sacrificial gate over the first device stack according to an embodiment of the present invention.

As shown in FIG. 4A (a Y cross-sectional view), FIG. 4B (an X1 cross-sectional view), and FIG. 4C (an X2 cross-sectional view), the lithographic stack 304 is then used to selectively open the hardmask 302, the sacrificial gate hardmask 214 and the sacrificial gate 216 over the device stack 204*a*. As provided above, the sacrificial gate hardmask 214 and the hardmask 302 can be formed from a nitride and/or oxide material (e.g., SiN, $SiO_2$, TiN and/or SiON) and the sacrificial gate 216 can be formed from a material such as poly-silicon and/or amorphous silicon. In that case, a nitride and/or oxide-selective etch can be used to open the sacrificial gate hardmask 214 and the hardmask 302 over the device stack 204*a*, and a poly-silicon and/or amorphous silicon-selective etch can be employed to open the sacrificial gate 216 over the device stack 204*a*. As shown in FIGS. 4A-C, depending on the selectivity of the etching process employed, some erosion of the dielectric spacers 218 can occur. Following this patterning step, what remains of the lithographic stack 304 is also removed. In this particular example, the device stack 204*a* corresponds to the transistor(s) of a first polarity, more specifically a pFET transistor. As such, the device stack 204*b* corresponds to the transistor(s) of a second polarity, more specifically an nFET transistor. However, as highlighted above, this process flow is merely an example, and is in no way intended to limit the present techniques to any given order of fabrication.

Figure 5A:
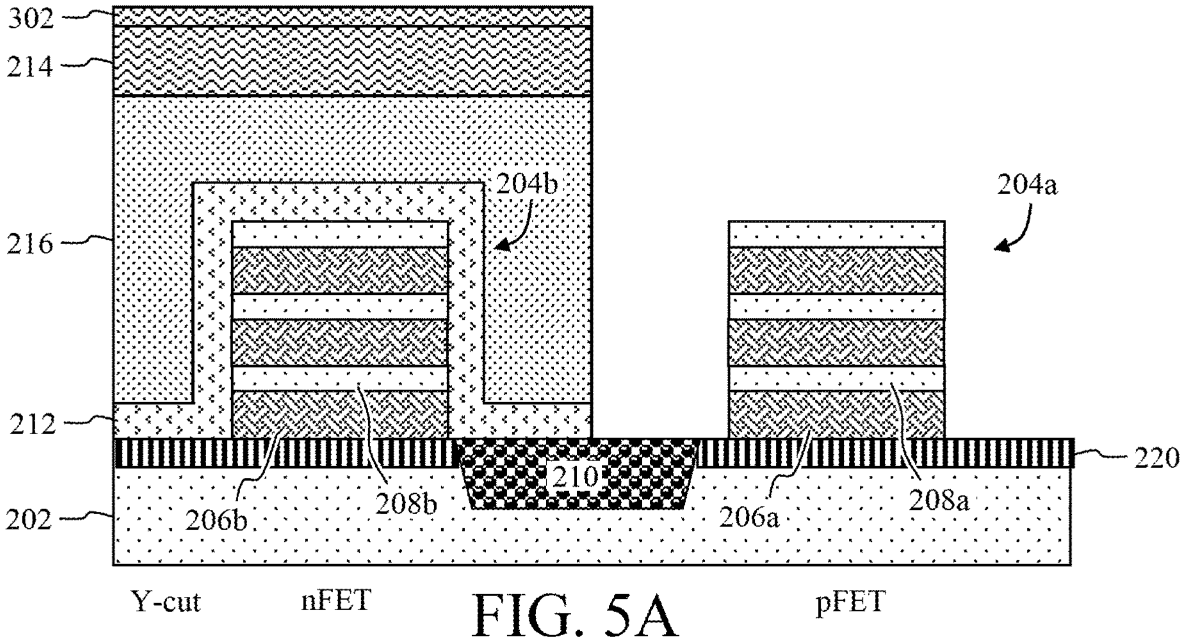
FIG. 5A is a Y cross-sectional view.
Figure 5B:
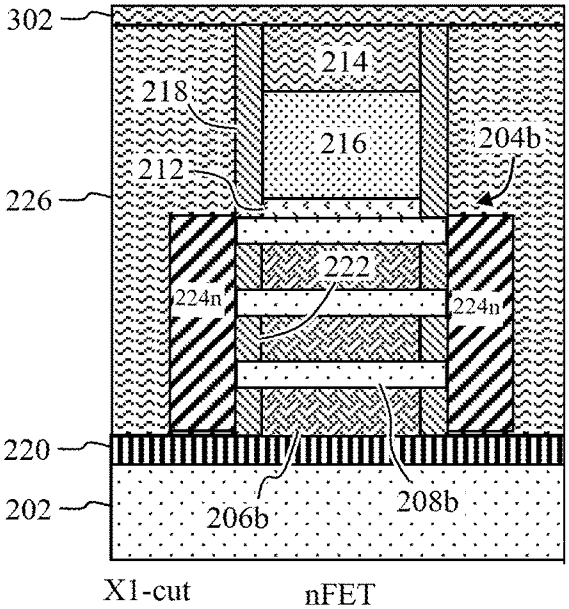
FIG. 5B is an X1 cross-sectional view.
Figure 5C:
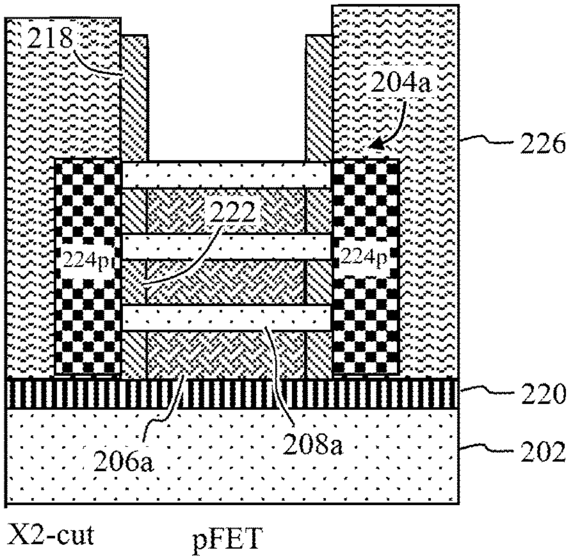
FIG. 5C is an X2 cross-sectional view illustrating the sacrificial gate oxide over the first device stack having been removed according to an embodiment of the present invention.

Removal of the hardmask 302, the sacrificial gate hardmask 214 and the sacrificial gate 216 from over the device stack 204*a* exposes the sacrificial gate oxide 212 over the device stack 204*a* which, as shown in FIG. 5A (a Y cross-sectional view), FIG. 5B (an X1 cross-sectional view), and FIG. 5C (an X2 cross-sectional view), is then also removed. An oxide-selective etching process may be employed to remove the sacrificial gate oxide 212 from the device stack 204*a*. As shown in FIGS. 5A-C, depending on the selectivity of the etching process employed, some erosion of the exposed interlayer dielectric 226 can occur.

Figure 6A:
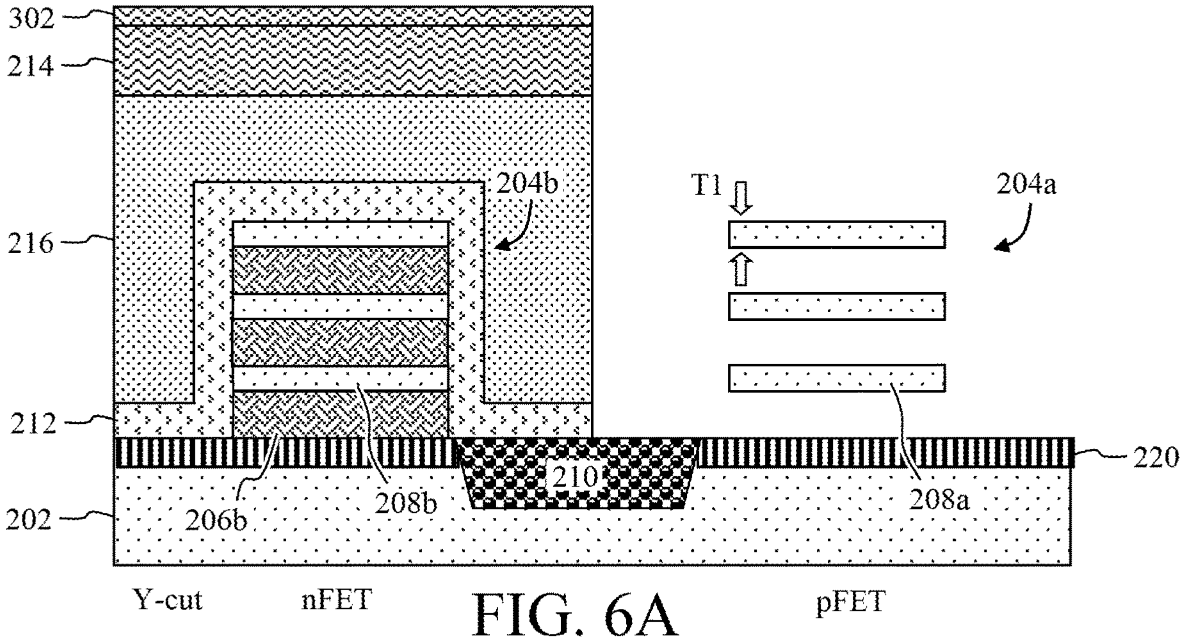
FIG. 6A is a Y cross-sectional view.
Figure 6B:
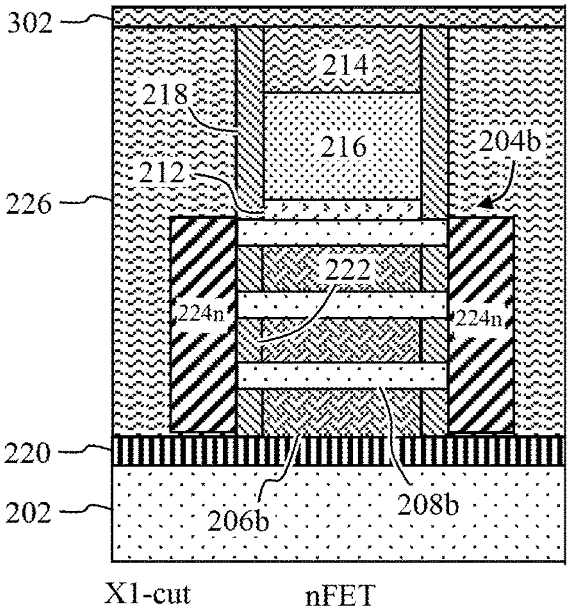
FIG. 6B is an X1 cross-sectional view.
Figure 6C:
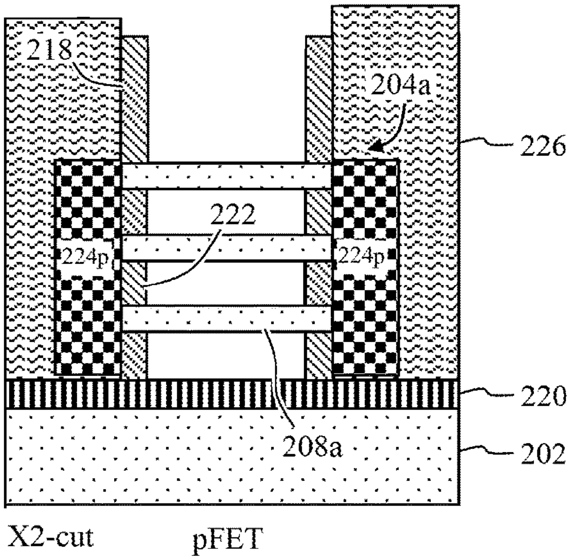
FIG. 6C is an X2 cross-sectional view illustrating the sacrificial layers in the first device stack having been selectively removed according to an embodiment of the present invention.

As shown in FIG. 6A (a Y cross-sectional view), FIG. 6B (an X1 cross-sectional view), and FIG. 6C (an X2 cross-sectional view), the now-exposed sacrificial layers 206*a* in the device stack 204*a* are then removed selective to the active layers 208*a*. According to an exemplary embodiment, the sacrificial layers 206*a* are formed from SiGe, while the active layers 208*a* are formed from Si. In that case, etchants such as wet hot SC1, vapor phase HCl, vapor phase $ClF_3$ and/or other reactive clean processes can be employed to remove the sacrificial layers 206*a* selective to the active layers 208*a*. Removal of the sacrificial layers 206*a* releases the active layers 208*a* from the device stack 204*a*. As highlighted above, these 'released' active layers 208*a* will be used to form the channels of the pFET transistor(s). However, the active layers 208*a* will next be modified to, in this exemplary embodiment, form SiGe cladding/Si core channels for the pFET transistor. Notably, the sacrificial gate oxide 212 and sacrificial gate hardmask 214/sacrificial gate 216 remain in place covering the sacrificial layers 206*b* and active layers 208*b* of the device stack 204*b* during this modification process.

Figure 7A:
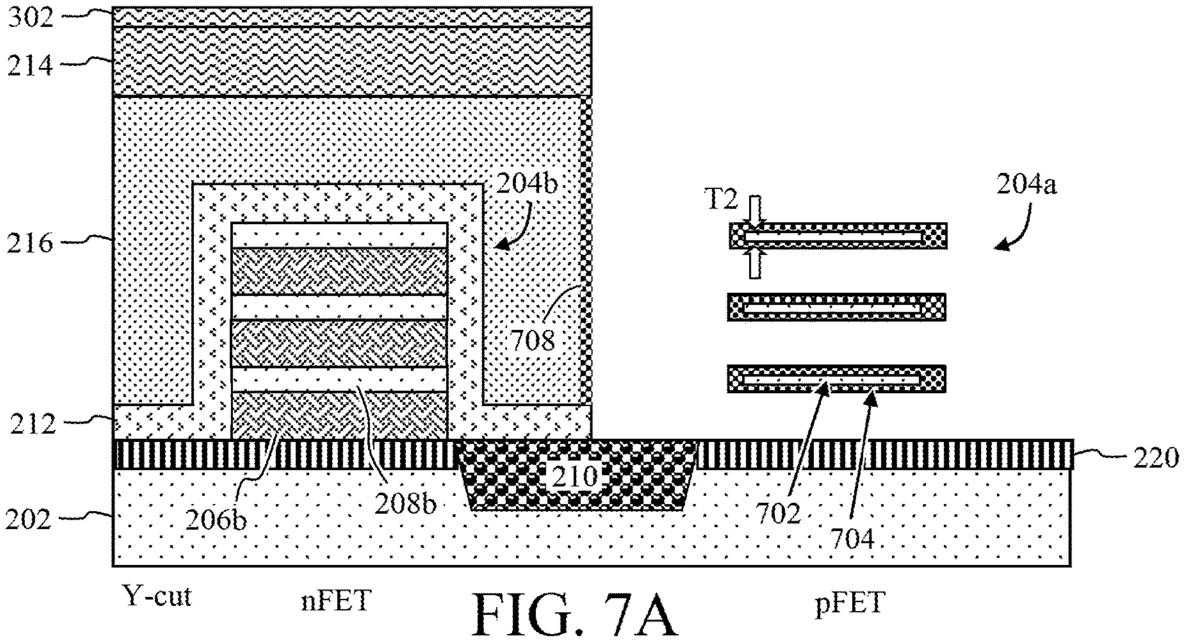
FIG. 7A is a Y cross-sectional view.
Figure 7B:
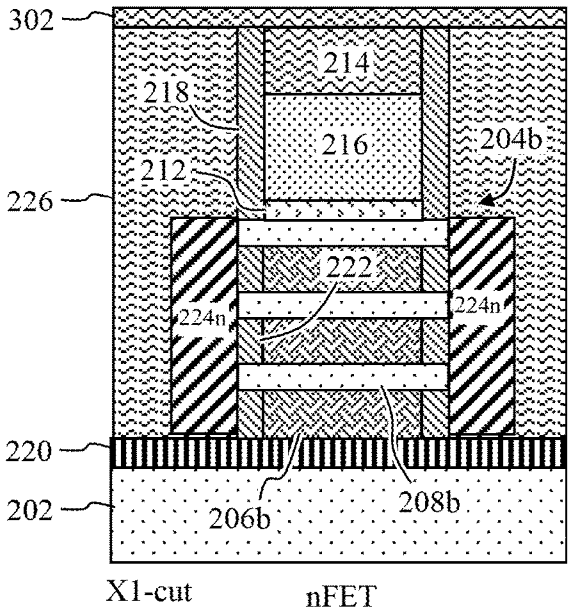
FIG. 7B is an X1 cross-sectional view.
Figure 7C:
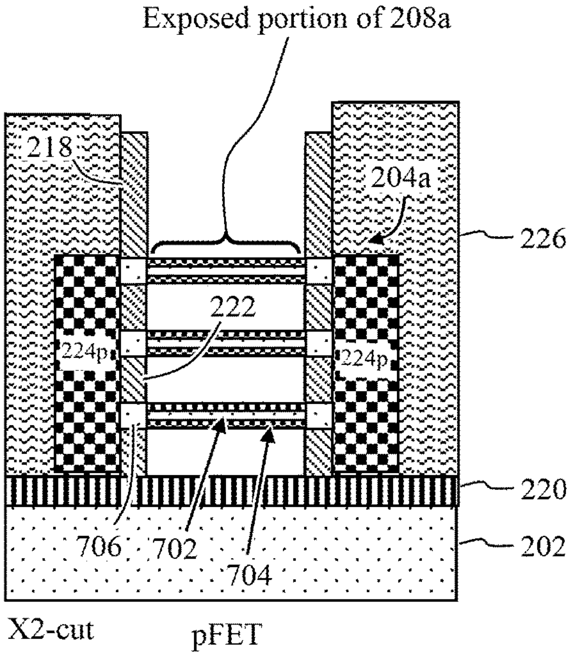
FIG. 7C is an X2 cross-sectional view illustrating the exposed portions of the active layers in the first device stack having been thinned, forming (e.g., silicon) cores, and a (e.g., silicon germanium) cladding layer having been grown on/surrounding the cores to form core/cladding channels in the first device stack according to an embodiment of the present invention.

As shown in FIG. 7A (a Y cross-sectional view), FIG. 7B (an X1 cross-sectional view), and FIG. 7C (an X2 cross-sectional view), the exposed portions of the active layers 208*a* are thinned, forming what will be the Si cores 702, and a SiGe cladding 704 is grown on/surrounding the Si cores 702. The exposed portions of the active layers 208*a* include those portions of the active layers 208*a* in between the dielectric spacers 218/inner spacers 222. Thus, other portions 706 of the active layers 208*a* masked by the dielectric spacers 218/inner spacers 222 will remain unaffected/unmodified by the thinning/cladding formation. As such, the composition of these unmodified portions 706 remains only Si, resulting in a unique configuration of the pFET channels. Namely, each of the pFET channels now includes a (first) portion having an Si core 702/SiGe cladding 704 in the channel region of the pFET transistor (which will be surrounded by the pFET replacement metal gate—see below) connected to the source/drain regions 224*p* by the (second) Si-only portion 706.

According to an exemplary embodiment, the exposed portions of the active layers 208*a* (i.e., in between the dielectric spacers 218/inner spacers 222) are thinned using a wet chemical etch such as tetramethylammonium hydroxide (TMAH). Notably, this channel thinning occurs only in the pFET region of the wafer 202 as the sacrificial gate oxide 212 and sacrificial gate hardmask 214/sacrificial gate 216 remain in place covering the sacrificial layers 206*b* and active layers 208*b* of the device stack 204*b* during this modification process. Comparing FIG. 6A and FIG. 7A, it can be seen that prior to the thinning (FIG. 6A), active layers 208*a* have a thickness T1 and, following the thinning (FIG. 7A) active layers 208*a* have a thickness T2, where T1 is greater than (>) T2.

Following the thinning to form the Si cores 702, an epitaxial SiGe regrowth is employed to form SiGe cladding 704 on the Si cores 702. As can be seen in FIGS. 7A-C, the SiGe cladding 704 fully surrounds the Si cores 702. As provided above, implementation of SiGe in the pFET channel can vastly improve channel mobility. It is notable that this epitaxial SiGe regrowth will also occur on other Si-containing surfaces such as along the exposed sidewall of the sacrificial gate 216 (e.g., poly-silicon and/or amorphous silicon). See, e.g., extra SiGe regrowth 708 in FIG. 7A. This extra SiGe regrowth will, however, be removed later on in the process during processing of the device stack 204*b*.

As shown in FIGS. 7A-C, the semiconductor device in the present example has dual channels, one channel type (SiGe-containing channel) for p-channel field-effect transistors (pFETs) and another channel type (Si channel) for n-channel field-effect transistors (nFETs). Namely, by way of the above-described process, the pFET channels now include SiGe in the cladding 704 that fully surrounds the Si cores 702.

Figure 8A:
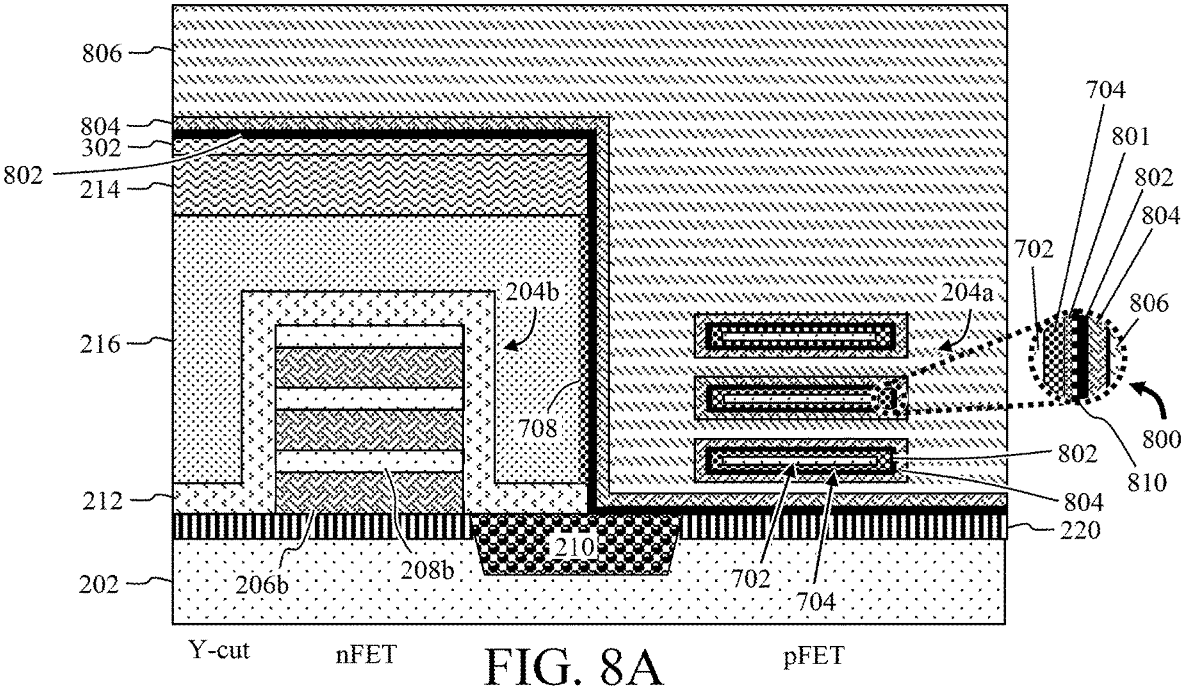
FIG. 8A is a Y cross-sectional view.
Figures 8B, 8C:
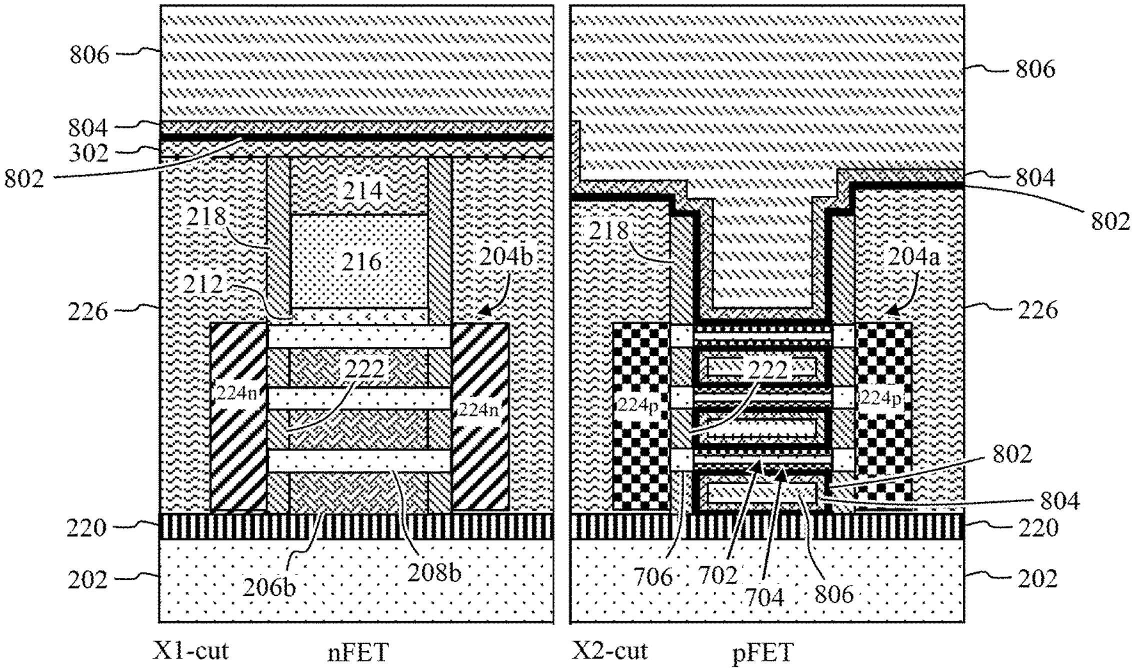
FIG. 8B is an X1 cross-sectional view.
FIG. 8C is an X2 cross-sectional view illustrating a (first) gate dielectric and a (first) gate dielectric cap having been deposited onto, and surrounding, the core/cladding channels in the first device stack, and a (first) sacrificial placeholder having been deposited over the first gate dielectric/first gate dielectric cap according to an embodiment of the present invention.

As shown in FIG. 8A (a Y cross-sectional view), FIG. 8B (an X1 cross-sectional view), and FIG. 8C (an X2 cross-sectional view), a (first) gate dielectric 802 and a (first) gate dielectric cap 804 are next deposited onto, and surrounding, the Si core 702/SiGe cladding 704 in the device stack 204*a*, and a (first) sacrificial placeholder 806 is deposited over the gate dielectric 802/gate dielectric cap 804. As shown in FIGS. 8A-C, deposition of the gate dielectric 802 and gate dielectric cap 804 in this manner also deposits these materials on the exposed surface of the wafer 202 beneath the device stack 204*a*, as well as on the top and sidewalls of the sacrificial gate hardmask 214/sacrificial gate 216 which remain present over the device stack 204*b*.

Referring to magnified view 800 in FIG. 8A, prior to depositing the gate dielectric 802, a (first) interfacial layer 801 is preferably first formed on the Si core 702/SiGe cladding 704. Use of an interfacial layer 801 improves the channel/gate dielectric interface quality and channel carrier mobility. Suitable materials for the interfacial layer 801 include but are not limited to oxide materials such as SiOx. According to an exemplary embodiment, the interfacial layer 801 has a thickness of from about 0.5 nm to about 3 nm and ranges therebetween.

According to an exemplary embodiment, the thickness and/or composition of the interfacial layer 801 and/or the gate dielectric 802 in the pFET transistor differs from the thickness and/or composition of the interfacial layer and/or the gate dielectric in the nFET transistor (see below). For instance, an optional dipole layer 810 can be deposited onto the interfacial layer 801 prior to the gate dielectric 802. A subsequent reliability anneal (see below) will also serve to diffuse the metal or metals from the dipole layer 810 into (i.e., doping) the interfacial layer 801 and gate dielectric 802. Doing so can be used to tune the threshold voltage of the pFET transistor relative to the nFET transistor, or vice versa. As a result, the device will have different pFET and nFET threshold voltages, and potentially different pFET threshold voltages for different pFET transistors such as high threshold voltage pFET transistors and low threshold voltage pFET transistors. Suitable metals for the dipole layer 810 include, but are not limited to, lanthanum (La), yttrium (Y), magnesium (Mg) and/or gallium (Ga). By way of example only, the dipole layer 810 can have a thickness of from about 0.5 angstroms (Å) to about 30 Å. Following the reliability anneal (performed below), the interfacial layer 801 and the gate dielectric 802 will each contain at least one dipole dopant, e.g., La, Y, Mg and/or Ga. Preferably, different dipole dopants are used in the pFET versus nFET interfacial layer/gate dielectric in order to achieve different threshold voltages. However, as highlighted above, the use of the dipole layer 810 is optional, and embodiments are contemplated herein where the (pFET) interfacial layer 801 and/or gate dielectric 802 are undoped.

Additionally, the interfacial layer 801 and/or the gate dielectric 802 in the pFET transistor can optionally receive different (e.g., nitridation) treatments from the interfacial layer and/or the gate dielectric (see below) in the nFET transistor in order to improve device performance. For example, according to an exemplary embodiment, a nitridation treatment is performed on the interfacial layer 801 and/or gate dielectric 802 before depositing the gate dielectric cap 804. Since SiGe significantly improves negative bias temperature instability (NBTI), nitridation of interfacial layer 801 can reduce interfacial layer 801 regrowth and then improve the device performance at certain NBTI degradation but without NBTI failure. As will be described in detail below, a nitridation treatment may also be performed for the nFET interfacial layer/gate dielectric, however the nitrogen concentration in the nFET interfacial layer/gate dielectric is preferably higher than that in the pFET interfacial layer 801 and/or the gate dielectric 802.

Furthermore, even if the same material (e.g., $HfO_2$) is used as the gate dielectric 802 in the pFET transistor and as the gate dielectric in the nFET transistor, embodiments are contemplated herein where the gate dielectric used in the nFET transistor is thicker than gate dielectric 802 used in the pFET transistor. For example, as will be described in detail below, the thickness of the nFET gate dielectric is preferably from about 1 Å to about 2 Å greater than the thickness of the pFET gate dielectric 802.

In one exemplary embodiment, the gate dielectric 802 is a high-κ material. The term "high-κ," as used herein, refers to a material having a relative dielectric constant κ which is much higher than that of silicon dioxide (e.g., a dielectric constant κ=25 for hafnium oxide ($HfO_2$) rather than 4 for $SiO_2$). Suitable high-κ gate dielectrics include, but are not limited to, hafnium oxide ($HfO_2$), lanthanum oxide ($La_2O_3$), hafnium-lanthanum oxide ($HfLaO_2$), hafnium zirconium oxide ($HfZrO_2$) and/or hafnium aluminum oxide ($HfAlO_2$). A process such as CVD, ALD or PVD can be employed to deposit the gate dielectric 802. According to an exemplary embodiment, gate dielectric 802 has a thickness of from about 1 nm to about 5 nm and ranges therebetween.

Suitable materials for the gate dielectric cap 804 include, but are not limited to, metal nitrides such as titanium nitride (TiN) and/or tantalum nitride (TaN), which can be deposited using a process such as CVD. ALD or PVD. According to an exemplary embodiment, the gate dielectric cap 804 has a thickness of from about 1 nm to about 10 nm and ranges therebetween. The gate dielectric cap 804 will serve to protect the gate dielectric 802 during subsequent processing steps including during later removal of the sacrificial placeholder 806 (see below).

Suitable materials for the sacrificial placeholder 806 include, but are not limited to, poly-silicon and/or amorphous silicon. A process such as CVD, ALD or PVD can be employed to deposit the sacrificial placeholder 806 material over the gate dielectric 802/gate dielectric cap 804. As will be described in detail below, the sacrificial placeholder 806 will be removed later on in the process, and replaced with the workfunction-setting metal(s) and optional fill metal(s) to complete the replacement metal gate of (in this case) the pFET transistor. As shown in FIGS. 8A-C, the sacrificial placeholder 806 fully covers the gate dielectric 802/gate dielectric cap 804, including portions of the gate dielectric 802/gate dielectric cap 804 over the device stack 204*b*. However, a subsequent polishing will remove that overburden from the nFET region of the wafer 202.

Figure 9A:
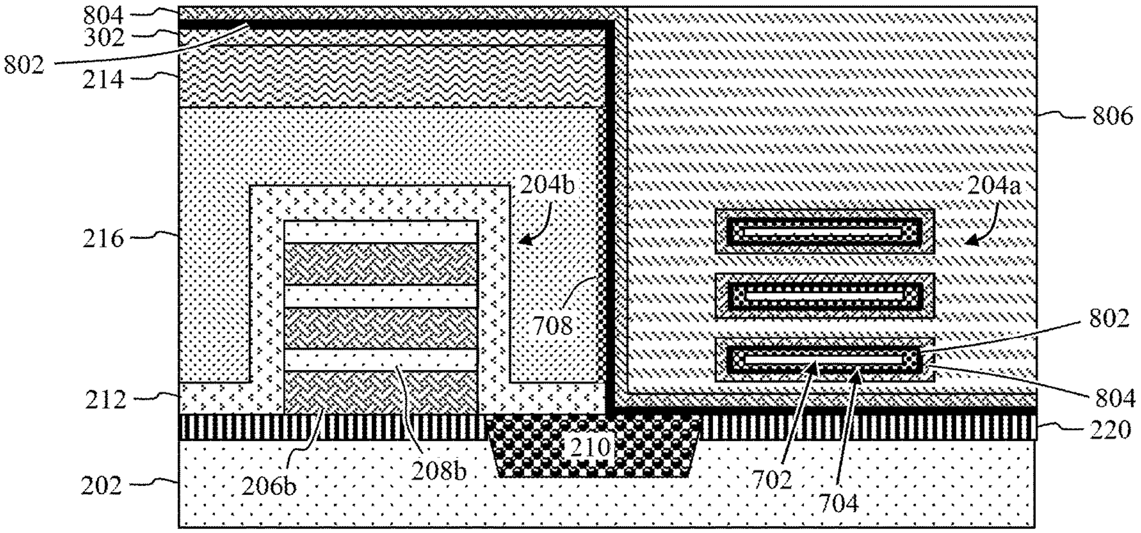
FIG. 9A is a Y cross-sectional view.
Figure 9B:
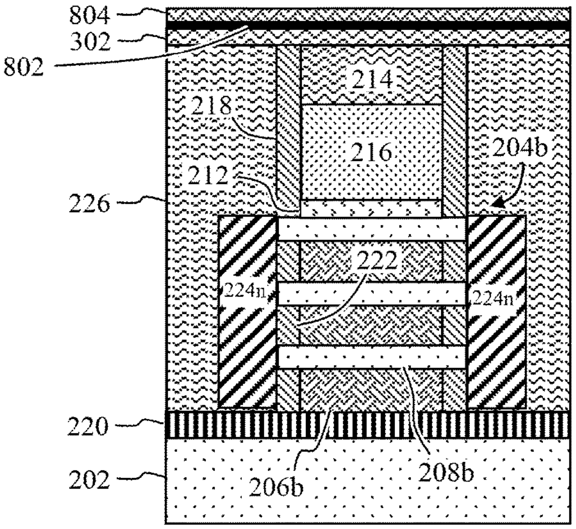
FIG. 9B is an X1 cross-sectional view.
Figure 9C:
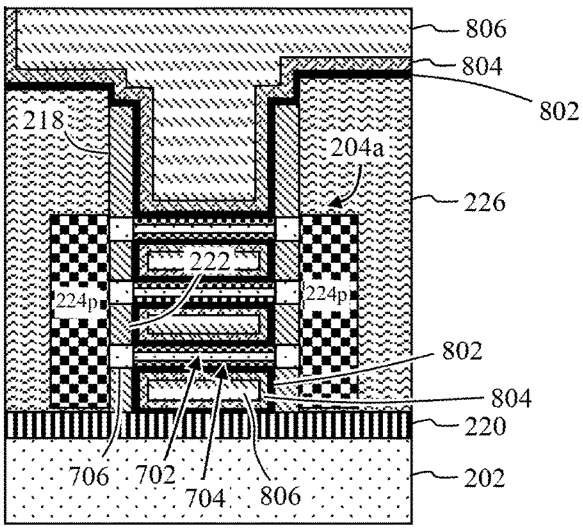
FIG. 9C is an X2 cross-sectional view illustrating the first sacrificial placeholder having been recessed down to the first gate dielectric cap according to an embodiment of the present invention.

Namely, as shown in FIG. 9A (a Y cross-sectional view), FIG. 9B (an X1 cross-sectional view), and FIG. 9C (an X2 cross-sectional view), the sacrificial placeholder 806 is recessed down to the dielectric cap 804. This recessing of the sacrificial placeholder 806 can be performed using a process such as chemical mechanical polishing. The sacrificial placeholder 806 is now removed from the nFET region of wafer 202.

Figure 10A:
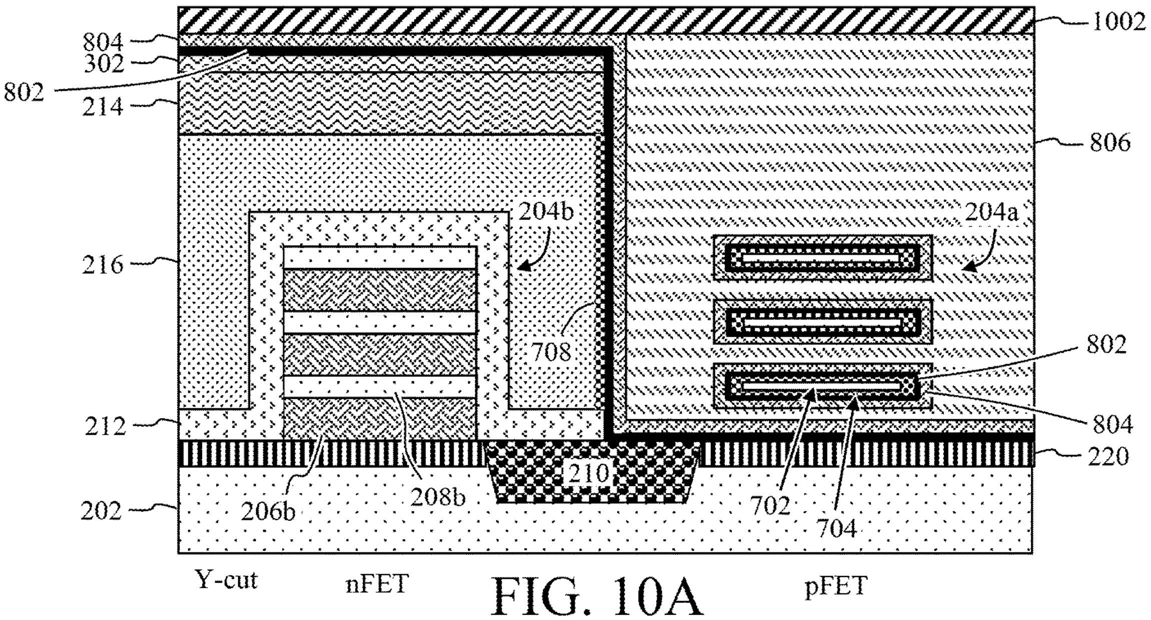
FIG. 10A is a Y cross-sectional view.
Figure 10B:
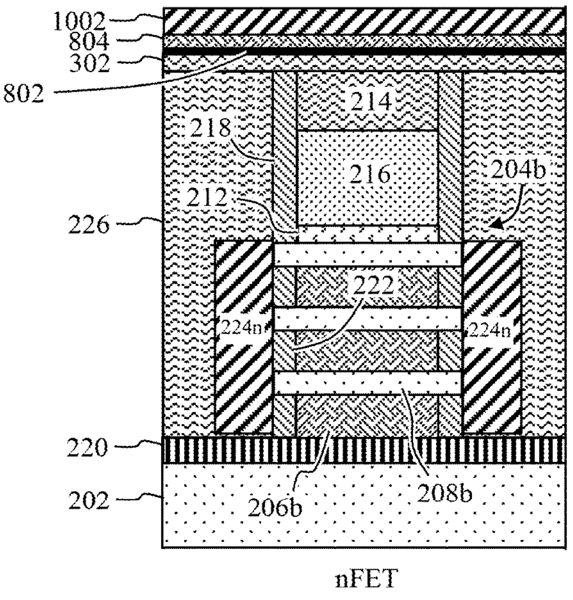
FIG. 10B is an X1 cross-sectional view.
Figure 10C:
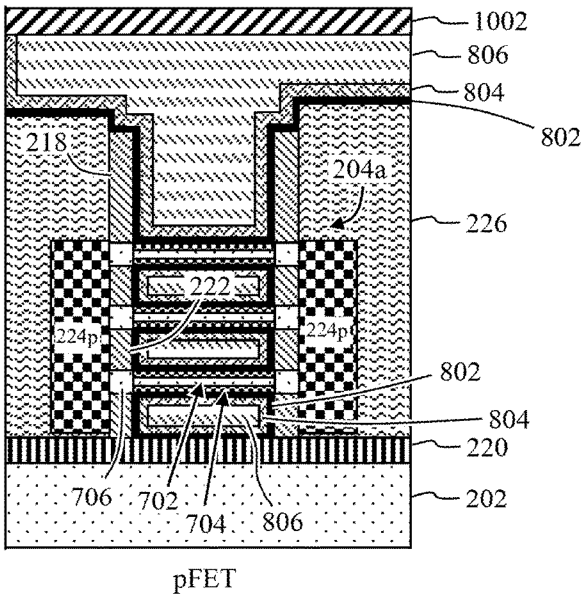
FIG. 10C is an X2 cross-sectional view illustrating a (second) hardmask having been deposited onto the first gate dielectric cap in an nFET region of the wafer and onto the first sacrificial placeholder in a pFET region of the wafer according to an embodiment of the present invention.

As shown in FIG. 10A (a Y cross-sectional view), FIG. 10B (an X1 cross-sectional view), and FIG. 10C (an X2 cross-sectional view), a hardmask 1002 is next deposited onto the gate dielectric cap 804 in the nFET region of the wafer 202 and onto the sacrificial placeholder 806 in the pFET region of the wafer 202. For clarity, the terms 'first' and 'second' may also be used herein when referring to hardmask 302 and hardmask 1002, respectively. As provided above, suitable hardmask materials include, but are not limited to, include, but are not limited to, SiN, $SiO_2$, TiN and/or SiON. According to an exemplary embodiment, the hardmask 1002 has a thickness of from about 2 nm to about 10 nm and ranges therebetween. As will be described in detail below, the hardmask 1002 will be used to remove the sacrificial gate hardmask 214, sacrificial gate 216 and sacrificial gate oxide 212 from the device stack 204*b* (in the nFET region of the wafer 202).

Figure 11A:
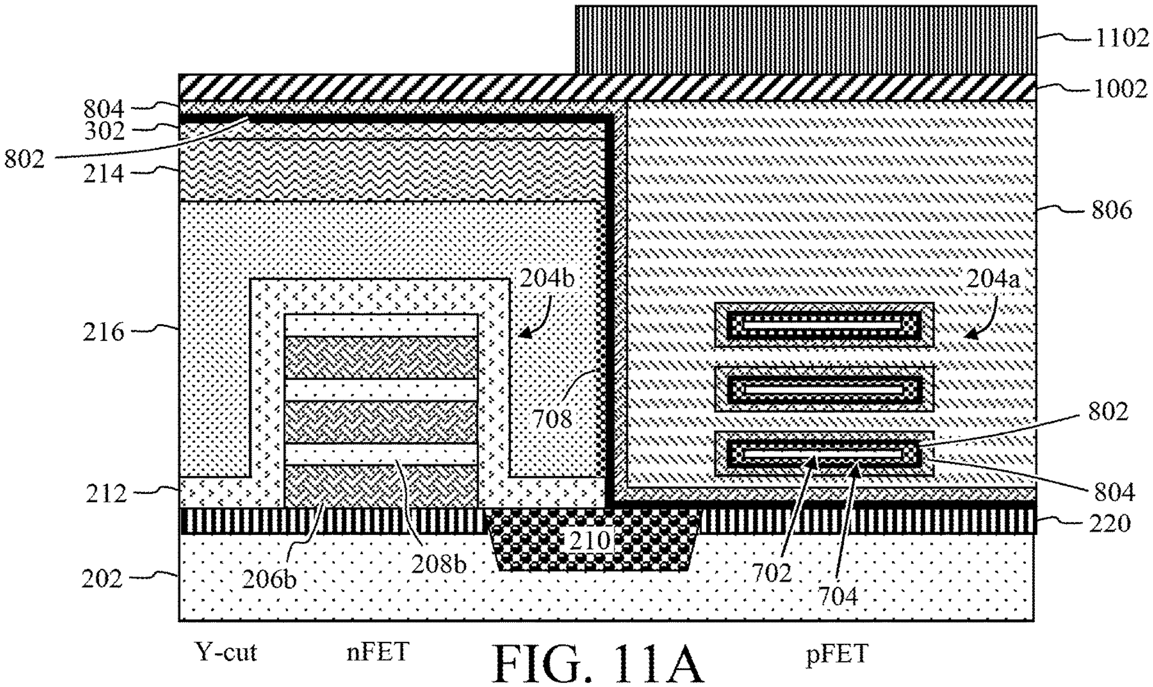
FIG. 11A is a Y cross-sectional view.
Figures 11B, 11C:
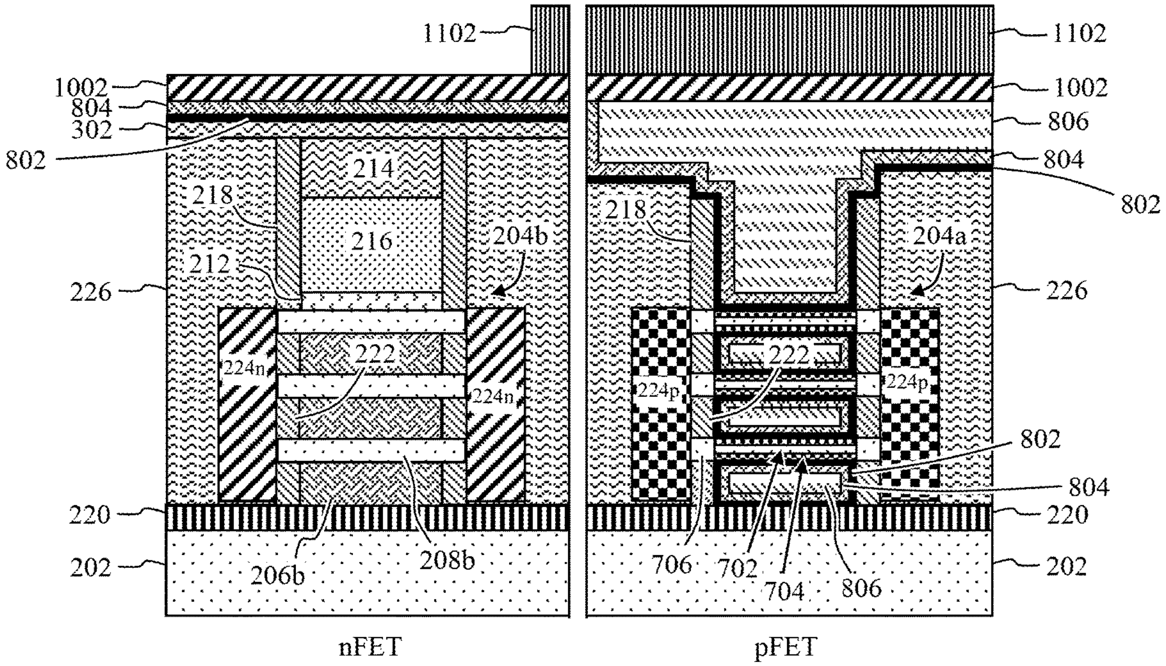
FIG. 11B is an X1 cross-sectional view.
FIG. 11C is an X2 cross-sectional view illustrating a lithographic stack having been formed on the second hardmask according to an embodiment of the present invention.

To do so, as shown in FIG. 11A (a Y cross-sectional view), FIG. 11B (an X1 cross-sectional view), and FIG. 11C (an X2 cross-sectional view), a lithographic stack 1102 is first formed on the hardmask 1002. While not explicitly shown in the figures, as described above, the lithographic stack 1102 can contain a combination of layers, e.g., photoresist/antireflective coating/organic planarizing layer.

Figure 12A:
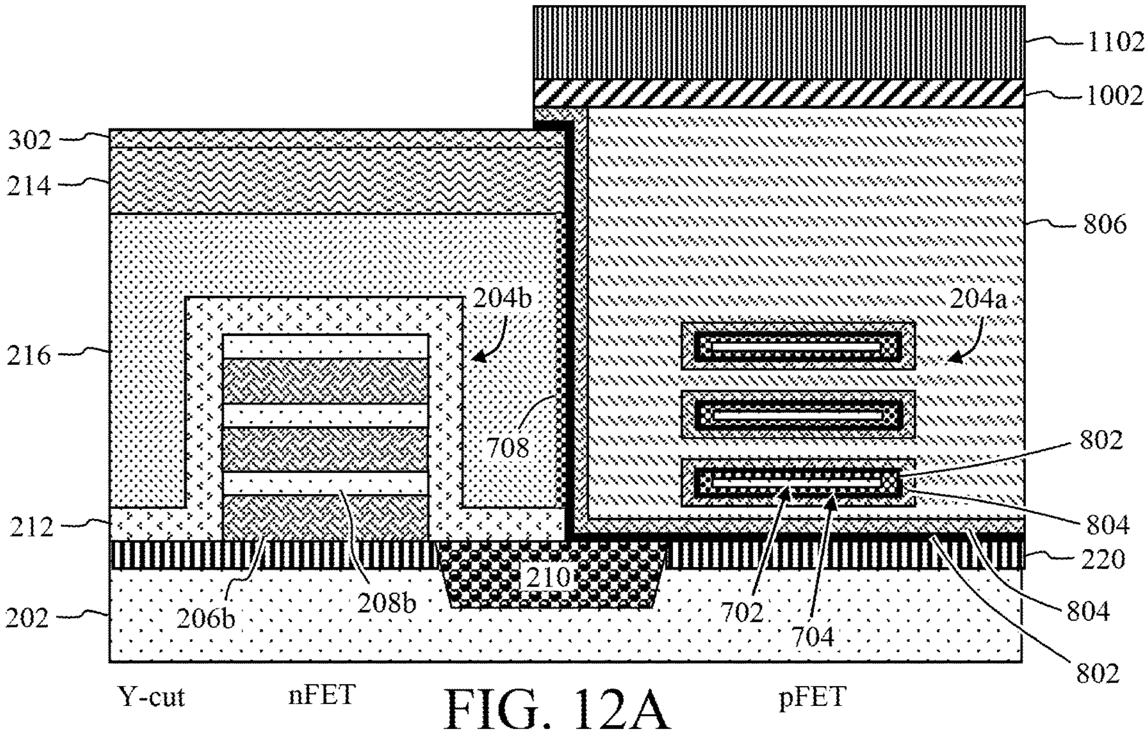
FIG. 12A is a Y cross-sectional view.
Figures 12B, 12C:
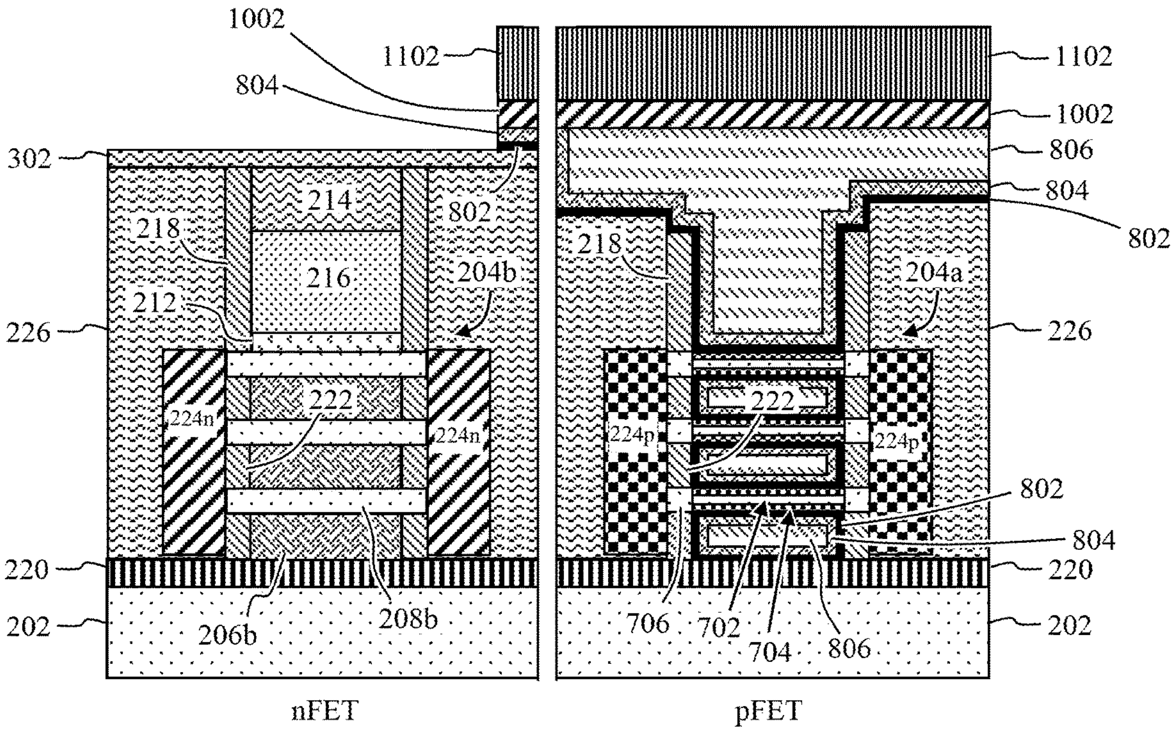
FIG. 12B is an X1 cross-sectional view.
FIG. 12C is an X2 cross-sectional view illustrating the lithographic stack having been used to selectively open the second hardmask over the second device stack, and the (patterned) second hardmask having been used to open the first gate dielectric and first gate dielectric cap over the second device stack according to an embodiment of the present invention.

Next, as shown in FIG. 12A (a Y cross-sectional view), FIG. 12B (an X1 cross-sectional view), and FIG. 12C (an X2 cross-sectional view), the lithographic stack 1102 is used to selectively open the hardmask 1002 over the device stack 204*b* in the nFET region of the wafer 202. A directional, i.e., anisotropic, etching process such as reactive ion etching can be employed to transfer the pattern from the lithographic stack 1102 to the hardmask 1002, thereby opening the hardmask 1002 over the device stack 204*b*. After patterning the hardmask 1002, what remains of the lithographic stack 1102 is removed. The (patterned) hardmask 1002 is then used to open the gate dielectric 802 and gate dielectric cap 804 over the device stack 204*b*. A directional, i.e., anisotropic, etching process such as reactive ion etching can be employed to pattern the gate dielectric 802 and gate dielectric cap 804.

Figure 13A:
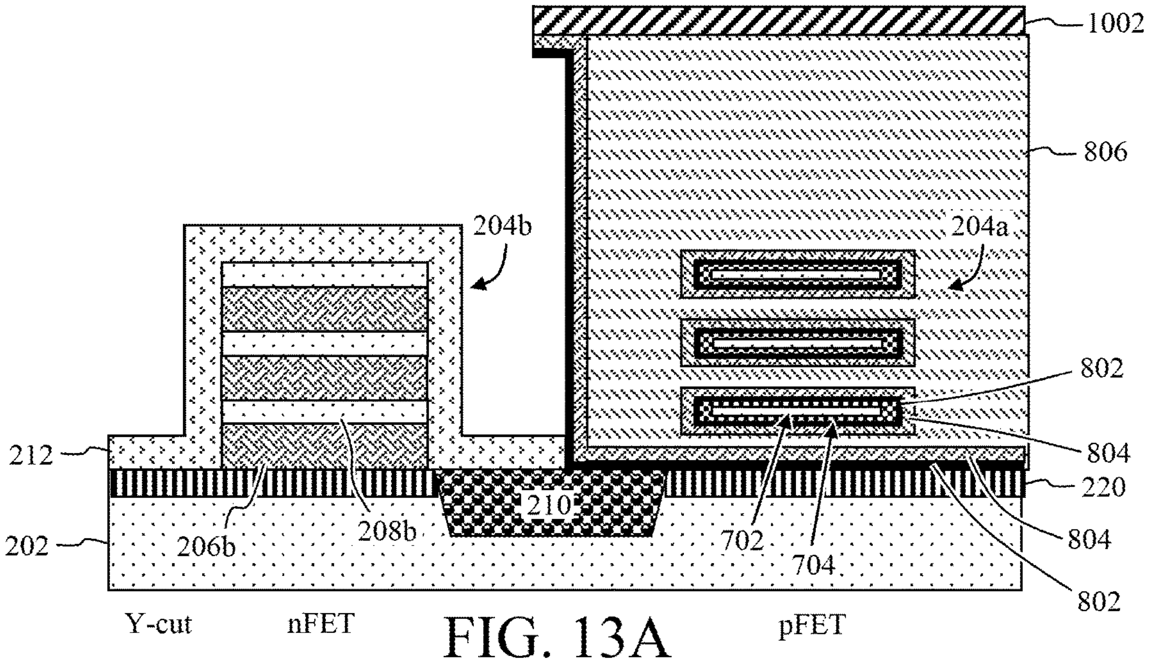
FIG. 13A is a Y cross-sectional view.
Figures 13B, 13C:
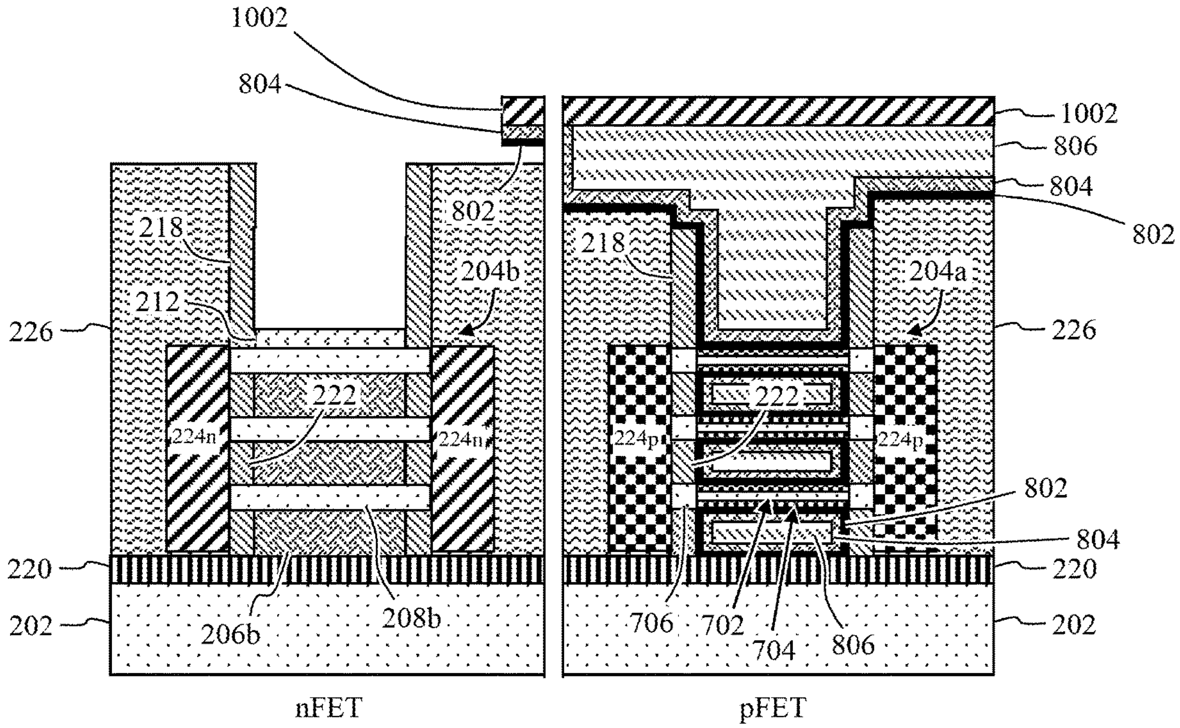
FIG. 13B is an X1 cross-sectional view.
FIG. 13C is an X2 cross-sectional view illustrating the first hardmask and the underlying sacrificial gate hardmask/sacrificial gate having been removed from over the second the device stack according to an embodiment of the present invention.

The hardmask 302 over the device stack 204*b* is now exposed. As shown in FIG. 13A (a Y cross-sectional view), FIG. 13B (an X1 cross-sectional view), and FIG. 13C (an X2 cross-sectional view), the hardmask 302 and underlying sacrificial gate hardmask 214 are then removed, followed by removal of the sacrificial gate 216 from over the device stack 204*b*. As provided above, both the sacrificial gate hardmask 214 and the hardmask 302 can be formed from nitride and/or oxide materials such as SiN, $SiO_2$, TiN and/or SiON. In that case, a nitride- and/or oxide-selective directional, i.e., anisotropic, etching process such as reactive ion etching can be employed to remove the hardmask 302 and sacrificial gate hardmask 214. As provided above, the sacrificial gate 216 can be formed from poly-silicon and/or amorphous silicon. In that case, a poly-silicon and/or amorphous silicon-selective etch can be employed to remove the sacrificial gate 216 from the device stack 204*b*. Notably, removal of the sacrificial gate 216 will also remove the extra SiGe regrowth 708 along the sidewall of the sacrificial gate 216.

Figure 14A:
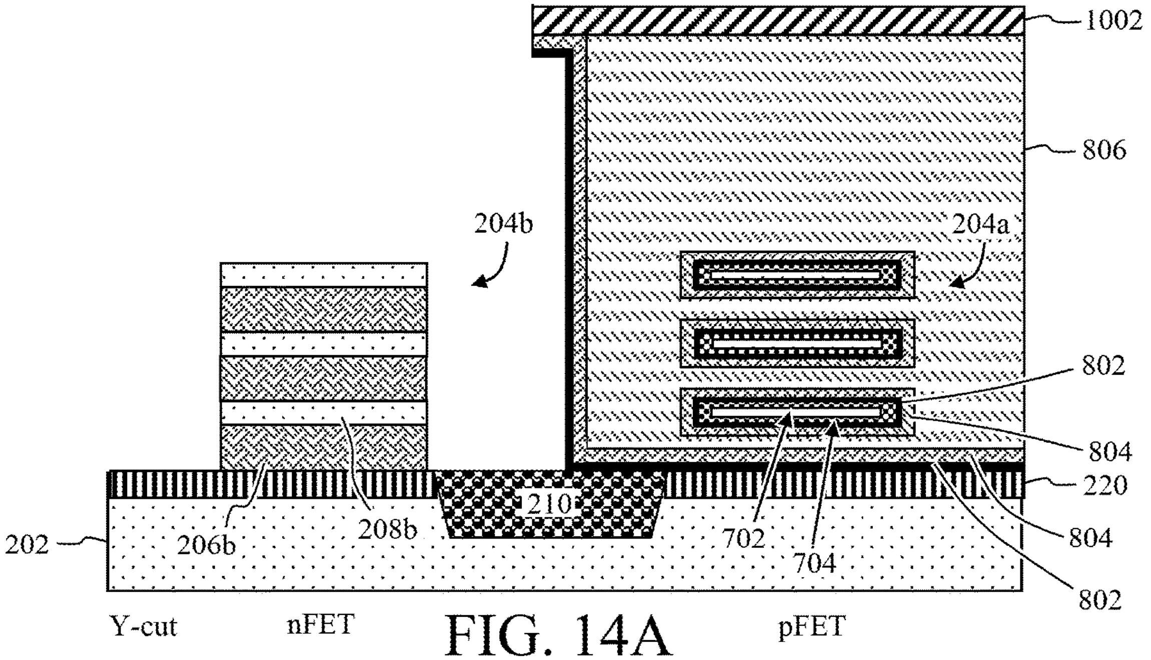
FIG. 14A is a Y cross-sectional view.
Figure 14B:
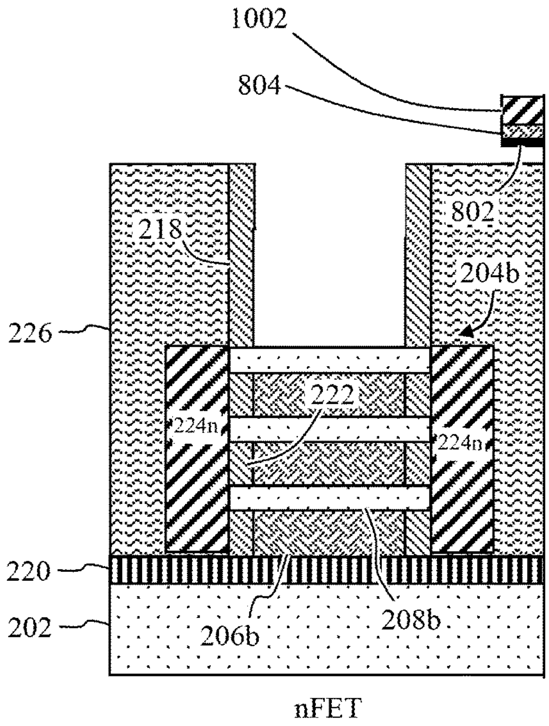
FIG. 14B is an X1 cross-sectional view.
Figure 14C:
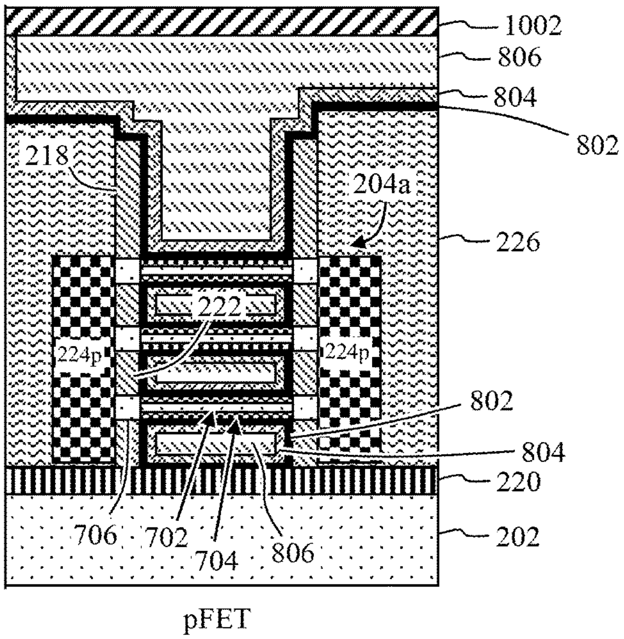
FIG. 14C is an X2 cross-sectional view illustrating the underlying sacrificial gate oxide having been selectively removed from the second device stack according to an embodiment of the present invention.

As shown in FIG. 14A (a Y cross-sectional view), FIG. 14B (an X1 cross-sectional view), and FIG. 14C (an X2 cross-sectional view), removal of the hardmask 302, sacrificial gate hardmask 214 and the sacrificial gate 216 from the device stack 204*b* exposes the underlying sacrificial gate oxide 212, which is then also removed from the device stack 204*b*. An oxide-selective etching process may be employed to remove the sacrificial gate oxide 212.

As shown in FIG. 15A (a Y cross-sectional view), FIG. 15B (an X1 cross-sectional view), and FIG. 15C (an X2 cross-sectional view), exposed portions of the gate dielectric 802 (including those portions of the gate dielectric 802 present along the sidewall of sacrificial placeholder 806 in the nFET region of the wafer 202) are then removed. As provided above, the gate dielectric 802 can be formed from an oxide material such as $HfO_2$ and/or $La_2O_3$. In that case, an oxide-selective etching processes can be employed to remove the gate dielectric 802.

Figure 16A:
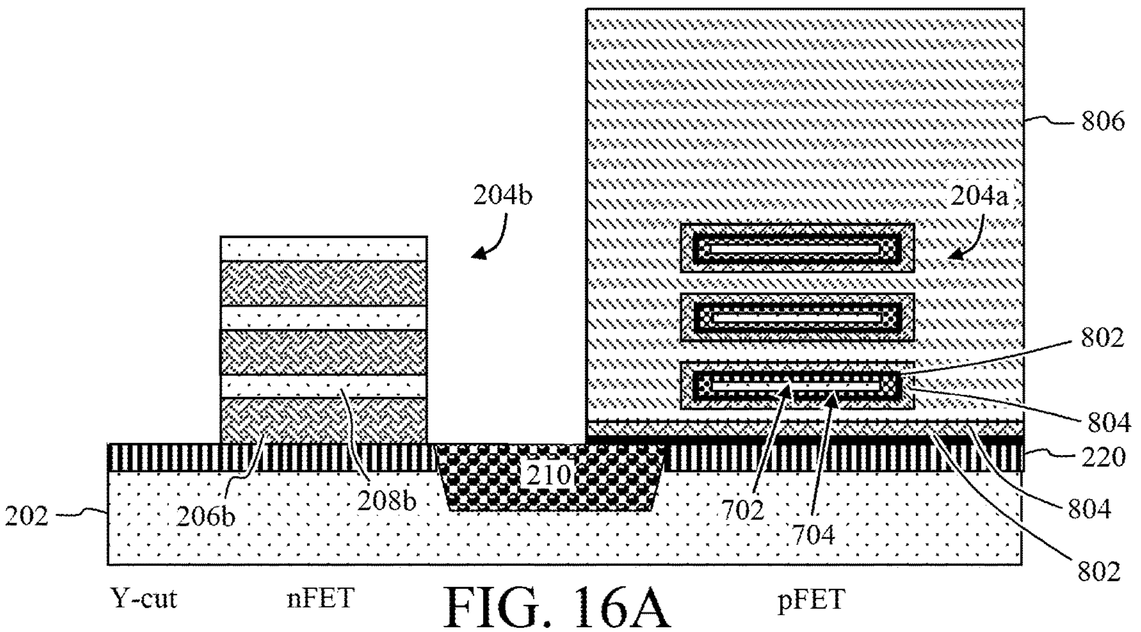
FIG. 16A is a Y cross-sectional view.
Figures 16B, 16C:
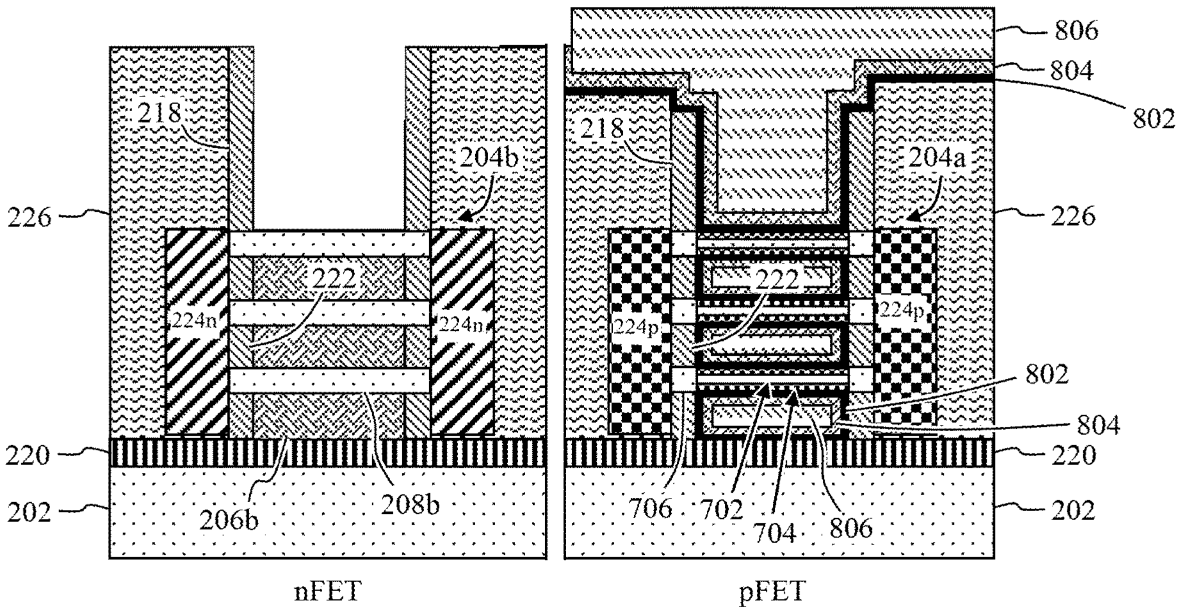
FIG. 16B is an X1 cross-sectional view.
FIG. 16C is an X2 cross-sectional view illustrating exposed portions of the first gate dielectric cap in the nFET region of the wafer and what remains of the second hardmask having been removed according to an embodiment of the present invention.

As shown in FIG. 16A (a Y cross-sectional view), FIG. 16B (an X1 cross-sectional view), and FIG. 16C (an X2 cross-sectional view), exposed portions of the gate dielectric cap 704 (including those portions of the gate dielectric cap 704 present along the sidewall of sacrificial placeholder 806 in the nFET region of the wafer 202) are then removed. The gate dielectric 802 and gate dielectric cap 804 are now present only in the pFET region of the wafer 202. As provided above, the gate dielectric cap 704 can be formed from a metal nitride material such as TiN and/or TaN. In that case, a nitride-selective etching processes can be employed to remove the gate dielectric cap 804. As provided above, the hardmask 1002 can be formed from a nitride and/or an oxide material such as SiN, $SiO_2$, TiN and/or SiON. Thus, embodiments are contemplated herein where the nitride-selective etching process to remove the gate dielectric cap 804 also removes the remaining hardmask 1002 or, alternatively, where successive nitride- and oxide-selective etching processes are used to remove the gate dielectric cap 804 and the remaining hardmask 1002, respectively, depending on the composition of the hardmask 1002.

Figure 17A:
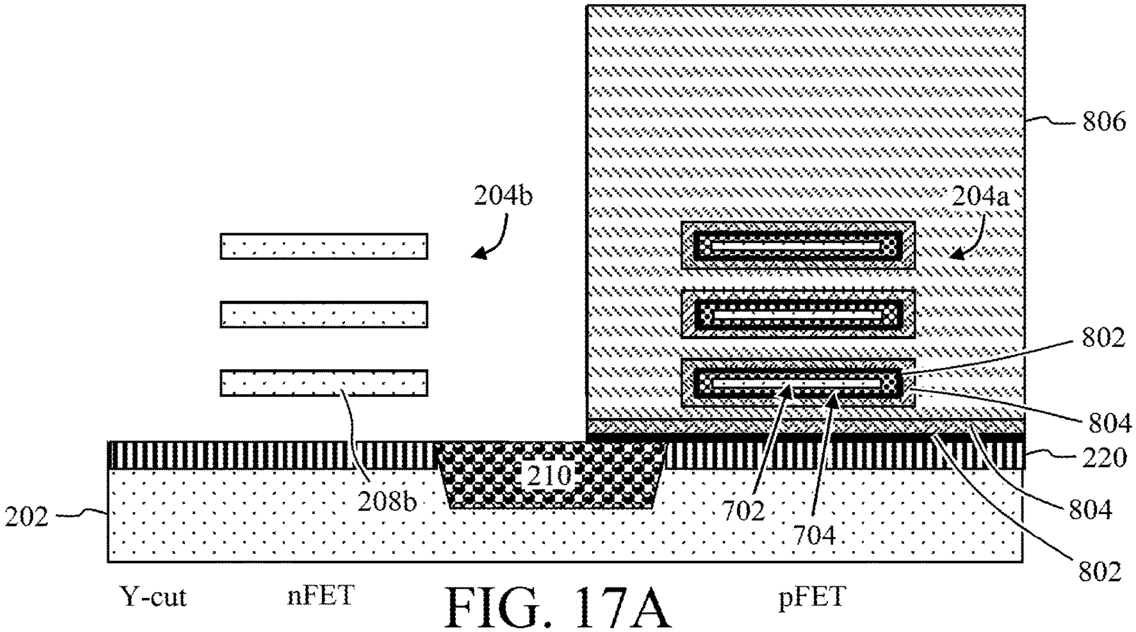
FIG. 17A is a Y cross-sectional view.
Figure 17B:
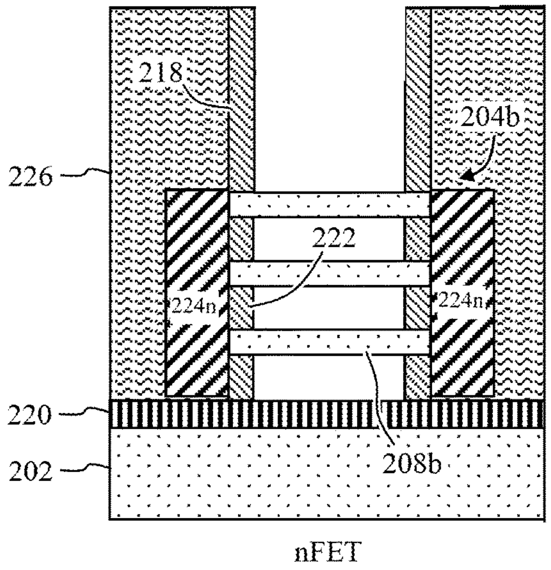
FIG. 17B is an X1 cross-sectional view.
Figure 17C:
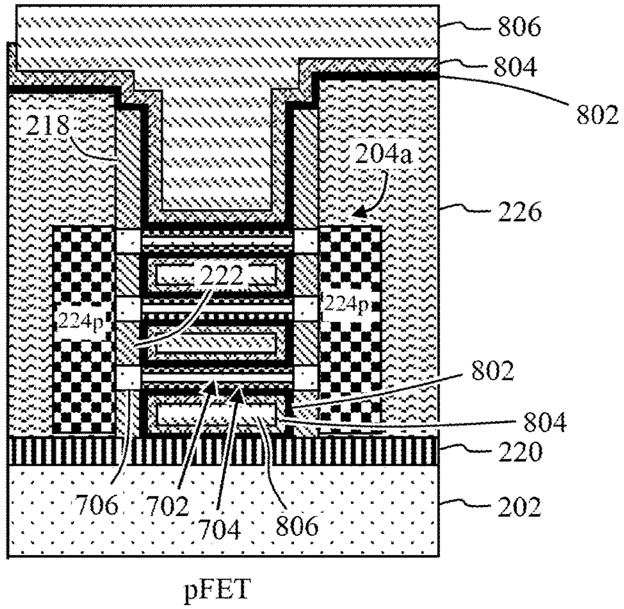
FIG. 17C is an X2 cross-sectional view illustrating the sacrificial layers in the second device stack having been selectively removed according to an embodiment of the present invention.

As shown in FIG. 17A (a Y cross-sectional view), FIG. 17B (an X1 cross-sectional view), and FIG. 17C (an X2 cross-sectional view), the now-exposed sacrificial layers 206*b* in the device stack 204*b* are then removed selective to the active layers 208*b*. According to an exemplary embodiment, sacrificial layers 206*b* are formed from SiGe, while active layers 208*b* are formed from Si. In that case, etchants such as wet hot SC1, vapor phase HCl, vapor phase $ClF_3$ and/or other reactive clean processes can be employed to remove the sacrificial layers 206*b* selective to the active layers 208*b*. Removal of the sacrificial layers 206*b* releases the active layers 208*b* from the device stack 204*b*. As highlighted above, these 'released' active layers 208*b* will be used to form the channels of the nFET transistor(s).

Figure 18A:
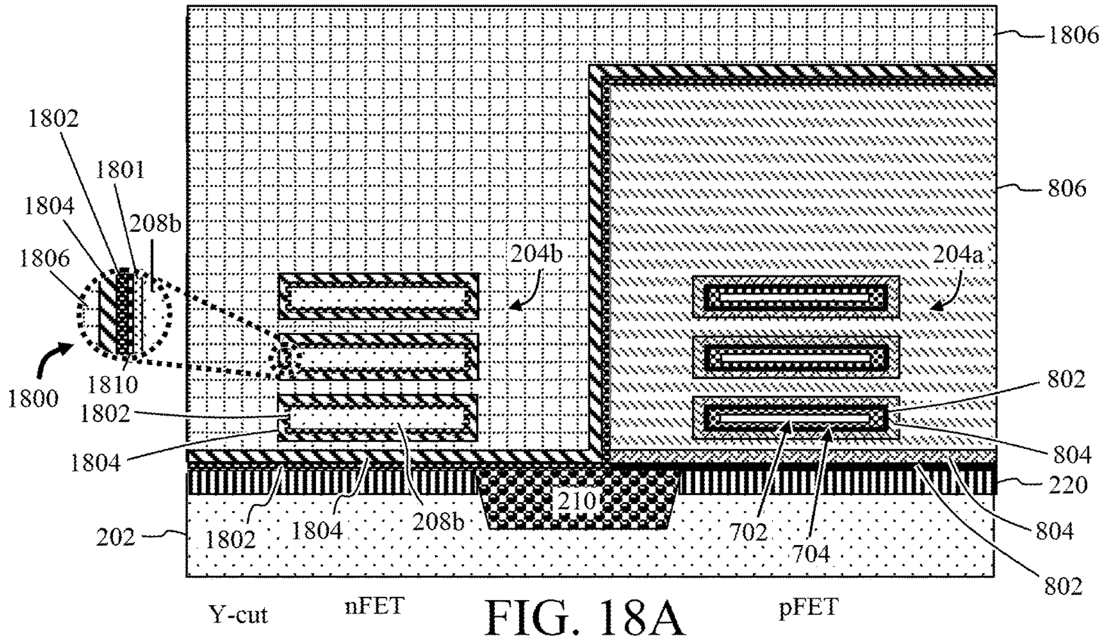
FIG. 18A is a Y cross-sectional view.
Figures 18B, 18C:
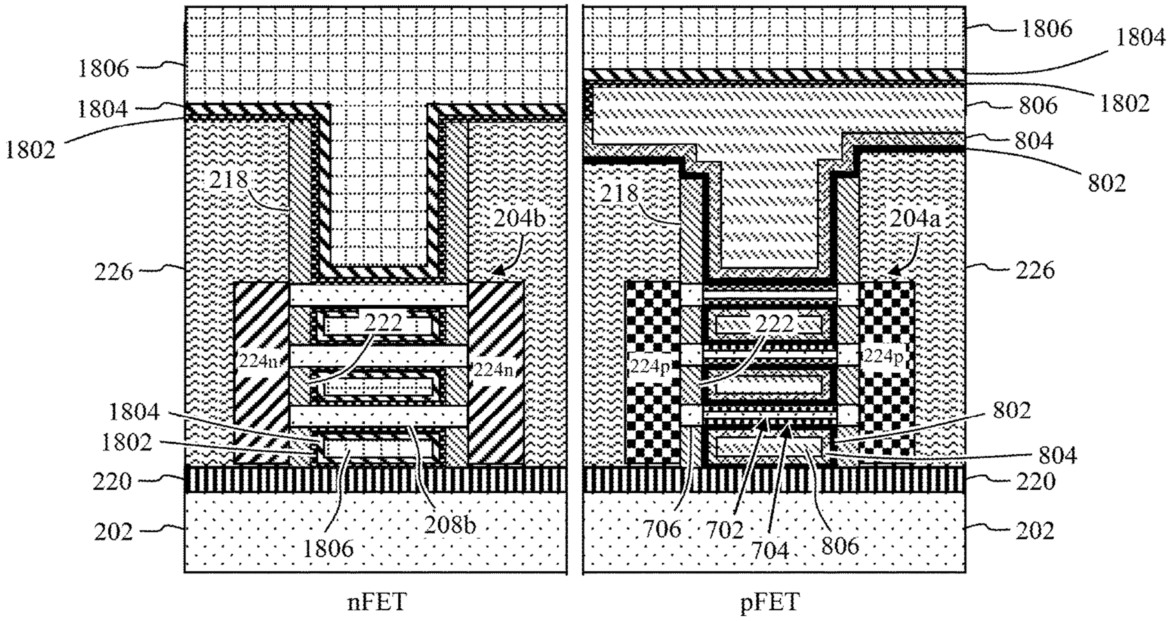
FIG. 18B is an X1 cross-sectional view.
FIG. 18C is an X2 cross-sectional view illustrating a (second) gate dielectric and a (second) gate dielectric cap having been deposited onto, and surrounding, the active layers of the second device stack, and a (second) sacrificial placeholder having been deposited over the second gate dielectric/second gate dielectric cap according to an embodiment of the present invention.

As shown in FIG. 18A (a Y cross-sectional view), FIG. 18B (an X1 cross-sectional view), and FIG. 18C (an X2 cross-sectional view), a (second) gate dielectric 1802 and a (second) gate dielectric cap 1804 are next deposited onto, and surrounding, the active layers 208*b* of the device stack 204*b*, and a (second) sacrificial placeholder 1806 is deposited over the gate dielectric 1802/gate dielectric cap 1804. As shown in FIGS. 18A-C, deposition of the gate dielectric 1802 and gate dielectric cap 1804 in this manner also deposits these materials on the exposed surface of the wafer 202 beneath the device stack 204*b*, as well as on the top and sidewalls of the sacrificial placeholder 806 which is present over the device stack 204*a*.

Referring to magnified view 1800 in FIG. 18A, prior to depositing the gate dielectric 1802, a (second) interfacial layer 1801 is preferably first formed on the active layers 208*b*. Use of an interfacial layer 1801 improves the channel/gate dielectric interface quality and channel carrier mobility. Suitable materials for the interfacial layer 1801 include but are not limited to oxide materials such as SiOx. According to an exemplary embodiment, the interfacial layer 1801 has a thickness of from about 0.5 nm to about 3 nm and ranges therebetween.

According to an exemplary embodiment, the thickness and/or composition of the interfacial layer 1801 and/or the gate dielectric 1802 in the nFET transistor differs from the thickness and/or composition of the interfacial layer 801 and/or the gate dielectric 802 in the pFET transistor. For instance, an optional dipole layer 1810 can be deposited onto the interfacial layer 1801 prior to the gate dielectric 1802. A subsequent reliability anneal (see below) will also serve to diffuse the metal or metals from the dipole layer 1810 into (i.e., doping) the interfacial layer 1801 and gate dielectric 1802. Doing so can be used to tune the threshold voltage of the nFET transistor relative to the pFET transistor, or vice versa. As a result, the device will have different nFET and pFET threshold voltages, and potentially different nFET threshold voltages for different nFET transistors such as high threshold voltage nFET transistors and low threshold voltage nFET transistors. Suitable metals for the dipole layer 1810 include, but are not limited to, La, Y, Mg and/or Ga. By way of example only, the dipole layer 1810 can have a thickness of from about 0.5 Å to about 30 Å. Following the reliability anneal (performed below), the interfacial layer 1801 and the gate dielectric 1802 will each contain at least one dipole dopant, e.g., La, Y, Mg and/or Ga. Preferably, different dipole dopants are used in the pFET versus nFET interfacial layer/gate dielectric in order to achieve different threshold voltages. However, as highlighted above, the use of the dipole layer 1810 is optional, and embodiments are contemplated herein where the (nFET) interfacial layer 1801 and/or gate dielectric 1802 are undoped.

Additionally, the interfacial layer 1801 and/or the gate dielectric 1802 in the nFET transistor can optionally receive different (e.g., nitridation) treatments from the interfacial layer 801 and/or the gate dielectric 802 in the pFET transistor in order to improve device performance. For example, according to an exemplary embodiment, a nitridation treatment is performed on the interfacial layer 1801 and/or the gate dielectric 1802 in the nFET transistor before depositing the gate dielectric cap 1804 to boost the capacitance and thereby improve device performance. As described above, a nitridation treatment may also be performed for the pFET interfacial layer 801 and/or the gate dielectric 802, however the nitrogen concentration in the nFET the interfacial layer 1801 and/or the gate dielectric 1802 is preferably higher than that in the pFET interfacial layer 801 and/or the gate dielectric 802.

Furthermore, even if the same material (e.g., $HfO_2$) is used as the gate dielectric 1802 in the nFET transistor and as the gate dielectric 802 in the pFET transistor, embodiments are contemplated herein where the gate dielectric 1802 used in the nFET transistor is thicker than gate dielectric 802 used in the pFET transistor. For example, as will be described in detail below, the thickness of the nFET gate dielectric 1802 is preferably from about 1 Å to about 2 Å greater than the thickness of the pFET gate dielectric 802.

According to an exemplary embodiment, the gate dielectric 1802 is a high-k material such as $HfO_2$, $La_2O_3$, $HfLaO_2$, $HfZrO_2$ and/or $HfAlO_2$. A process such as CVD, ALD or PVD can be employed to deposit the gate dielectric 1802. According to an exemplary embodiment, gate dielectric 1802 has a thickness of from about 1 nm to about 5 nm and ranges therebetween. As highlighted above, the composition of the gate dielectric 1802 can differ from that of the gate dielectric 802. For instance, according to an exemplary embodiment, the (nFET) gate dielectric 1802 is $HfLaO_2$, whereas the (pFET) gate dielectric 802 is $HfZrO_2$ and/or HfAlOx. It is notable, however, that employing different pFET and nFET gate dielectrics 802 and 1802, respectively, is not a requirement, and embodiments are contemplated herein where the gate dielectric 802 and gate dielectric 1802 have the same composition and/or thickness as one another.

Suitable materials for the gate dielectric cap 1804 include, but are not limited to, metal nitrides such as TiN and/or TaN, which can be deposited using a process such as CVD, ALD or PVD. According to an exemplary embodiment, the gate dielectric cap 1804 has a thickness of from about 1 nm to about 10 nm and ranges therebetween. The gate dielectric cap 1804 will serve to protect the gate dielectric 1802 during subsequent processing steps including during removal of the sacrificial placeholder 1806.

Suitable materials for the sacrificial placeholder 1806 include, but are not limited to, poly-silicon and/or amorphous silicon. A process such as CVD, ALD or PVD can be employed to deposit the sacrificial placeholder 1806 material over the gate dielectric 1802/gate dielectric cap 1804. As will be described in detail below, the sacrificial placeholder 1806 will be removed later on in the process, and replaced with the workfunction-setting metal(s) and optional fill metal(s) to complete the replacement metal gate of (in this case) the nFET transistor.

Figure 19A:
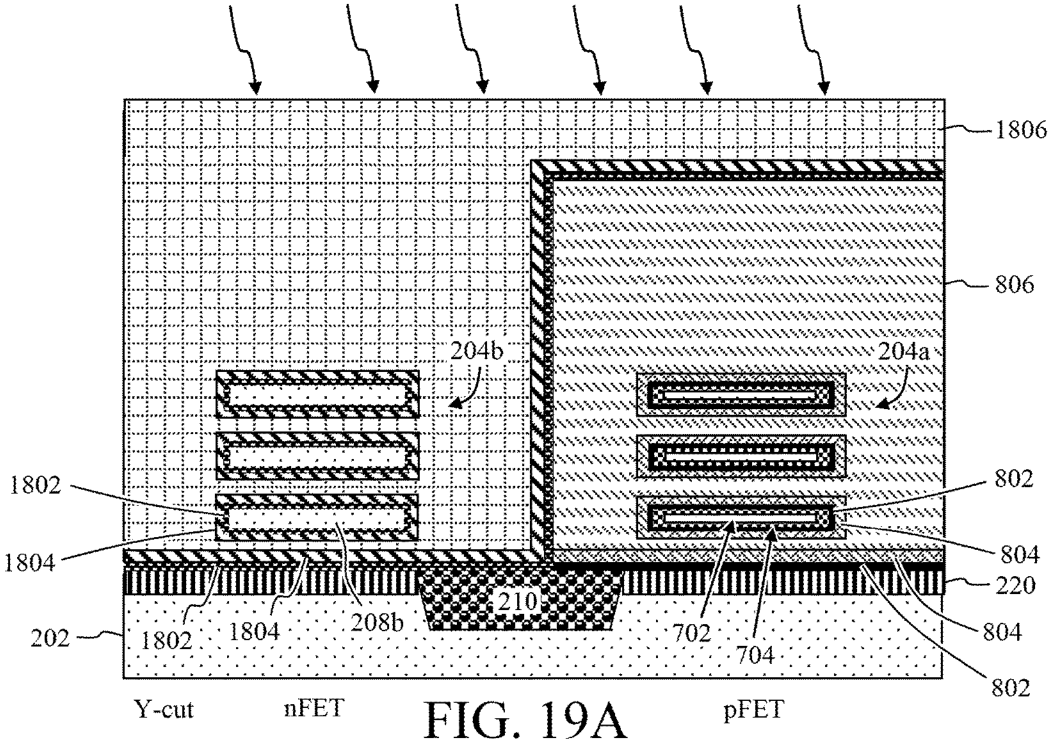
FIG. 19A is a Y cross-sectional view.
Figures 19B, 19C:
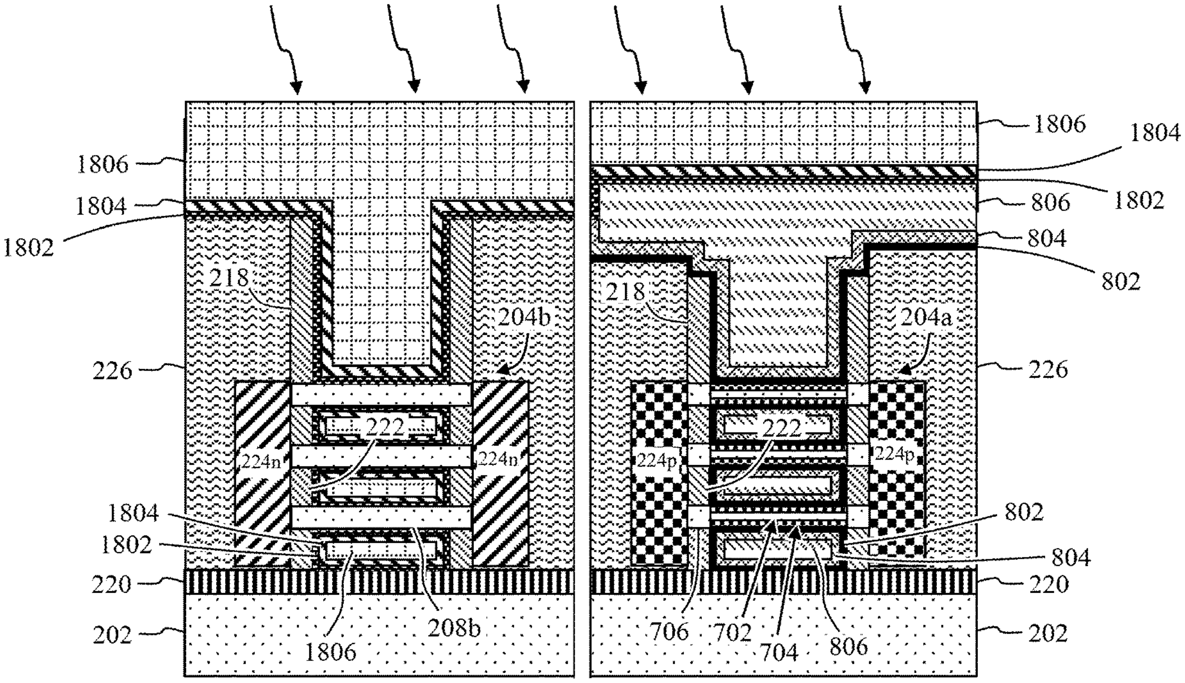
FIG. 19B is an X1 cross-sectional view.
FIG. 19C is an X2 cross-sectional view illustrating a reliability anneal being performed according to an embodiment of the present invention.

As shown in FIG. 19A (a Y cross-sectional view), FIG. 19B (an X1 cross-sectional view), and FIG. 19C (an X2 cross-sectional view), a reliability anneal is performed. According to an exemplary embodiment, the reliability anneal is performed at a temperature of from about 500° C. to about 1200° C. and ranges therebetween, for a duration of from about 1 nanosecond to about 30 seconds and ranges therebetween. Preferably, the reliability anneal is performed in the presence of an inert gas such as, but not limited to, nitrogen. As highlighted above, dipole layer 810 and/or dipole layer 1810 can optionally be implemented in the pFET and nFET transistors, respectively. The reliability anneal serves to diffuse the metal or metals from the dipole layer 810 and/or dipole layer 1810 into the interfacial layer 801/gate dielectric 802 and/or the interfacial layer 1801/gate dielectric 1802, respectively.

As shown in FIG. 20A (a Y cross-sectional view), FIG. 20B (an X1 cross-sectional view), and FIG. 20C (an X2 cross-sectional view), the sacrificial placeholder 1806 and the gate dielectric cap 1804 are then selectively removed from the nFET region of the wafer 202, exposing the underlying gate dielectric 1802. As provided above, the sacrificial placeholder 1806 can be formed from poly-silicon and/or amorphous silicon, and the gate dielectric cap 1804 can be formed from a metal nitride material such as TiN and/or TaN. In that case, a poly-silicon and/or amorphous silicon-selective etch can be employed to remove the sacrificial placeholder 1806, followed by a nitride-selective etch to remove the gate dielectric cap 1804. As shown in FIGS. 20A-C, the sacrificial placeholder 806 remains over the device stack 204*a* in the pFET region of the wafer 202.

Figure 21A:
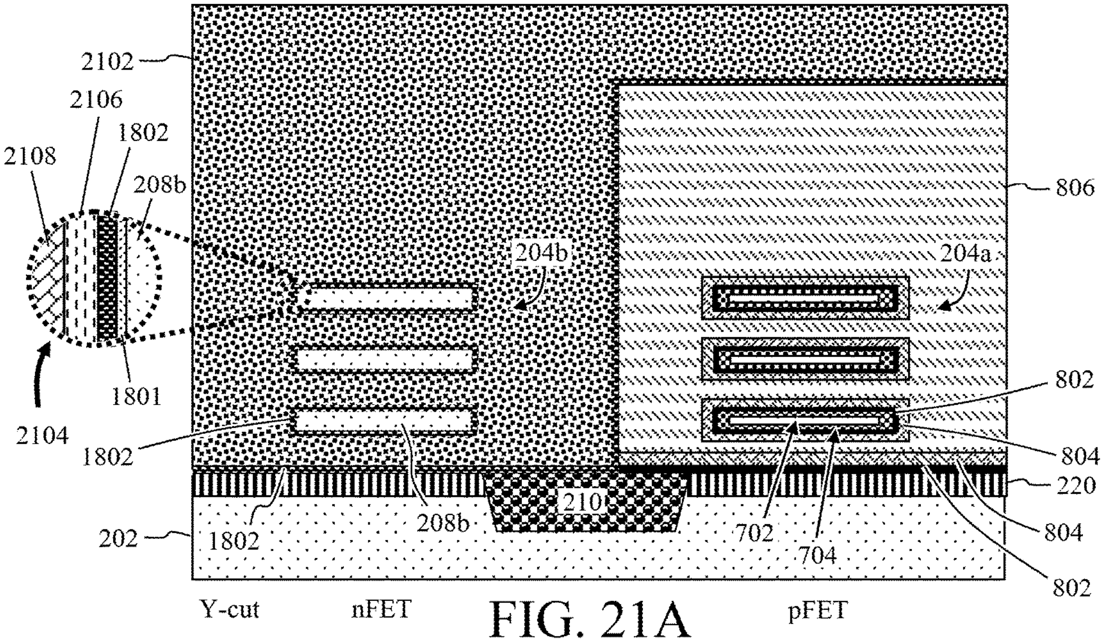
FIG. 21A is a Y cross-sectional view.
Figures 21B, 21C:
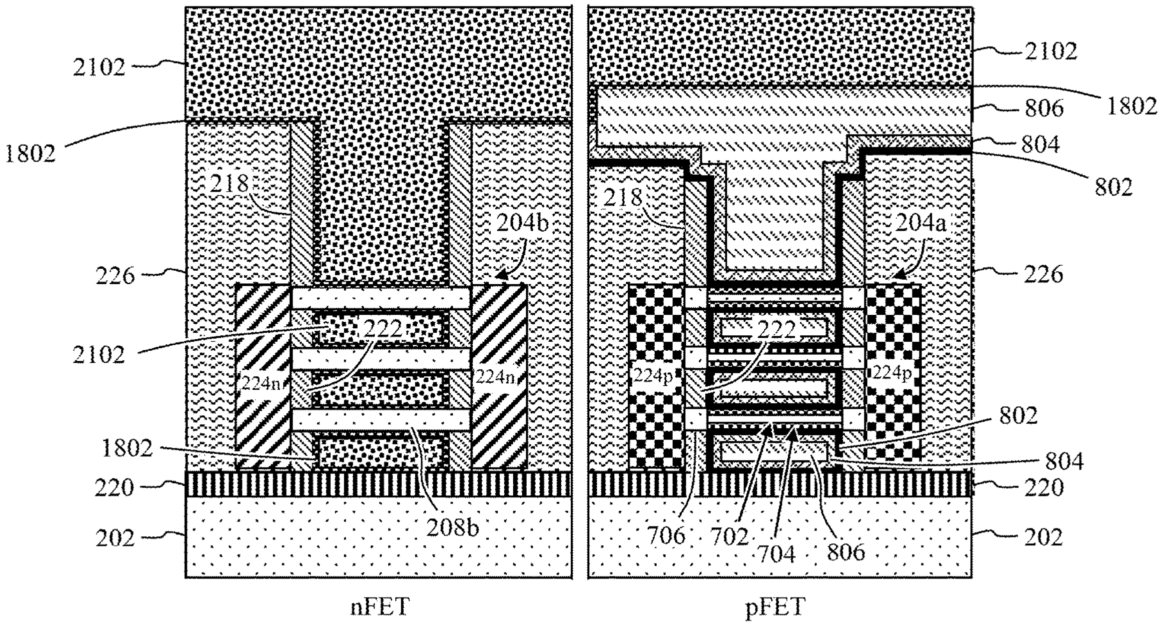
FIG. 21B is an X1 cross-sectional view.
FIG. 21C is an X2 cross-sectional view illustrating an (nFET) gate electrode having been formed on the second gate dielectric surrounding a portion of each of the active layers in the second device stack in a gate all around configuration according to an embodiment of the present invention.
Figure 22A:
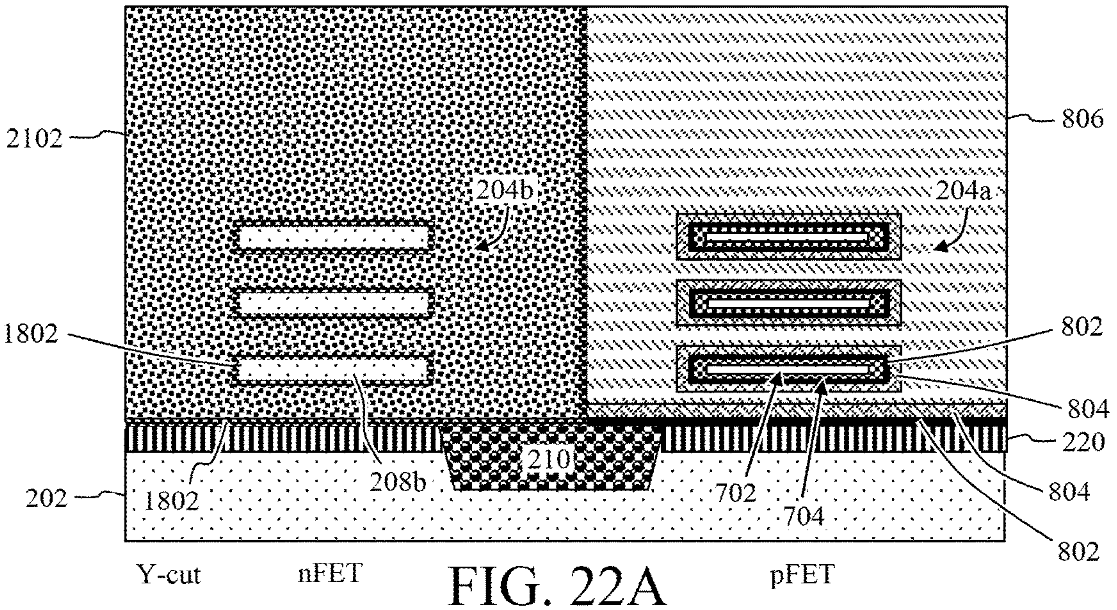
FIG. 22A is a Y cross-sectional view.
Figures 22B, 22C:
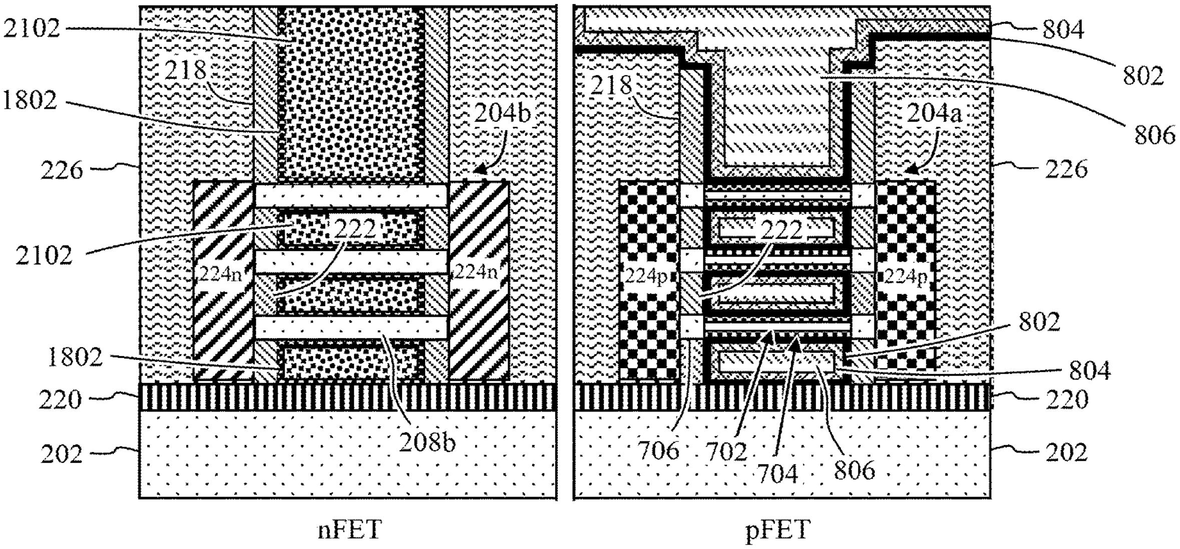
FIG. 22B is an X1 cross-sectional view.
FIG. 22C is an X2 cross-sectional view illustrating the nFET gate electrode and second gate dielectric having been recessed down to the first sacrificial placeholder according to an embodiment of the present invention.

As shown in FIG. 21A (a Y cross-sectional view), FIG. 21B (an X1 cross-sectional view), and FIG. 21C (an X2 cross-sectional view), an nFET gate electrode 2102 is formed on the gate dielectric 1802 surrounding a portion of each of the active layers 208*b* in a gate all around configuration. As shown in magnified view 2104 in FIG. 21A, nFET gate electrode 2102 includes at least one workfunction-setting metal 2106 disposed on the gate dielectric 1802, and an optional (low-resistance) fill metal 2108 disposed on the workfunction-setting metal(s) 2106.

Suitable (n-type) workfunction-setting metals 2106 include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC), and/or titanium (Ti)-containing alloys such as titanium carbide (TiC) and/or tantalum titanium (TaTi). It is notable, however, that this is not an exhaustive list and that these workfunction-setting metals are not meant to be exclusive to transistors of one polarity, e.g., TiAlC can be implemented as a workfunction-setting metal in both nFET and pFET transistors—see below. A process such as CVD, ALD or PVD can be employed to deposit the workfunction-setting metal(s) 2106. As will be described in detail below, the thickness and/or composition of the workfunction-setting metal(s) 2106 in the nFET transistor can differ from the thickness and/or composition of the workfunction-setting metal(s) in the pFET transistor (see below).

Suitable low-resistance fill metals 2108 include, but are not limited to, W, cobalt (Co), ruthenium (Ru) and/or Al. The low-resistance fill metals 2108 can be deposited using a process or combination of processes including, but not limited to, CVD, ALD, PVD, sputtering, plating, evaporation, ion beam deposition, electron beam deposition, laser assisted deposition, chemical solution deposition, etc.

As such, according to the above-described exemplary embodiment, the nFET replacement metal gate includes an interfacial layer 1801 disposed on the active layers 208*b* of the device stack 204*b* (in the nFET region of the wafer 202), the gate dielectric 1802 surrounding the active layers 208*b* over the interfacial layer 1801, and the gate electrode 2102 disposed on the gate dielectric 1802 surrounding a portion of each of the active layers 208*b* in a gate all around configuration. The gate electrode 2102 includes the at least one of workfunction-setting metal(s) 2106 disposed on the gate dielectric 1802, and the optional (low-resistance) fill metal 2108 disposed on the workfunction-setting metal(s) 2106.

As shown in FIGS. 21A-C, the as-deposited nFET gate electrode 2102 extends over the pFET region of the wafer 202. However, a recess of the nFET gate electrode 2102 is next performed to remove the overburden from the pFET region of the wafer 202. Namely, as shown FIG. 22A (a Y cross-sectional view), FIG. 22B (an X1 cross-sectional view), and FIG. 22C (an X2 cross-sectional view), the nFET gate electrode 2102 and gate dielectric 1802 are recessed down to the sacrificial placeholder 806. This recessing of the nFET gate electrode 2102 and gate dielectric 1802 can be performed using a process such as chemical mechanical polishing or reactive ion etching.

Figure 23A:
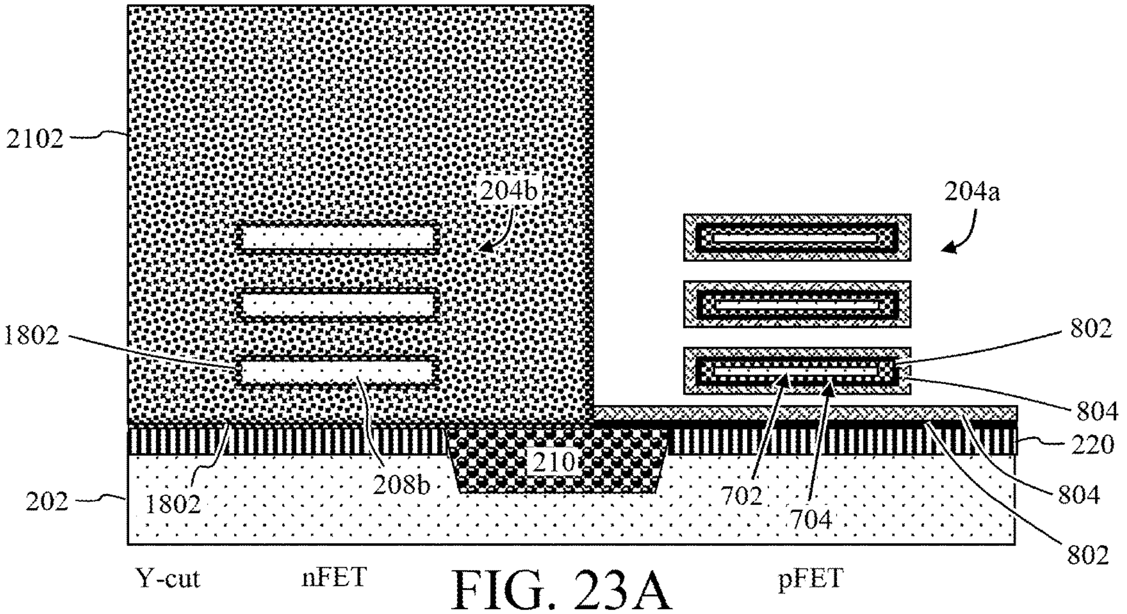
FIG. 23A is a Y cross-sectional view.
Figures 23B, 23C:
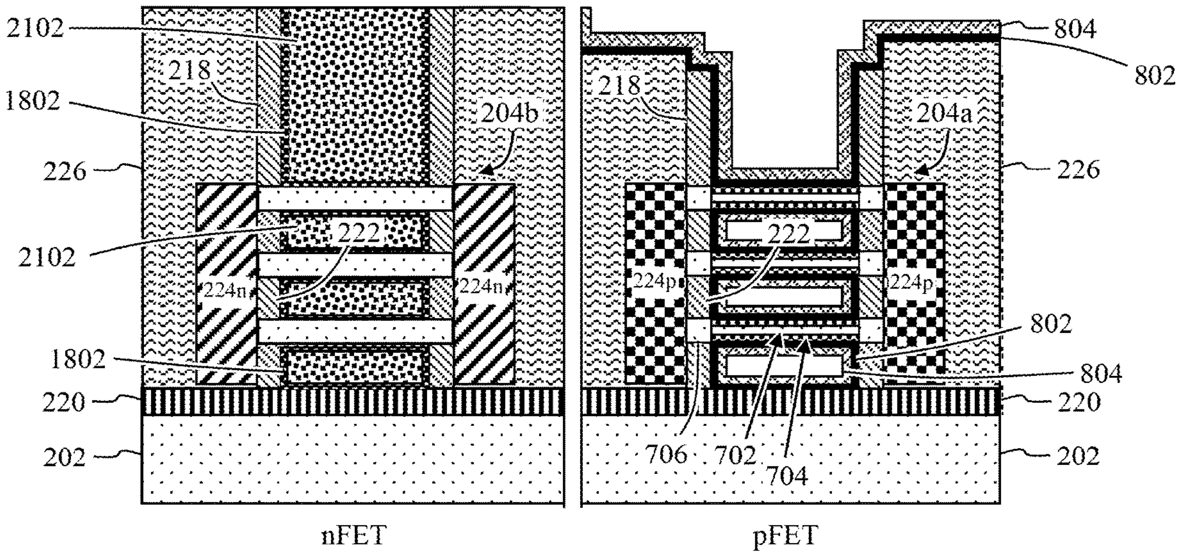
FIG. 23B is an X1 cross-sectional view.
FIG. 23C is an X2 cross-sectional view illustrating the first sacrificial placeholder having been selectively removed according to an embodiment of the present invention.

Removal of the nFET gate electrode 2102 and gate dielectric 1802 from the pFET regions of the wafer 202 exposes the underlying sacrificial placeholder 806 which, as shown in FIG. 23A (a Y cross-sectional view), FIG. 23B (an X1 cross-sectional view), and FIG. 23C (an X2 cross-sectional view), is then selectively removed. As provided above, the sacrificial placeholder 806 can be formed from poly-silicon and/or amorphous silicon. In that case, a poly-silicon and/or amorphous silicon-selective etch can be employed to remove the sacrificial placeholder 806.

Figure 24A:
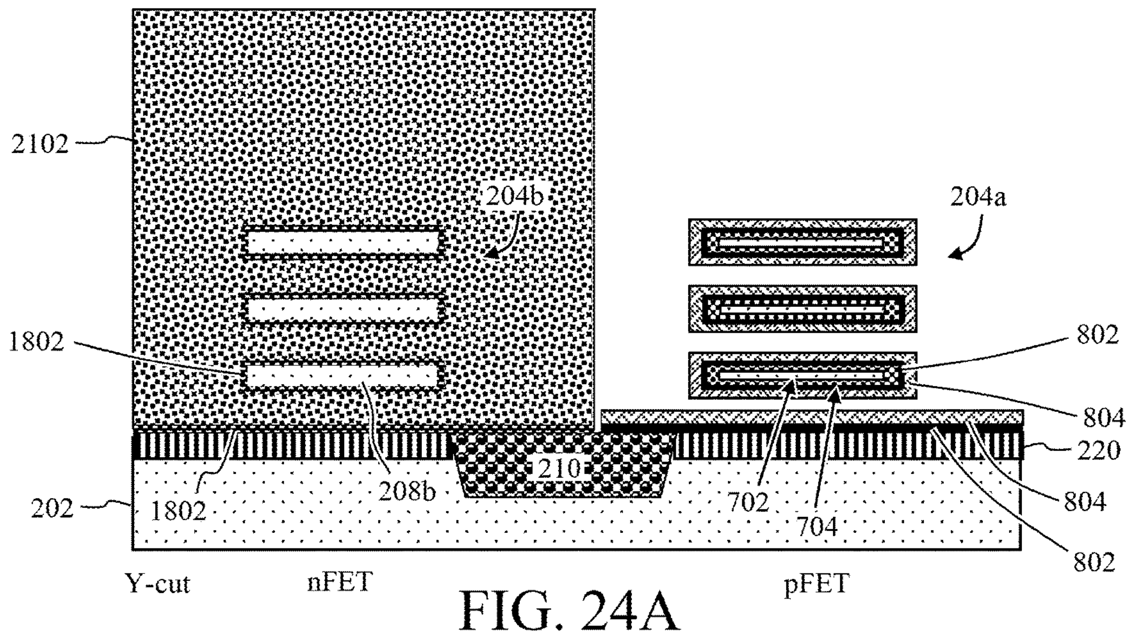
FIG. 24A is a Y cross-sectional view.
Figure 24B:
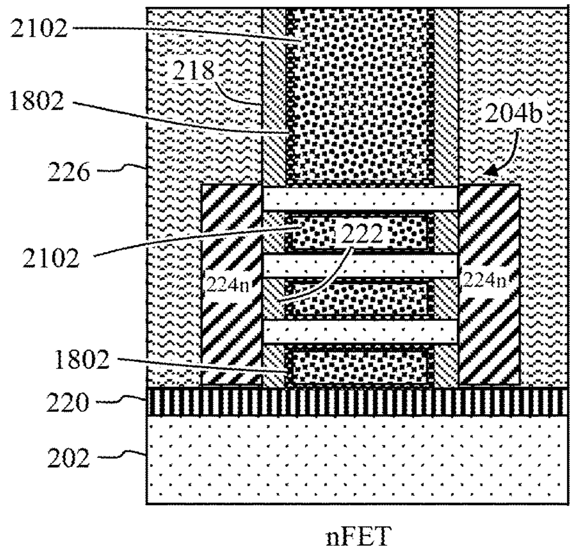
FIG. 24B is an X1 cross-sectional view.
Figure 24C:
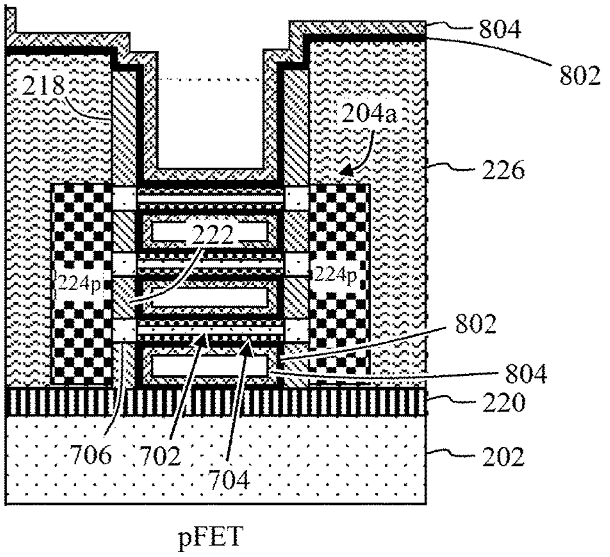
FIG. 24C is an X2 cross-sectional view illustrating exposed portions of the second gate dielectric having been removed according to an embodiment of the present invention.

As shown in FIG. 24A (a Y cross-sectional view), FIG. 24B (an X1 cross-sectional view), and FIG. 24C (an X2 cross-sectional view), portions of the gate dielectric 1802 exposed after removal of the sacrificial placeholder 806, including those portions along the sidewall of the nFET gate electrode 2102, are then removed. As provided above, the gate dielectric 1802 can be formed from $HfO_2$ and/or $La_2O_3$. In that case, an oxide-selective etching process can be employed to remove the exposed gate dielectric 1802.

Figure 25A:
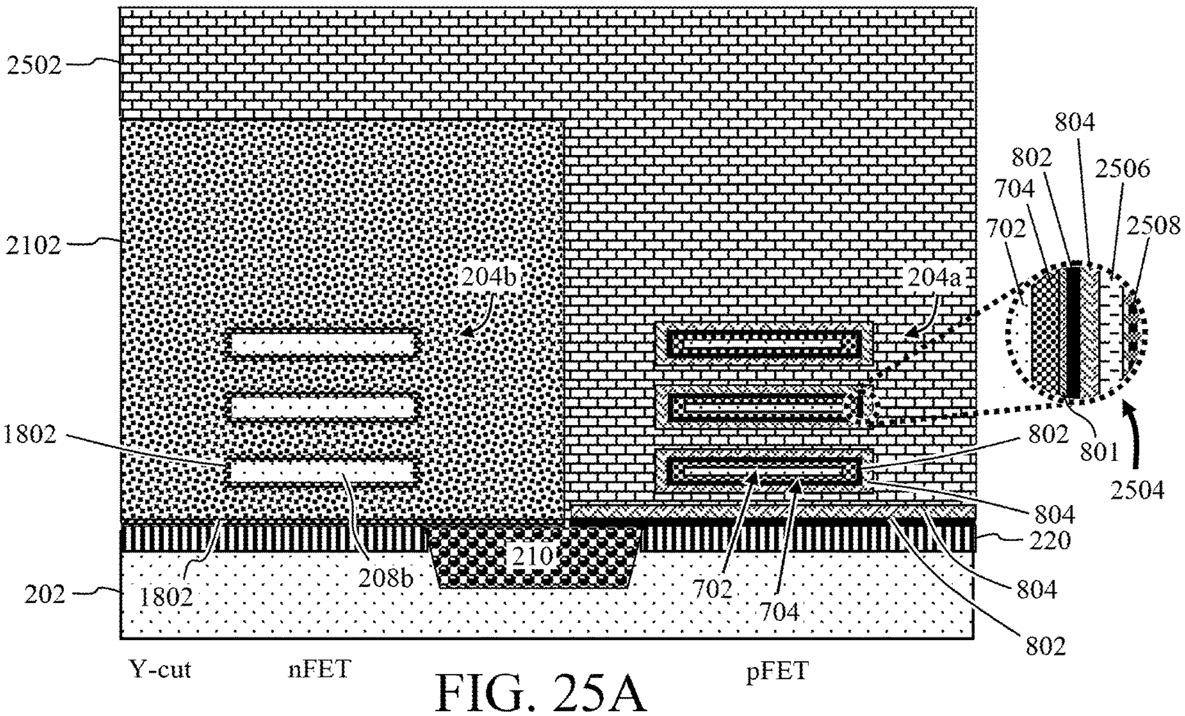
FIG. 25A is a Y cross-sectional view.
Figures 25B, 25C:
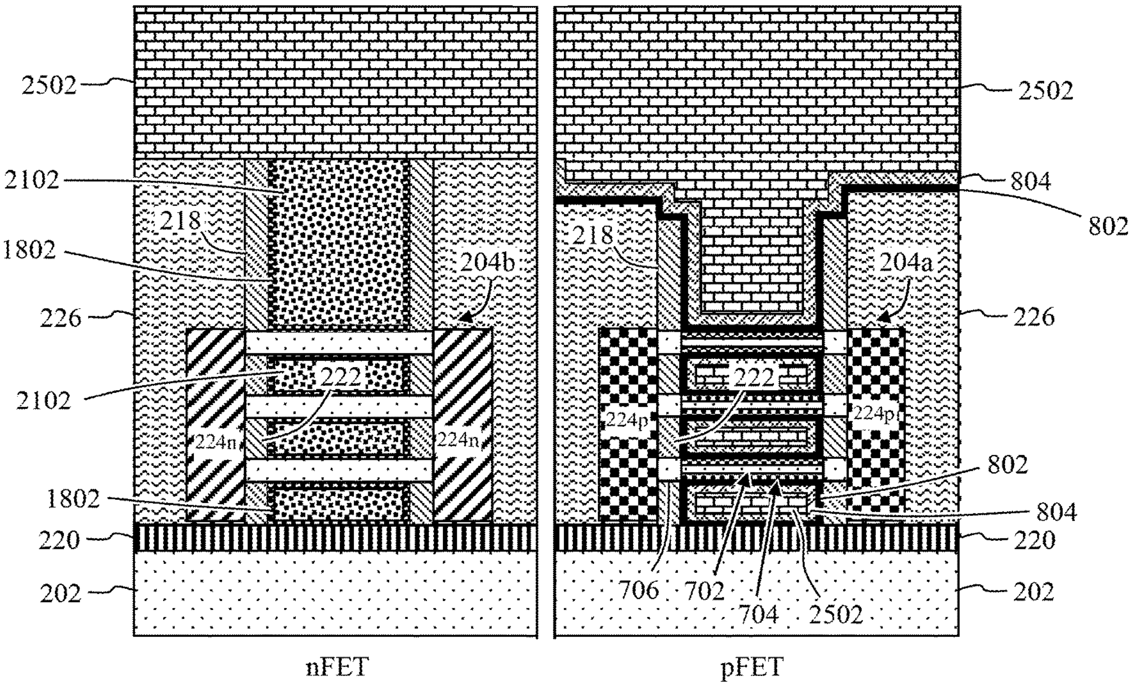
FIG. 25B is an X1 cross-sectional view.
FIG. 25C is an X2 cross-sectional view illustrating a (pFET) gate electrode having been formed on the first gate dielectric/first gate dielectric cap surrounding the core/cladding portions of the (pFET) channels of the first device stack in a gate all around configuration according to an embodiment of the present invention.

As shown in FIG. 25A (a Y cross-sectional view), FIG. 25B (an X1 cross-sectional view), and FIG. 25C (an X2 cross-sectional view), a pFET gate electrode 2502 is formed on the gate dielectric 802/gate dielectric cap 804 surrounding the Si cores 702/SiGe cladding 704 portions of the (pFET) channels of device stack 204*a* in a gate all around configuration. For clarity, the terms 'first' and 'second' may also be used herein when referring to pFET gate electrode 2502 and nFET gate electrode 2102, respectively. As shown in magnified view 2504 in FIG. 25A, pFET gate electrode 2502 includes at least one workfunction-setting metal 2506 disposed on the gate dielectric cap 804, and an optional (low-resistance) fill metal 2508 disposed on the workfunction-setting metal(s) 2506. For clarity, the terms 'first' and 'second' may also be used herein when referring to workfunction-setting metal(s) 2506 and workfunction-setting metal(s) 2106, respectively.

Suitable (p-type) workfunction-setting metals 2506 include, but are not limited to, metal nitrides (such as TiN and/or TaN) and/or tungsten (W). A process such as CVD, ALD or PVD can be employed to deposit the workfunction-setting metal(s) 2506. In another embodiment, aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC) or titanium (Ti)-containing alloys such as titanium carbide (TiC), tantalum titanium (TaTi) are used to modulate the threshold voltage, in order to compensate for the band offset in SiGe. Namely, the germanium (Ge) concentration in SiGe is going to tune the pFET threshold voltage. For instance, a high Ge concentration will significantly reduce the pFET threshold voltage. Thus, to use a non-limiting example to clarify this concept, pure TiN can be used as the workfunction-setting metal for a pure Si channel. However, if pure TIN is used as the workfunction-setting metal for Si75Ge25, the threshold voltage will be too low (~200 mV lower than a pure Si channel). In order to set the correct threshold voltage for Si75Ge25, a TiN/TiAlC/TiN stack (i.e., an nFET workfunction-setting metal-like stack) may be used.

Notably, as highlighted above, the present techniques advantageously enable independently configurable replacement metal gates in the pFET and nFET transistors since there is no overlap in materials between the pFET and nFET replacement metal gates. For example, the workfunction-setting metal(s) 2506 used in the pFET transistor are wholly distinct from those workfunction-setting metal(s) 2106 used in the nFET transistor. This selective tuning of the workfunction-setting metals 2106 and 2506 can also be coupled with the selection of interfacial layers 801 and 1801 and/or gate dielectrics 802 and 1802 that are unique (in composition, thickness, etc.) to the respective pFET and nFET transistors as described in detail above.

According to an exemplary embodiment, the workfunction-setting metal(s) 2106 in the nFET transistor differ in composition and/or thickness from the workfunction-setting metal(s) 2506 in the pFET transistor, and vice versa. For instance, to use an illustrative, non-limiting example, both the workfunction-setting metal(s) 2106 in the nFET transistor and the workfunction-setting metal(s) 2506 in the pFET transistor can both include TiAlC. However, the thickness of the TiAlC in the pFET is preferably less than the thickness of the TiAlC in the nFET. Further, when used as the pFET workfunction-setting metal, the concentration of Al in the TiAlC is preferably lower than when it is used as nFET workfunction-setting metal. In another, non-limiting example, TiN/TiAlC/TIN can be employed as both the workfunction-setting metal(s) 2106 in the nFET transistor and as the workfunction-setting metal(s) 2506 in the pFET transistor. However, when used as the workfunction-setting metal(s) 2106 in the nFET transistor, 0.5 nmTiN/3 nm TiAlC/3 nm TiN may be implemented, whereas when used as the workfunction-setting metal(s) 2506 in the pFFT transistor, 5 nm TiN/2 nm TiAlC/4 nm TiN may be implemented.

Suitable low-resistance fill metals 2508 include, but are not limited to, W, Co, Ru and/or Al. The low-resistance fill metal 2508 can be deposited using a process or combination of processes including, but not limited to, CVD, ALD, PVD, sputtering, plating, evaporation, ion beam deposition, electron beam deposition, laser assisted deposition, chemical solution deposition, etc.

According to the above-described exemplary embodiment, the pFET replacement metal gate includes an interfacial layer 801 disposed on the Si cores 702/SiGe cladding 704 of the device stack 204*a* (in the pFET region of the wafer 202), the gate dielectric 802 disposed over the interfacial layer 801, and the gate electrode 2502 disposed on the gate dielectric 802 surrounding the Si cores 702/SiGe cladding 704 portions of the (pFET) channels in a gate all around configuration. The gate electrode 2502 includes the at least one of workfunction-setting metal(s) 2506 disposed on the gate dielectric 802, and the optional (low-resistance) fill metal 2508 disposed on the workfunction-setting metal(s) 2506.

As shown in FIGS. 25A-C, the as-deposited pFET gate electrode 2502 extends over the nFET region of the wafer 202. However, a recess of the pFET gate electrode 2502 is next performed to remove the overburden from the nFET region of the wafer 202. Namely, as shown FIG. 26A (a Y cross-sectional view), FIG. 26B (an X1 cross-sectional view), and FIG. 26C (an X2 cross-sectional view), the pFET gate electrode 2502 is recessed down to the nFET gate electrode 2102 using a process such as chemical mechanical polishing or reactive ion etching.

Figure 26A:
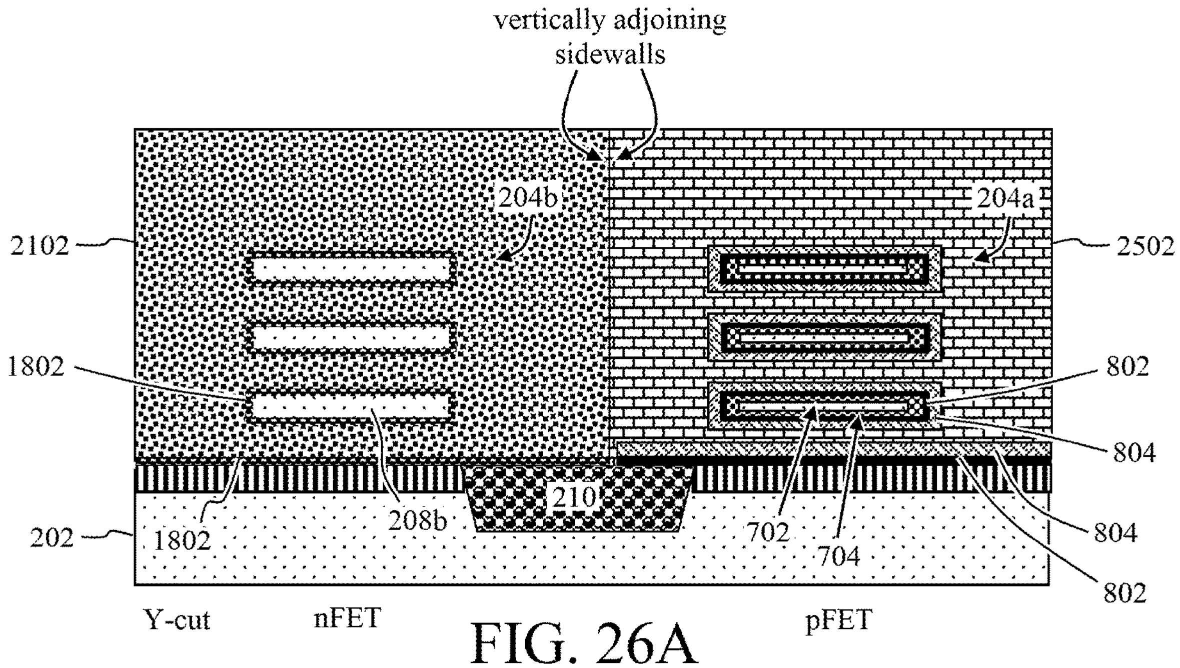
FIG. 26A is a Y cross-sectional view.
Figures 26B, 26C:
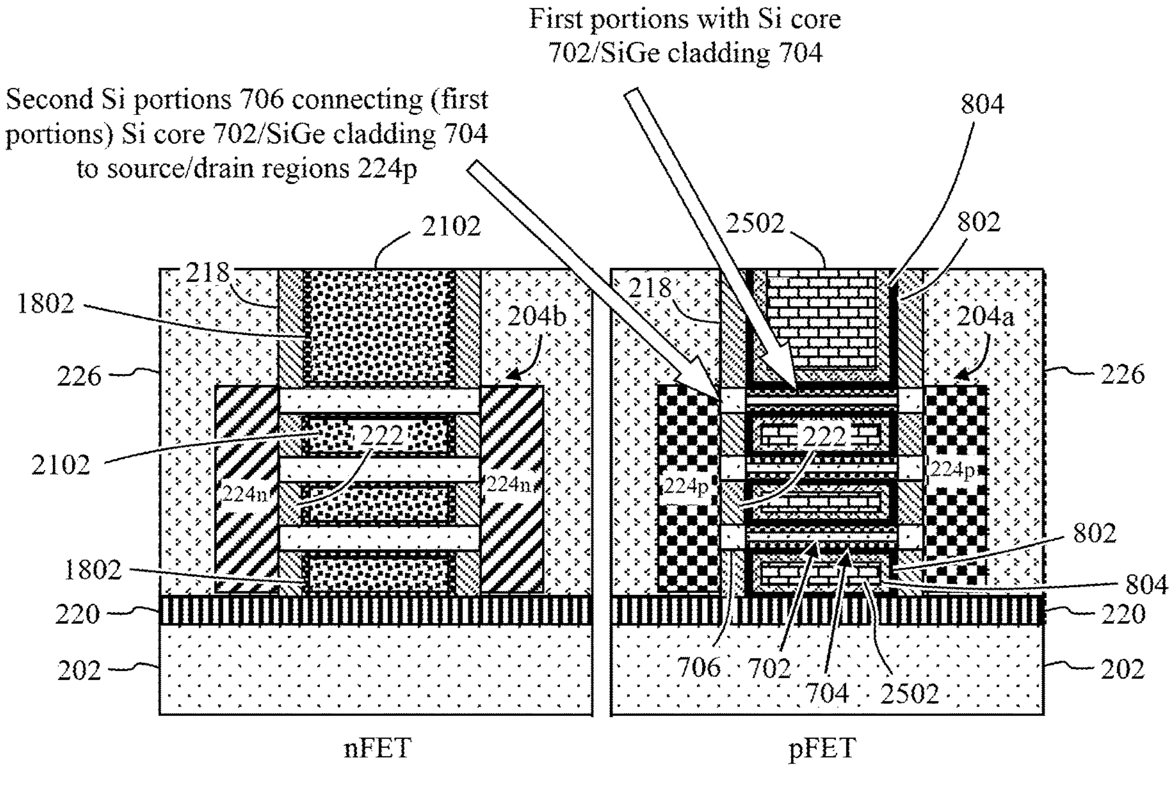
FIG. 26B is an X1 cross-sectional view.
FIG. 26C is an X2 cross-sectional view illustrating the pFET gate electrode having been recessed down to the nFET gate electrode according to an embodiment of the present invention.

As shown in FIGS. 26A-C, the nFET gate electrode 2102 directly contacts the pFET gate electrode 2502. Notably, however, based on the above-described process, the nFET gate electrode 2102 and the pFET gate electrode 2502 do not overlap one another (i.e., the nFET gate electrode 2102 and the pFET gate electrode 2502 are in a non-overlapping position relative to one another). To look at it another way, the nFET gate electrode 2102 and the pFET gate electrode 2502 have a pair of straight vertically adjoining sidewalls in direct contact with one another. This would not be the case if any of the materials in the nFET gate electrode 2102 or the pFET gate electrode 2502 overlapped one another vertically, since that would result in both vertical and horizontal interfaces.

Further, as shown, e.g., in FIGS. 26B-C the pFET and nFET transistors each includes source/drain regions 224*p* and 224*n* on opposite sides of the pFET gate electrode 2502 and the nFET gate electrode 2102, respectively. For clarity, the terms 'first' and 'second' may also be used herein when referring to source/drain regions 224*p* and 224*n*, respectively. Device stack 204*a* (in the pFET region of the wafer 202) includes the (pFET) channels having (first) portions made up of the Si cores 702/SiGe cladding 704 (see, e.g., FIG. 7C), and (second) portions 706 (i.e., portions of the original active layers 208*a* under the dielectric spacers 218/inner spacers 222) that connect the first Si cores 702/SiGe cladding 704 portions to the source/drain regions 224*p*. Notably, based on the above-described process, these second portions 706 under the dielectric spacers 218/inner spacers 222 have a same composition as the cores 702. For example, both the cores 702 and the second portions 706 of the (pFET) channels are formed from Si. For instance, in one exemplary embodiment, the composition anywhere in the cores 702 and the second portions 706 of the pFET channels is only Si. By contrast, the (nFET) channels are unmodified, and thus remain the original active layers 208*b* of device stack 204*b*. As such, the nFET channels/active layers 208*b* also have the same composition as the second portions 706 and cores 702 in the (pFET) channels. For example, the cores 702, the second portions 706 of the (pFET) channels, and the active layers 208*b* of device stack 204*b* are all formed from Si. For instance, in one exemplary embodiment, the composition anywhere in the cores 702, the second portions 706 of the pFET channels and the active layers 208*b* of device stack 204*b* is only Si.

The pFET gate electrode 2502 surrounds the (first) Si cores 702/SiGe cladding 704 portions of the (pFET) channels in a gate all around configuration. By comparison, the nFET gate electrode 2102 surround a portion of each of the active layers 208*b* in a gate all around configuration. As provided above, a gate all around configuration advantageously enhances device performance. Further, in the exemplary embodiment shown illustrated in the figures, in the pFET transistor, both the gate dielectric 802 and the gate dielectric cap 804 are disposed on the (first) Si cores 702/SiGe cladding 704 portions of the (pFET) channels beneath the pFET gate electrode 2502. By contrast, in the nFET transistor, the gate dielectric 1802 is disposed on the stack of active layers 208*b* beneath the nFET gate electrode 2102 (i.e., as described above the gate dielectric cap 1804 has been removed from the nFET region of the wafer 202). Thus, in this example, the gate dielectric cap 804 remains present only in the pFET transistor.

In another exemplary embodiment, an alternative process flow is presented by way of reference to FIGS. 27-30 where, following the formation of the (first) Si cores 702/SiGe cladding 704 portions of the (pFET) channels (in the same manner as described above), an anneal of the semiconductor device is performed to create uniform SiGe throughout those first portions of the (pFET) channels as opposed to a core/cladding design. Advantageously, uniform SiGe can provide better threshold voltage uniformity and thus overall improved device performance. However, there might be a tradeoff in terms of channel stress reduction. The same Y, X1 and X2 cross-sectional views will be presented in the figures below, and thesc cross-sectional views follow the same corresponding orientations depicted in FIG. 1.

The process begins in the same manner as described in conjunction with the description of FIG. 1-FIGS. 17A-C above, including the formation of the pFET channels by thinning of the active layers 208*a* in device stack 204*a* to form (Si) cores 702 and epitaxial growth of the (SiGe) cladding 704 such that each of the pFET channels has a (first) portion with an Si core 702/SiGe cladding 704 connected to the source/drain regions 224*p* by the (second) Si-only portion 706. Thus, what is shown in FIGS. 27A-C follows from the structures described in conjunction with the description of FIGS. 17A-C, respectively, above, and like structures are numbered alike in the figures. In this case however, following removal of the sacrificial layers 206*b* in the device stack 204*b* selective to the active layers 208*b* in order to release the active layers 208*b* from the device stack 204*b*, an anneal of the semiconductor device is performed to make the composition of these first portions of the pFET channels uniformly SiGe (rather than having SiGe in a distinct cladding layer). See FIG. 26A (a Y cross-sectional view), FIG. 26B (an X1 cross-sectional view), and FIG. 26C (an X2 cross-sectional view).

According to an exemplary embodiment, this anneal is performed at a temperature of from about 600° C. to about 900° C. and ranges therebetween, which will modify the Si cores 702/SiGe cladding 704 by causing intermixing of the Ge atoms from the cladding 704 with the Si atoms from the cores 702. As provided above, implementation of SiGe in the pFET channel can vastly improve channel mobility. In one exemplary embodiment, this intermixing of the Ge atoms from the cladding 704 with the Si atoms from the cores 702 converts the first portions of the pFET channels from the Si cores 702/SiGe cladding 704 configuration to uniform SiGe 2702, meaning that (following the anneal) the composition anywhere in the first portions of the pFET channels is only SiGe. By comparison, the composition anywhere in the second portions 706 of the pFET channels is only Si.

As shown in FIGS. 27A-C, the semiconductor device in the present example has dual channels, one channel type (SiGe channel) for p-channel field-effect transistors (pFETs) and another channel type (Si channel) for n-channel field-effect transistors (nFETs). Namely, by way of the above-described process, the pFET channels now include uniform SiGe.

Figure 28A:
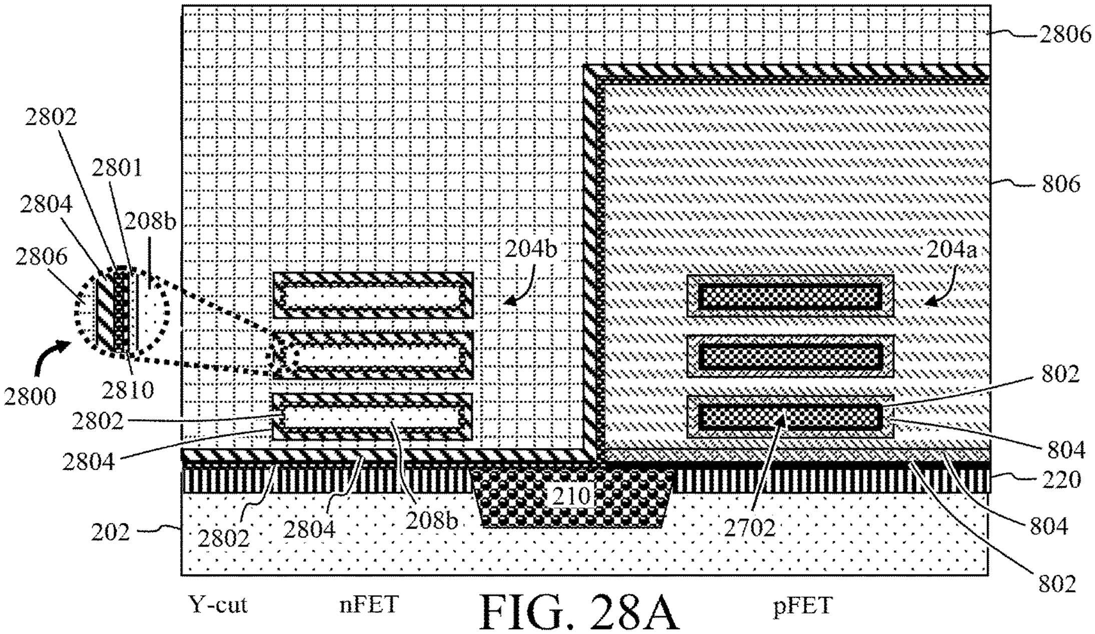
FIG. 28A is a Y cross-sectional view.
Figures 28B, 28C:
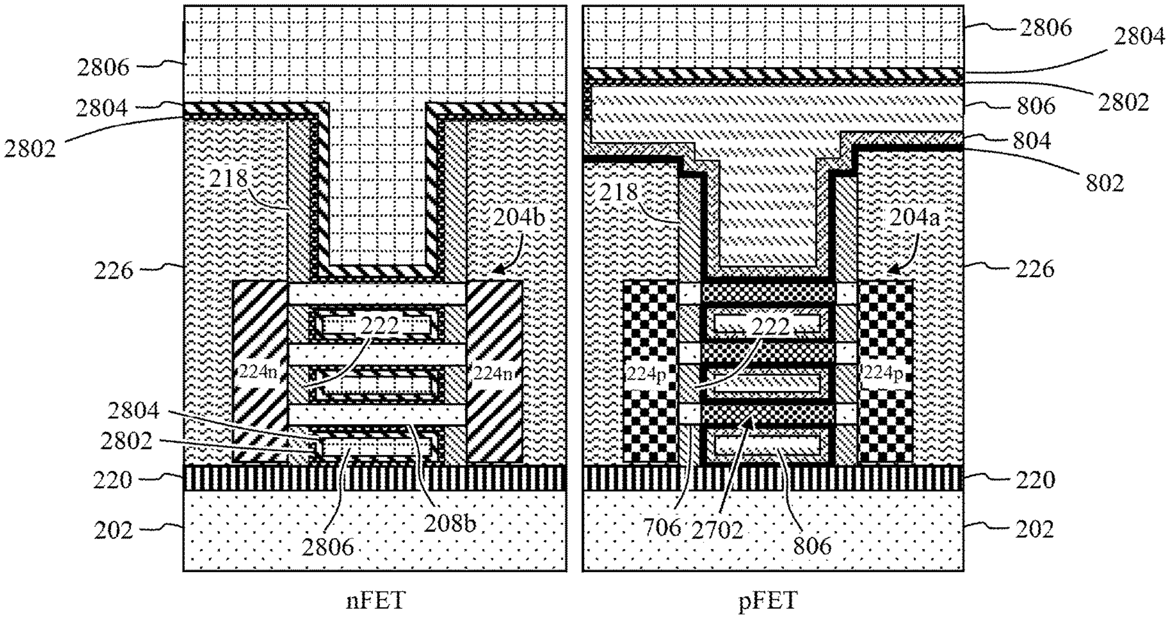
FIG. 28B is an X1 cross-sectional view.
FIG. 28C is an X2 cross-sectional view illustrating a (second) gate dielectric and a (second) gate dielectric cap having been deposited onto, and surrounding, the active layers of the second device stack, and a (second) sacrificial placeholder having been deposited over the second gate dielectric/second gate dielectric cap according to an embodiment of the present invention.

As shown in FIG. 28A (a Y cross-sectional view), FIG. 28B (an X1 cross-sectional view), and FIG. 28C (an X2 cross-sectional view), a (second) gate dielectric 2802 and a (second) gate dielectric cap 2804 are next deposited onto, and surrounding, the active layers 208*b* of the device stack 204*b*, and a (second) sacrificial placeholder 2806 is deposited over the gate dielectric 2802/gate dielectric cap 2804. As shown in FIGS. 28A-C, deposition of the gate dielectric 2802 and gate dielectric cap 2804 in this manner also deposits these materials on the exposed surface of the wafer 202 beneath the device stack 204*b*, as well as on the top and sidewalls of the sacrificial placeholder 806 which is present over the device stack 204*a*.

Referring to magnified view 2800 in FIG. 28A, prior to depositing the gate dielectric 2802, a (second) interfacial layer 2801 is preferably first formed on the active layers 208*b*. As provided above, use of an interfacial layer 2801 improves the channel/gate dielectric interface quality and channel carrier mobility. Suitable materials for the interfacial layer 2801 include but are not limited to oxide materials such as SiOx. According to an exemplary embodiment, the interfacial layer 2801 has a thickness of from about 0.5 nm to about 3 nm and ranges therebetween.

According to an exemplary embodiment, the thickness and/or composition of the interfacial layer 2801 and/or the gate dielectric 2802 in the nFET transistor differs from the thickness and/or composition of the interfacial layer 801 and/or the gate dielectric 802 in the pFET transistor. For instance, an optional dipole layer 2810 can be deposited onto the interfacial layer 2801 prior to the gate dielectric 2802. A subsequent reliability anneal (see below) will also serve to diffuse the metal or metals from the dipole layer 2810 into (i.e., doping) the interfacial layer 2801 and gate dielectric 2802. Doing so can be used to tune the threshold voltage of the nFET transistor relative to the pFET transistor, or vice versa. As a result, the device will have different nFET and pFET threshold voltages, and potentially different nFET threshold voltages for different nFET transistors such as high threshold voltage nFET transistors and low threshold voltage nFET transistors. Suitable metals for the dipole layer 2810 include, but are not limited to, La, Y, Mg and/or Ga. By way of example only, the dipole layer 2810 can have a thickness of from about 0.5 Å to about 30 Å. Following the reliability anneal (performed below), the interfacial layer 2801 and the gate dielectric 2802 will each contain at least one dipole dopant. e.g., La, Y. Mg and/or Ga. Preferably, different dipole dopants are used in the pFET versus nFET interfacial layer/gate dielectric in order to achieve different threshold voltages. However, as highlighted above, the use of dipole layer 2810 is optional, and embodiments are contemplated herein where the (nFET) interfacial layer 2801 and/or gate dielectric 2802 are undoped.

Additionally, the interfacial layer 2801 and/or the gate dielectric 2802 in the nFET transistor can optionally receive different (e.g., nitridation) treatments from the interfacial layer 801 and/or the gate dielectric 802 in the pFET transistor in order to improve device performance. For example, according to an exemplary embodiment, a nitridation treatment is performed on the interfacial layer 2801 and/or the gate dielectric 2802 in the nFET transistor before depositing the gate dielectric cap 2804 to boost the capacitance and thereby improve device performance. As described above, a nitridation treatment may also be performed for the pFET interfacial layer 801 and/or the gate dielectric 802, however the nitrogen concentration in the nFET the interfacial layer 2801 and/or the gate dielectric 2802 is preferably higher than that in the pFET interfacial layer 801 and/or the gate dielectric 802

Furthermore, even if the same material (e.g., $HfO_2$) is used as the gate dielectric 2802 in the nFET transistor and as the gate dielectric 802 in the pFET transistor, embodiments are contemplated herein where the gate dielectric 2802 used in the nFET transistor is thicker than gate dielectric 802 used in the pFET transistor. For example, as will be described in detail below, the thickness of the nFET gate dielectric 2802 is preferably from about 1 Å to about 2 Å greater than the thickness of the pFET gate dielectric 802.

According to an exemplary embodiment, the gate dielectric 2802 is a high-κ material such as $HfO_2$, $La_2O_3$, $HfLaO_2$, $HfZrO_2$ and/or $HfAlO_2$. A process such as CVD, ALD or PVD can be employed to deposit the gate dielectric 2802. According to an exemplary embodiment, gate dielectric 2802 has a thickness of from about 1 nm to about 5 nm and ranges therebetween. As highlighted above, the composition of the gate dielectric 2802 can differ from that of the gate dielectric 802. For instance, according to an exemplary embodiment, the (nFET) gate dielectric 2802 is $HfLaO_2$, whereas the (pFET) gate dielectric 802 is $HfZrO_2$ and/or HfAlOx. It is notable, however, that employing different pFET and nFET gate dielectrics 802 and 2802, respectively, is not a requirement, and embodiments are contemplated herein where the gate dielectric 802 and gate dielectric 2802 have the same composition and/or thickness as one another.

Suitable materials for the gate dielectric cap 2804 include, but are not limited to, metal nitrides such as TiN and/or TaN, which can be deposited using a process such as CVD, ALD or PVD. According to an exemplary embodiment, the gate dielectric cap 2804 has a thickness of from about 1 nm to about 10 nm and ranges therebetween. The gate dielectric cap 2804 will serve to protect the gate dielectric 2802 during subsequent processing steps including during removal of the sacrificial placeholder 2806.

Suitable materials for the sacrificial placeholder 2806 include, but are not limited to, poly-silicon and/or amorphous silicon. A process such as CVD, ALD or PVD can be employed to deposit the sacrificial placeholder 2806 material over the gate dielectric 2802/gate dielectric cap 2804. The remainder of the process is performed in the same manner as in the previous example, with the only difference being the above-described configuration of the pFET channels which, in this case, contain uniform SiGe 2702. Thus, for the sake of brevity, these same steps performed in the same manner as described above are not individually depicted.

However, it is to be understood that in the present process flow, a reliability anneal is performed in the same manner as described above (which will serve to diffuse the metal or metals from the dipole layer 810 and/or dipole layer 2810 into the interfacial layer 801/gate dielectric 802 and/or the interfacial layer 2801/gate dielectric 2802, respectively, the sacrificial placeholder 2806 and the gate dielectric cap 2804 are then selectively removed from the nFET region of the wafer 202, an nFET gate electrode 2902 is formed on the gate dielectric 2802 surrounding a portion of each of the active layers **208*b* in a gate-all-around configuration, and the nFET gate electrode 2902 and gate dielectric 2802 are recessed down to the sacrificial placeholder 806. See FIG. 29A (a Y cross-sectional view), FIG. 29B (an X1 cross-sectional view), and FIG. 29**C (an X2 cross-sectional view).

Figure 29A:
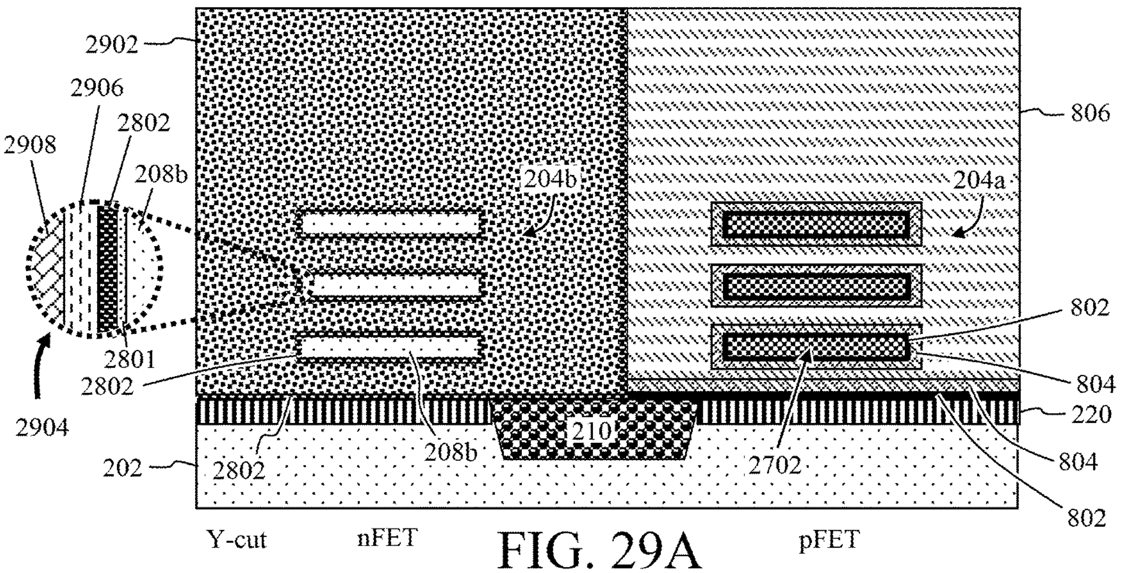
FIG. 29A is a Y cross-sectional view.
Figures 29B, 29C:
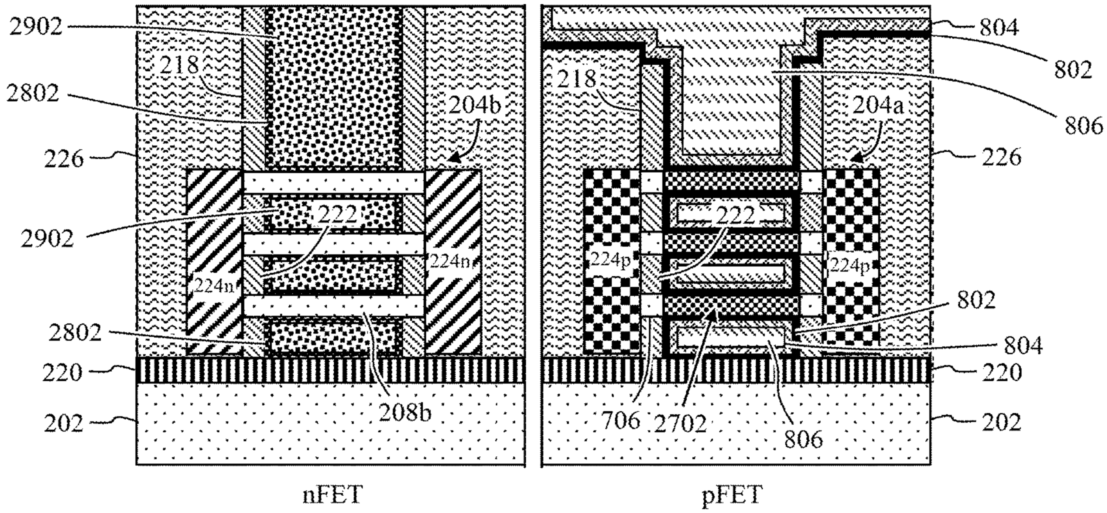
FIG. 29B is an X1 cross-sectional view.
FIG. 29C is an X2 cross-sectional view illustrating, following a reliability anneal, the second sacrificial placeholder and the second gate dielectric cap having been selectively removed from the nFET region of the wafer, an nFET gate electrode having been formed on the second gate dielectric surrounding a portion of each of the active layers of the second device stack in a gate all around configuration, and the nFET gate electrode and the second gate dielectric having been recessed down to the first sacrificial placeholder according to an embodiment of the present invention.

As shown in magnified view 2904 in FIG. 29A, nFET gate electrode 2902 includes at least one workfunction-setting metal 2906 disposed on the gate dielectric 2802, and an optional (low-resistance) fill metal 2908 disposed on the workfunction-setting metal(s) 2906.

Suitable (n-type) workfunction-setting metals 2906 include, but are not limited to, TiN, TaN and/or Al-containing alloys such as TiAl, TiAlN, TiAlC, TaAl, TaAlN, and/or TaAlC. It is notable, however, that this is not an exhaustive list and that these workfunction-setting metals are not meant to be exclusive to transistors of one polarity, e.g., TiAlC can be implemented as a workfunction-setting metal in both nFET and pFET transistors—see below. A process such as CVD, ALD or PVD can be employed to deposit the workfunction-setting metal(s) 2906. As will be described in detail below, the thickness and/or composition of the workfunction-setting metal(s) 2906 in the nFET transistor can differ from the thickness and/or composition of the workfunction-setting metal(s) in the pFET transistor (see below).

Suitable low-resistance fill metals 2908 include, but are not limited to, W, Co, Ru and/or Al. The low-resistance fill metals 2908 can be deposited using a process or combination of processes including, but not limited to, CVD. ALD, PVD, sputtering, plating, evaporation, ion beam deposition, electron beam deposition, laser assisted deposition, chemical solution deposition, etc.

As such, according to the above-described exemplary embodiment, the nFET replacement metal gate includes an interfacial layer 2801 disposed on the active layers 208*b* of the device stack 204*b* (in the nFET region of the wafer 202), the gate dielectric 2802 surrounding the active layers 208*b* over the interfacial layer 2801, and the gate electrode 2902 disposed on the gate dielectric 2802 surrounding a portion of each of the active layers 208*b* in a gate all around configuration. The gate electrode 2902 includes the at least one of workfunction-setting metal(s) 2906 disposed on the gate dielectric 2802, and the optional (low-resistance) fill metal 2908 disposed on the workfunction-setting metal(s) 2906.

Figure 30A:
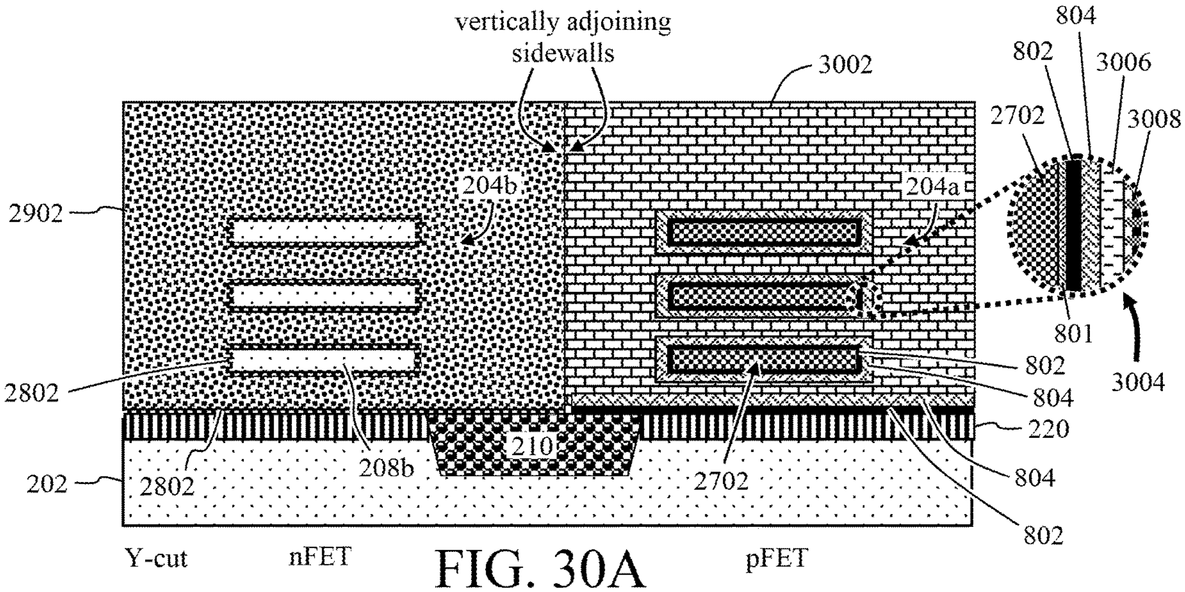
FIG. 30A is a Y cross-sectional view.
Figures 30B, 30C:
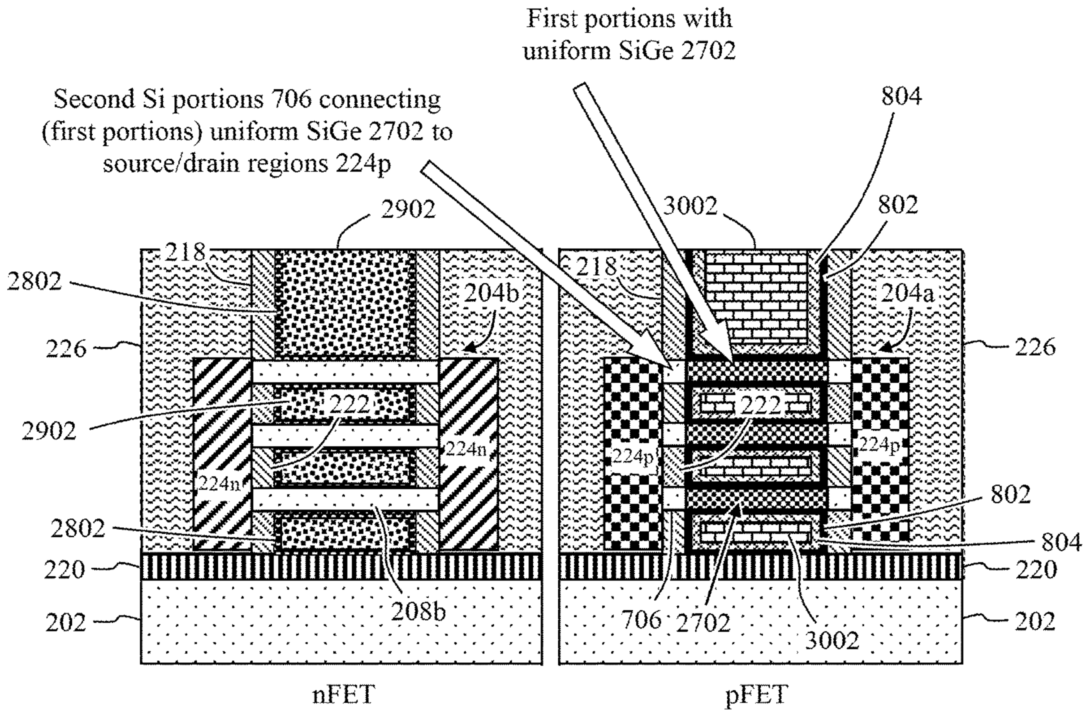
FIG. 30B is an X1 cross-sectional view.
FIG. 30C is an X2 cross-sectional view illustrating the first sacrificial placeholder and exposed portions of the second gate dielectric having been removed, a pFET gate electrode having been formed on the first gate dielectric/first gate dielectric cap surrounding the uniform (SiGe) portions of the (pFET) channels of the first device stack in a gate all around configuration, and the pFET gate electrode having been recessed down to the nFET gate electrode according to an embodiment of the present invention.

As shown in FIG. 30A (a Y cross-sectional view), FIG. 30B (an X1 cross-sectional view), and FIG. 30C (an X2 cross-sectional view), in the same manner as above the sacrificial placeholder 806 is then selectively removed as are exposed portions of the gate dielectric 2802, a pFET gate electrode 3002 is formed on the gate dielectric 802/gate dielectric cap 804 surrounding the (first) uniform SiGe 2702 portions of the (pFET) channels of device stack 204*a* in a gate all around configuration, and the pFET gate electrode 3002 is recessed down to the nFET gate electrode 2902.

For clarity, the terms 'first' and 'second' may also be used herein when referring to pFET gate electrode 3002 and nFET gate electrode 2902, respectively. As shown in magnified view 3004 in FIG. 30A, pFET gate electrode 3002 includes at least one workfunction-setting metal 3006 disposed on the gate dielectric cap 804, and an optional (low-resistance) fill metal 3008 disposed on the workfunction-setting metal(s) 3006. For clarity, the terms 'first' and 'second' may also be used herein when referring to workfunction-setting metal(s) 3006 and workfunction-setting metal(s) 2906, respectively.

Suitable (p-type) workfunction-setting metals 3006 include, but are not limited to, metal nitrides (such as TiN and/or TaN) and/or W. A process such as CVD, ALD or PVD can be employed to deposit the workfunction-setting metal(s) 3006. In another embodiment, Al-containing alloys such as TiAl, TiAlN, TiAlC, TaAl, TaAlN, and/or TaAlC or Ti-containing alloys such as TiC and/or TaTi are used to modulate the threshold voltage, in order to compensate for the band offset in SiGe. Namely, as provided above, the Ge concentration in SiGe is going to tune the pFET threshold voltage. For instance, a high Ge concentration will significantly reduce the pFET threshold voltage. Thus, to use a non-limiting example to clarify this concept, pure TIN can be used as the workfunction-setting metal for a pure Si channel. However, if pure TiN is used as the workfunction-setting metal for Si75Ge25, the threshold voltage will be too low (~200 mV lower than a pure Si channel). In order to set the correct threshold voltage for Si75Ge25, a TiN/TiAlC/TiN stack (i.e., an nFET workfunction-setting metal-like stack) may be used.

Notably, as highlighted above, the present techniques advantageously enable independently configurable replacement metal gates in the pFET and nFET transistors since there is no overlap in materials between the pFET and nFET replacement metal gates. For example, the workfunction-setting metal(s) 3006 used in the pFET transistor are wholly distinct from those workfunction-setting metal(s) 2906 used in the nFET transistor. This selective tuning of the workfunction-setting metals 2906 and 3006 can also be coupled with the selection of interfacial layers 801 and 2801 and/or gate dielectrics 802 and 2802 that are unique (in composition, thickness, etc.) to the respective pFET and nFET transistors as described in detail above.

According to an exemplary embodiment, the workfunction-setting metal(s) 2906 in the nFET transistor differ in composition and/or thickness from the workfunction-setting metal(s) 3006 in the pFET transistor, and vice versa. For instance, to use an illustrative, non-limiting example, both the workfunction-setting metal(s) 2906 in the nFET transistor and the workfunction-setting metal(s) 3006 in the pFET transistor can both include TiAlC. However, the thickness of the TiAlC in the pFET is preferably less than the thickness of the TiAlC in the nFET. Further, when used as the pFET workfunction-setting metal, the concentration of Al in the TiAlC is preferably lower than when it is used as nFET workfunction-setting metal. In another, non-limiting example, TiN/TiAlC/TIN can be employed as both the workfunction-setting metal(s) 2906 in the nFET transistor and as the workfunction-setting metal(s) 3006 in the pFET transistor. However, when used as the workfunction-setting metal(s) 2906 in the nFET transistor, 0.5 nmTiN/3 nm TiAlC/3 nm TiN may be implemented, whereas when used as the workfunction-setting metal(s) 3006 in the pFET transistor, 5 nm TiN/2 nm TiAlC/4 nm TiN may be implemented.

Suitable low-resistance fill metals 3008 include, but are not limited to, W, Co, Ru and/or Al. The low-resistance fill metal 3008 can be deposited using a process or combination of processes including, but not limited to, CVD, ALD, PVD, sputtering, plating, evaporation, ion beam deposition, electron beam deposition, laser assisted deposition, chemical solution deposition, etc.

According to the above-described exemplary embodiment, the pFET replacement metal gate includes an interfacial layer 801 disposed on the (first) uniform SiGe 2702 portions of the device stack 204*a* (in the pFET region of the wafer 202), the gate dielectric 802 disposed over the interfacial layer 801, and the gate electrode 3002 disposed on the gate dielectric 802 surrounding the (first) uniform SiGe 2702 portions of the (pFET) channels in a gate all around configuration. The gate electrode 3002 includes the at least one of workfunction-setting metal(s) 3006 disposed on the gate dielectric 802, and the optional (low-resistance) fill metal 3008 disposed on the workfunction-setting metal(s) 3006.

As shown in FIGS. 30A-C, the nFET gate electrode 2902 directly contacts the pFET gate electrode 3002. Notably, however, based on the above-described process, the nFET gate electrode 2902 and the pFET gate electrode 3002 do not overlap one another (i.e., the nFET gate electrode 2902 and the pFET gate electrode 3002 are in a non-overlapping position relative to one another). To look at it another way, the nFET gate electrode 2902 and the pFET gate electrode 3002 have a pair of straight vertically adjoining sidewalls in direct contact with one another. This would not be the case if any of the materials in the nFET gate electrode 2902 or the pFET gate electrode 3002 overlapped one another vertically, since that would result in both vertical and horizontal interfaces.

Further, as shown, e.g., in FIGS. 30B-C the pFET and nFET transistors each includes source/drain regions 224*p* and 224*n* on opposite sides of the pFET gate electrode 3002 and the nFET gate electrode 2902, respectively. For clarity, the terms 'first' and 'second' may also be used herein when referring to source/drain regions 224*p* and 224*n*, respectively. Device stack 204*a* (in the pFET region of the wafer 202) includes the (pFET) channels having (first) portions made up of the uniform SiGe 2702 (see, e.g., FIG. 7C), and (second) portions 706 (i.e., portions of the original active layers 208*a* under the dielectric spacers 218/inner spacers 222) that connect the first uniform SiGe 2702 portions to the source/drain regions 224*p*. As provided above, by uniform SiGe it is meant that the composition anywhere in the first portions of the (pFET) channels is only SiGe. By contrast, the composition anywhere in the second portions 706 of the pFET channels is only Si. Likewise, the (nFET) channels are unmodified, and thus remain the original active layers 208*b* of device stack 204*b*. In the present example that is also Si.

The pFET gate electrode 3002 surrounds the (first) uniform SiGe 2702 portions of the (pFET) channels in a gate all around configuration. By comparison, the nFET gate electrode 2902 surround a portion of each of the active layers 208*b* in a gate all around configuration. As provided above, a gate all around configuration advantageously enhances device performance. Further, in the exemplary embodiment shown illustrated in the figures, in the pFET transistor, both the gate dielectric 802 and the gate dielectric cap 804 are disposed on the uniform SiGe 2702 portions of the (pFET) channels beneath the pFET gate electrode 3002. By contrast, in the nFET transistor, the gate dielectric 2802 is disposed on the stack of active layers 208*b* beneath the nFET gate electrode 2902 (i.e., as described above the gate dielectric cap 2804 has been removed from the nFET region of the wafer 202). Thus, in this example, the gate dielectric cap 804 remains present only in the pFET transistor.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A semiconductor device, comprising:

a wafer; and a first transistor of a first polarity and a second transistor of a second polarity on the wafer, wherein the first transistor and the second transistor each comprises multiple channels, and wherein the multiple channels of the first transistor comprise first portions and second portions with the first portions having cores and a cladding layer fully surrounding the cores, wherein a first gate material of the first transistor is in direct contact with a second gate material of the second transistor, wherein the first transistor further includes a first gate dielectric layer and a dielectric cap, wherein the dielectric cap is in direct contact with the first gate dielectric layer, wherein the first gate material is in direct contact with the dielectric cap, wherein the second transistor includes a second gate dielectric layer, wherein the second gate material is in direct contact with the second gate dielectric layer, wherein the dielectric cap is not in contact with the second dielectric layer, wherein the second gate dielectric layer is in direct contact with a first side of a first portion of the first gate material at a first level, wherein the first gate dielectric layer is in contact with a second side of the portion of the first gate material at the second level, wherein the first side and second side are located on opposite sides of the first gate material, wherein the first level and the second level are the same level.

2. The semiconductor device of claim 1, wherein the first transistor comprises a p-channel field-effect transistor and the second transistor comprises an n-channel field-effect transistor.

3. The semiconductor device of claim 1, wherein the cores comprise silicon (Si), and wherein the cladding layer comprises silicon germanium (SiGe).

4. The semiconductor device of claim 1, further comprising:

a first gate surrounding the first portions of the multiple channels of the first transistor; and a second gate surrounding the multiple channels of the second transistor, wherein the first gate comprises at least one first workfunction-setting metal and the second gate comprises at least one second workfunction-setting metal, and wherein the at least one first workfunction-setting metal is different from the at least one second workfunction-setting metal.

5. The semiconductor device of claim 4, further comprising:

first source/drain regions on opposite sides of the first gate; and second source/drain regions on opposite sides of the second gate, wherein the first portions of the multiple channels of the first transistor are connected to the first source/drain regions by the second portions, and wherein the second portions have a same composition as the cores.

6. The semiconductor device of claim 5, wherein the multiple channels of the second transistor comprise the same composition as the cores.

7. The semiconductor device of claim 1, further comprising:

a first interfacial layer disposed on the first portions of the multiple channels of the first transistor;

wherein the first gate dielectric layer is also disposed on the first interfacial layer;

a second interfacial layer disposed on the multiple channels of the second transistor; and wherein the second gate dielectric layer is also disposed on the second interfacial layer.

8. The semiconductor device of claim 7, wherein the first interfacial layer has at least one of a different composition and a different thickness from the second interfacial layer.

9. The semiconductor device of claim 7, wherein the first gate dielectric layer has at least one of a different composition and a different thickness from the second gate dielectric.

10. The semiconductor device of claim 7, wherein the first interfacial layer comprises at least one different dipole dopant from the second interfacial layer.

11. The semiconductor device of claim 7, wherein the first gate dielectric layer comprises at least one different dipole dopant from the second gate dielectric.

12. A semiconductor device, comprising: a wafer; and a first transistor of a first polarity and a second transistor of a second polarity on the wafer, wherein the first transistor and the second transistor each comprises multiple channels, and wherein the multiple channels of the first transistor comprise first portions and second portions with the first portions having cores and a cladding layer fully surrounding the cores, wherein a first dielectric layer and a dielectric cap are located beneath a first gate material of the first transistor, wherein the dielectric cap is in direct contact with the first dielectric layer, wherein the first gate material is in direct contact with the dielectric cap, wherein a second dielectric layer is located beneath a second gate material of the second transistor, wherein the second gate material is in direct contact with the second dielectric layer, wherein the dielectric cap is not in contact with the second dielectric layer, wherein the second dielectric layer is in direct contact with a first side of a first portion of the first gate material at a first level, wherein the first dielectric layer is in contact with a second side of the portion of the first gate material at the second level, wherein the first side and second side are located on opposite sides of the first gate material, wherein the first level and the second level are the same level.

13. The semiconductor device of claim 12, wherein the cores comprise silicon (Si), and wherein the cladding layer comprises silicon germanium (SiGe).

14. The semiconductor device of claim 12, further comprising:

a first gate surrounding the first portions of the multiple channels of the first transistor; and a second gate surrounding the multiple channels of the second transistor, wherein the first gate comprises at least one first workfunction-setting metal and the second gate comprises at least one second workfunction-setting metal, and wherein the at least one first workfunction-setting metal is different from the at least one second workfunction-setting metal.

15. The semiconductor device of claim 12, further comprising:

a first interfacial layer disposed on the first portions of the multiple channels of the first transistor;

wherein the first gate dielectric layer is also disposed on the first interfacial layer;

a second interfacial layer disposed on the multiple channels of the second transistor; and wherein the second gate dielectric layer is also disposed on the second interfacial layer.

16. The semiconductor device of claim 15, wherein the first interfacial layer has at least one of a different composition and a different thickness from the second interfacial layer.

17. The semiconductor device of claim 15, wherein the first gate dielectric layer has at least one of a different composition and a different thickness from the second gate dielectric.

18. The semiconductor device of claim 15, wherein the first interfacial layer comprises at least one different dipole dopant from the second interfacial layer.

19. The semiconductor device of claim 15, wherein the first gate dielectric layer comprises at least one different dipole dopant from the second gate dielectric.

* * * * *